(12) United States Patent
Acatrinei

(10) Patent No.: US 8,614,595 B2
(45) Date of Patent: Dec. 24, 2013

(54) LOW COST ULTRA VERSATILE MIXED SIGNAL CONTROLLER CIRCUIT

(76) Inventor: Beniamin Acatrinei, Sunnyvale, CA (US)

( * ) Notice: Subject to any disclaimer, the term of this patent is extended or adjusted under 35 U.S.C. 154(b) by 739 days.

(21) Appl. No.: 12/619,548

(22) Filed: Nov. 16, 2009

(65) Prior Publication Data

US 2010/0164579 A1  Jul. 1, 2010

Related U.S. Application Data

(60) Provisional application No. 61/114,517, filed on Nov. 14, 2008.

(51) Int. Cl.
*H03K 3/017* (2006.01)

(52) U.S. Cl.
USPC .......................... 327/172; 327/175; 332/109

(58) Field of Classification Search
USPC ........... 327/306–333, 172–175; 332/109–111
See application file for complete search history.

(56) References Cited

U.S. PATENT DOCUMENTS

| | | | |
|---|---|---|---|
| 4,719,552 A | 1/1988 | Albach et al. |
| 4,940,929 A | 7/1990 | Williams |
| 4,982,148 A | 1/1991 | Engelmann |
| 5,003,454 A | 3/1991 | Bruning |
| 5,134,355 A | 7/1992 | Hastings |
| 5,181,159 A | 1/1993 | Peterson et al. |
| 5,283,727 A | 2/1994 | Kheraluwala et al. |
| 5,359,276 A | 10/1994 | Mammano |
| 5,359,277 A | 10/1994 | Cowett |
| 5,406,192 A | 4/1995 | Vinciarelli |
| 5,414,613 A | 5/1995 | Chen |
| 5,426,579 A | 6/1995 | Paul et al. |
| 5,442,539 A | 8/1995 | Cuk et al. |
| 5,568,041 A | 10/1996 | Hesterman |
| 5,592,128 A | 1/1997 | Hwang |
| 5,598,093 A | 1/1997 | Acatrinei |
| 5,644,214 A | 7/1997 | Lee |
| 5,661,645 A | 8/1997 | Hochstein |
| 5,742,151 A | 4/1998 | Hwang |
| 5,757,166 A | 5/1998 | Sodhi |
| 5,804,950 A | 9/1998 | Hwang et al. |
| 5,815,386 A | 9/1998 | Gordon |
| 5,847,944 A | 12/1998 | Jang et al. |
| 5,867,374 A | 2/1999 | Moreau |
| 5,903,140 A | 5/1999 | Acatrinei |
| 5,910,891 A | 6/1999 | Jo |
| 5,912,549 A | 6/1999 | Farrington et al. |
| 6,049,473 A | 4/2000 | Jang et al. |
| 6,344,986 B1 | 2/2002 | Jain et al. |
| 6,465,990 B2 | 10/2002 | Acatrinei et al. |
| 6,469,917 B1 | 10/2002 | Ben-Yaakov |
| 6,472,946 B2 * | 10/2002 | Takagi .......................... 332/109 |
| 6,545,887 B2 | 4/2003 | Smedley et al. |
| 6,757,185 B2 | 6/2004 | Romero |
| 7,391,630 B2 | 6/2008 | Acatrinei |
| 7,777,587 B2 * | 8/2010 | Stevenson et al. ............ 332/109 |

(Continued)

*Primary Examiner* — Dinh T. Le

(74) *Attorney, Agent, or Firm* — Vierra Magen Marcus LLP

(57) ABSTRACT

A low-cost ultra-versatile pulse width modulation (PWM)-timer controller system is disclosed for use in the electric power management industry. Using different voltage/current buffer devices, the present system is capable of performing a variety of control applications, including for example as a pulse width modulation controller, power factor correction circuit, silicon controlled rectifier or thyristor, zero-voltage drive circuit, AC/DC boost converter, battery charger, motor RPM controller, timer or clock, light intensity controller, temperature range controller, pressure controller, sensing/monitoring/warning system, or analog logic circuit.

24 Claims, 45 Drawing Sheets

(56) References Cited

U.S. PATENT DOCUMENTS

| | | |
|---|---|---|
| 2003/0128563 A1 | 7/2003 | Romero |
| 2006/0198172 A1 | 9/2006 | Wood |
| 2008/0204160 A1* | 8/2008 | Prodic et al. .................. 332/109 |

* cited by examiner

POWER FACTOR CONTROLLER TEST DATA

| $V_{rms}$ (V) | $V_{in}$ W | $P_f$ (-) | $I_{find}$ (mA) | AC LINE INPUT ||||||| DC OUTPUT ||||
|---|---|---|---|---|---|---|---|---|---|---|---|---|---|
| | | | | | CURRENT HARMONIC DISTORTION (% $I_{fund}$) ||||||| | | | |
| | | | | THD | H2 | H3 | H5 | H7 | H9 | $V_o$ (V) | $\Delta V_o$ (V) | $I_o$ (mA) | $P_o$ (W) | $\eta$ (%) |
| 90 | 88.2 | 0.991 | 990 | 8.1 | 0.07 | 5.9 | 4.3 | 1.5 | 1.7 | 181 | 31.2 | 440 | 79.6 | 90.2 |
| 110 | 86.3 | 0.996 | 782 | 7.0 | 0.05 | 2.7 | 5.7 | 1.1 | 0.8 | 222 | 26.4 | 360 | 79.9 | 92.6 |
| 135 | 85.2 | 0.995 | 642 | 8.2 | 0.03 | 1.5 | 6.8 | 1.1 | 1.5 | 265 | 20.8 | 300 | 79.5 | 93.3 |
| 180 | 87.0 | 0.994 | 480 | 9.5 | 0.16 | 4.0 | 6.5 | 3.1 | 4.0 | 360 | 16.0 | 225 | 81.0 | 93.1 |
| 220 | 84.7 | 0.982 | 385 | 15 | 0.5 | 8.4 | 7.8 | 5.3 | 1.9 | 379 | 14.0 | 210 | 79.6 | 94.4 |
| 240 | 85.3 | 0.975 | 359 | 16.5 | 0.7 | 9.0 | 7.8 | 7.4 | 3.8 | 384 | 14.0 | 210 | 80.6 | 94.5 |
| 260 | 84.0 | 0.967 | 330 | 18.8 | 0.7 | 11.0 | 7.0 | 9.0 | 4.0 | 392 | 13.2 | 205 | 80.4 | 95.7 |

*Fig. 10B*

POWER FACTOR CONTROLLER TEST DATA

| $V_{rms}$ | AC LINE INPUT | | | CURRENT HARMONIC DISTORTION (% $I_{fund}$) | | | | | DC OUTPUT | | | | |
|---|---|---|---|---|---|---|---|---|---|---|---|---|---|
| | $P_{in}$ | $P_f$ | $I_{find}$ | THD | 2 | 3 | 5 | 7 | $V_{O(pp)}$ | $V_O$ | $I_O$ | $P_O$ | $\eta(\%)$ |
| 90  | 190.4 | 0.995 | 2.11 | 5.8 | 0.16 | 0.32 | 0.24 | 0.80 | 3.6 | 398.0 | 0.44 | 175.9 | 92.4 |
| 120 | 192.1 | 0.997 | 1.60 | 3.2 | 0.08 | 0.17 | 0.07 | 0.30 | 3.6 | 398.9 | 0.44 | 177.1 | 92.2 |
| 138 | 192.7 | 0.997 | 1.40 | 0.9 | 0.08 | 0.24 | 0.03 | 0.15 | 3.6 | 402.3 | 0.45 | 179.0 | 92.9 |
| 180 | 194.3 | 0.995 | 1.08 | 0.9 | 0.04 | 0.18 | 0.04 | 0.06 | 3.6 | 409.1 | 0.45 | 182.9 | 94.1 |
| 240 | 189.3 | 0.983 | 0.80 | 0.7 | 0.08 | 0.21 | 0.06 | 0.06 | 3.6 | 407.0 | 0.45 | 181.1 | 95.7 |
| 268 | 186.3 | 0.972 | 0.71 | 0.6 | 0.11 | 0.32 | 0.10 | 0.10 | 3.6 | 406.2 | 0.44 | 180.4 | 96.8 |

*Fig. 11B*

| A | Y |
|---|---|
| 0 | 0 |
| 1 | 1 |

| A | Y |
|---|---|
| 0 | 1 |
| 1 | 0 |

| A | B | Y |
|---|---|---|
| 0 | 0 | 0 |
| 0 | 1 | 0 |
| 1 | 0 | 0 |
| 1 | 1 | 1 |

| A | B | Y |
|---|---|---|
| 0 | 0 | 1 |
| 0 | 1 | 1 |
| 1 | 0 | 1 |
| 1 | 1 | 0 |

| A | B | Y |
|---|---|---|
| 0 | 0 | 0 |
| 0 | 1 | 1 |
| 1 | 0 | 1 |
| 1 | 1 | 1 |

| A | B | Y |
|---|---|---|
| 0 | 0 | 1 |
| 0 | 1 | 0 |
| 1 | 0 | 0 |
| 1 | 1 | 0 |

LOW COST ULTRA VERSATILE MIXED SIGNAL CONTROLLER CIRCUIT

CROSS-REFERENCE TO RELATED APPLICATION

This application claims priority under 35 U.S.C. §119(e) from prior U.S. provisional application No. 61/114,517, filed Nov. 14, 2008.

BACKGROUND OF THE INVENTION

1. Field of the Invention

The present invention relates to mixed signal controller circuits and systems for use in the electric power management industry, and which, via different voltage/current buffer devices, is capable of performing any of a variety of control applications, including as a pulse width modulation ("PWM") controller, power factor correction ("PFC") circuit, silicon controlled rectifier ("SCR") or thyristor, zero-voltage drive ("ZVD") circuit, AC/DC boost converter, battery charger, motor RPM controller, timer or clock, light intensity controller, temperature range controller, pressure controller, sensing/monitoring/warning system, or analog logic circuit.

The invention, hereinafter referred to as "NEWSYS", provides a reliable new system with a low-cost ultra-versatile mixed signal circuit which is capable of reducing the size and number of parts used in many of the power management industry's existing circuit applications or products, while at the same time improving the most significant power conversion circuits' performance features, such as: Efficiency ("Eff"), Power Factor ("PF"), Total Harmonic Distortion ("THD"), Reliability ("Rel"), and, very importantly, significantly reduces the total circuit solution cost per unit.

2. Introduction 2.1 Switching Vs. Linear Control Systems

During the last 20 years, the Pulse Width Modulation Controlling Systems ("PWMCS") are more and more used in the process of transferring the electrical energy from a generator to a load (i.e., power management), because of their higher efficiency in respect to the classic linear controlling systems ("LCS").

While the LCS are losing (dissipating) 50% or more of the inputted electrical energy as heat, in order to provide a graduate increasing power to a specific load (such as: bulbs, motors, heaters, batteries recharging systems, electronic equipment, etc.), the PWMCS are capable of transferring the same energy, in high frequency small increments (i.e., square wave pulses) that may improve the efficiency ratio up to 99%, because the PWMCS act not as electronic potentiometers or rheostats but as low power dissipation switches.

Note: The amount of power ("Psw") dissipated on a switch (Psw=Isw×Vsw) is supposed to be, always, "Near Zero" (or negligible in respect to the power transferred to the load) because in both situations, "Switch ON" or "Switch OFF", at least one of the power's two parameters, current ("Isw") or voltage ("Vsw") amount, is "Near Zero". In other words, when a switch is in its "ON" state, the current ("Isw") parameter reaches its maximum value, however the voltage ("Vsw") parameter across the switch is near zero (considering the switch's electrical resistance is very small or negligible in respect to the rest of the circuit's resistance) and vice versa, when the switch is in "OFF" state, the voltage ("Vsw") parameter reaches its maximum value however, the current ("Isw") amount is near zero.

Because of that, the classic linear systems, including passive circuits (i.e., potentiometers, rheostats, ballast resistors/ coils), operational amplifiers or linear transistors/buffers, are now more and more being replaced by switching systems, comprising high speed comparators and logic circuits (i.e., mixed signal systems) that are capable of reducing considerably the controlling devices' internal dissipation. Switching and digital (logic) electronic systems are obviously more efficient than linear (analog) ones because of their "0/1" (switching ON/OFF) "discrete" mode of operations. However, the logic controlling systems are more sophisticated, expensive and "noisy" than the analog ones (i.e., square wave signals introduce high frequency harmonics that have to be attenuated with "EMI" or "low pass" filters).

2.2 Mixed Signal Systems

In the real life environment, the amplitude variations of light, temperature, humidity, pressure, sound/noise, etc., are not discrete ("everything=1", "nothing=0") but, more or less linear, requesting linear transducers for monitoring/controlling purposes. Because of that, the modern technology promotes, more and more, mixed signal systems (including analog and logic sub-systems) devices that are able to optimize the sensing and controlling accuracy, under low manufacturing cost.

During the last 20 years, mixed signal devices such as timers/clocks, PWM and PFC controller ICs have provided the optimal cost/performances compromise in the electronic industry, being less dissipative than the analog/linear devices, and simultaneously, less sophisticated and expensive than the digital/logic devices.

2.3 Power Management's Main Parameters

In the process of transferring AC electrical power from a generator to a load, the most important parameters the designers have to consider, are: efficiency ("Eff"), power factor ("PF"), current total harmonic distortions ("A.THD"), reliability ("Rel") and cost per unit ("C/U").

2.3.1 Efficiency (Eff)

The Eff parameter reflects the output power versus input power ratio and its ideal amount is 100%, when the entire electrical energy is transferred from a generator to a load. In real life, an electrical device having Eff>90% could be considered a "very efficient" one.

For any load (except heaters) supplied by a sine-wave voltage generator, the Eff parameter amount's difference from 100% typically represents the ratio of electrical energy lost to unnecessary overheating inside of the electrical device.

The classic electrical Incandescent bulb (i.e., Edison type) is very inefficient, transferring only about 1% of the imputed electrical energy to light output. Therefore, engineers are doing significant efforts replaced with more efficient light sources, such as halogen, sodium and fluorescent bulbs. Recently, the ultra-bright white LED bulbs have been proved as the most efficient light sources, and now, the US Department of Energy offers prizes up to $10M to the first manufacturer capable to build an 11 W LED Bulb that generates the same light as a 60 W Incandescent Bulb.

It is true that the fluorescent and LED lamps are more efficient (less loss in heat). However these lamps are more expensive, first because of their higher manufacturing complexity and second because of their requested ballast circuit, attached for current limitation and power factor correction purposes.

Bipolar transistors are more efficient working in switching mode, however, their overheating limits their use down to the low power range. MOSFETs and IGBTs are the most efficient buffers at low and medium power range. Thyristors (i.e., silicon control rectifiers, "SCR") are the most efficient devices recommended for very high power conversion (i.e., hundreds of kW).

2.3.2 The Power Factor (PF)

The PF parameter reflects the real input power (i.e., the integral of "V×I" equation) versus the apparent input power ("Vrms×Irms" equation) ratio, and its ideal amount is 1, when the load current graph is identical in shape and phase (i.e., sine-wave) with the voltage graph.

PF=1 is theoretically impossible (i.e., even wires have low "reactive" (i.e., inductive L and capacitive C) components. However, there are already state-of-the-art PFC circuits capable of reaching PF=0.999. In real life, most of the existing electronic devices (i.e., computers, monitors, TVs, printers) typically have PF≈0.65, and therefore, any devices having PF>0.90 should be considered "good" products.

For any load supplied by a sine-wave voltage generator, the PF parameter amount's difference from 1 (and multiplied by 100) typically represents the ratio of electrical energy lost to unnecessary overheating outside of the electrical device, in an electrical utility provider's transformers and wiring system.

2.3.3 The Current Harmonic Distortions (A.THD)

The A.THD parameter reflects the level of electrical noise (measured in %) generated by a specific device or system and its ideal amount is 0% (when PF=1, only).

Usually, as low is the PF parameter, as high is the A.THD parameter, so a PF>0.99 could be a good sign for a low A.THD. Nevertheless, from case to case (especially when a noisy switching system is being used) the A.THD factor may reach an amount over 100%, even when the PF=0.85.

A high A.THD parameter may have very negative side effects in respect to the entire electrical system environment. The high frequency noise created by these harmonics could create serious perturbations (i.e., "static noise", "parasite frequencies") to all governmental or private communications lines, satellites, robotics, Internet, media, etc.

At this time, a "decent value" for this parameter is A.THD<20%. However, when the number amount of these high A.THD electrical devices increases into the tens of millions range, the cumulative noise generated in the environment may have catastrophic repercussions even when the A.THD per unit does not exceed 20%. By considering the amount of noisy devices already existing in the market, such as computers, printers/copiers, monitors/TVs, fluorescent lamps, industrial equipment, etc. and also by acknowledging that during the next 5 years it is anticipated for most of the existing (inefficient) light sources to be replaced with LED lamps (without PFC, some of these products may reach A.THD>90%), it is quite possible for these noisy devices to reach the hundreds of millions units amount in less than 3 years from now. To avoid this situation, an A.THD<5% per unit, would be more recommendable.

2.3.4 The Reliability ("Rel")

The Rel factor relates to the anticipated lifetime of a product versus environmental variations (i.e., temperature, humidity, pressure, mechanical stress, vibrations, supply voltage, etc.) or versus the topology and parts used for that specific product's design.

Typically, linear (analog) devices are more reliable than the switching ones, however, the "Eff" issues force the designers to prefer mixed-signal topologies.

In "small signal" circuits (i.e., voltages less than 20V, currents less than 1 A), the switching devices are pretty reliable because the parts are not exposed to large variations of voltage and/or current and therefore, their working temperature is kept at a safe level. A large number of parts would decrease the reliability factor for the entire circuit (i.e., each part may fail independently, for whatever reason). However, integrating as many parts as possible into a single chip could resolve this inconvenience for such small signal circuits.

However, in "large signal" circuits (i.e., V>100V, I>5 A), all switching devices are exposed to very high and fast variation of voltage and current, a fact that considerably increases the parts' working temperature and risk of failure.

For solving these problems, besides a smart and reliable small signal controller circuit, many other items are required, such as soft start circuits, inrush current circuits, snubber circuits, high reliability buffers, high precision voltage references, voltage/current feedback circuits, etc. Also, circuit topology simplicity (i.e., less parts count) is a big plus for a good reliability.

2.3.5 The Cost Per Unit ("C/U")

The C/U factor reflects, to some extend, the entire product's quality, in respect to all the main factors mentioned above, however, by applying new concepts, simplifying topologies and reducing the parts count in a circuit, the C/U factor can be substantially reduced, without sacrificing any of the important features which a state-of-the-art product has to offer to its end users.

2.4 Important Feature—Versatility

According to the industry records regarding the mixed signal chips manufactured in the largest volume, worldwide, the most common is the "555 Timer", introduced by "Signetics, USA" over 25 years ago, and because of its over 300 applications, this timer/clock circuit is built, even now, in a volume exciding 1 Billion units/year.

This chip's internal block schematic diagram comprises just a few standard devices or functional blocks, namely: 2 Comparators, 1 Flip-Flop, 1 Driver, 1 Transistor and 3 Resistors. A key feature of this chip consists in the clever way those internal parts are coupled to each other and to the 8 I/O terminals (i.e., the system's topology), offering to designers easy access and hundreds of combinations to connect a few external parts to the 555 Timer chip for building their desired application, in the timers, clocks, analog logic or automation fields of industry.

The 555 Timer chip's versatility inspired many other chip designers and inventors worldwide, leading to the concept of the microprocessor, the only other (very sophisticated) chip capable of beating the 555 Timer in respect to the versatility aspect, but never in respect to its simple "8 Pin" configuration and low cost/unit features.

Therefore, there is a vital need for improved versatile mixed signal controller circuits capable of inexpensively managing/converting the electrical energy with higher efficiency, power factor and reliability, and with lower harmonic distortions.

3. The Related Art

During the last 30 years, the mixed signal controller systems are more and more used in the power management industry because of their performances/cost advantages over analog and digital circuits. Several prior related circuits are presented in this chapter for comparison purposes with the new controlling system (NEWSYS) that represents the present invention.

For an easier perception of the present invention's versatility, distinctive controlling capabilities and other merits, features or advantages that the present invention has or may have over the related art's similar systems or circuits, Comparison Notes will be attached at the end of each "classic" (i.e., well known) controlling system and/or circuit's description, presented below.

3.1 The "555 Timer" Block Schematic Circuit (FIG. 1)

FIG. 1 shows the internal block schematic diagram of a 555 timer integrated circuit (IC) that senses and/or controls the external circuit via 8 input/output electrodes, respectively: 1.

GND, 2. Trigger, 3. Output (DRV), 4. Reset, 5. Control, 6. Threshold, 7. Discharge and 8. Vcc.

The 555 Timer device comprises one low voltage threshold voltage oscillating comparator (OCL) one high voltage threshold voltage oscillating comparator (OCL), one SR Latch (SRL), one Driver circuit (DRV), one discharging transistor (Td) and three equal value resistors (R1, R2, R3).

Despite its simplicity, this circuit is able to perform over 300 applications (see the Internet-related literature for the "555 Timer" circuit) in timers/clocks, analog logic and automations/robotics sections of the power management industry.

The main 3 typical circuits that create the means for most of the other 300 Applications of the "555 Timer" are the bistable, monostable and astable circuits, presented below.

Comparison Note: NEWSYS features a significantly more complex and reliable block schematic (see FIG. 19 for the NEWSYS apparatus block schematic embodiment and its related description).

3.1.1 The "555 Timer" Bistable Circuit (FIG. 2)

FIG. 2 shows a typical bistable circuit including a "555 Timer", a 12V DC supply source, a setting resistor Rs, a resetting resistor Rr, a setting switch SwS, a resetting switch SwR, an anti-noise capacitor Cc and a 12V/100 mA incandescent bulb BI.

When SwS is pushed for a short period of time (i.e., "push button" switch), the pin 3 (DRV) of the "555 Timer" switches in its "High" stage (i.e., near 12V) and remains there until the other switch SwR (i.e., also "push button" switch), is pressed, for a short time.

The bulb BI lights during all the time when DRV is "High" so, in other words, this bistable circuit is a "one-bit memory" (i.e., analog logic) capable of keeping a load (i.e., a bulb, motor, heater, etc.) connected to its power supply source (via a Relay, MOSFET or Thyristor, when large power is required) for an indefinite time, until an operator, a mechanical device or electrical sensor (i.e., automation/robotic systems) activates SwR and switches OFF the entire circuit.

This bistable circuit has also a very large use in fast control systems used in automation/robotic circuits, because it eliminates one important disadvantage of the classic mechanical switches (i.e., "Push Buttons", "Toggle Switches", "Relay Contacts", etc.) which, at each "ON" or "OFF" cycle, provide not just one pulse but actually a train of pulses which may "Start" and "Stop" several times, fast controlling circuits, at each time when a mechanical switch gets "ON" or "OFF". This disadvantage can be successfully eliminated, by using one switch for the "ON" operation and another switch, for the "OFF" operation.

Comparison Note: The present inventions' bistable circuit solution comprises less parts (see FIG. 38, The NEWSYS Bistable Circuit Embodiment) and it is more reliable against time and temperature than the above presented solution, because NEWSYS comprises more reliable internal functional blocks, stabilized by a voltage gap reference which provides, 5.0V (Vref–pin 8) having 1% precision, despite large variations of temperature. (See FIG. 38: "The NEWSYS Bistable Circuit Embodiment" and its related Description.)

Important Observation: Inside of a 10-15 functional blocks mixed-signal chip, a voltage gap reference block takes less than 15% of the die size and therefore its cost, as an internal devices, is very low (i.e., about 10-15% of the chip's total manufacturing cost. However, as a separate device (chip) attached to a "555 Timer" system for improving the entire circuit's reliability, may cost as much as a "555 Timer" chip itself, because of the wafer cutting, packaging and test manufacturing operations, involved to each distinct product. On the other hand, a "555 Timer" chip including a voltage gap reference in its internal system's block schematic, will surely change its existing perfect topology, and dramatically altered, its versatility feature.

3.1.2 The "555 Timer" Monostable Circuit (FIG. 3)

FIG. 3 shows a typical monostable circuit including a "555 Timer", a 12V DC supply source, a Setting resistor Rs, a Setting switch SwS, a filter compensation capacitor Cc, a Charging resistor Rch, a timing capacitor Ct and a 12V/100 mA bulb, BI.

When SwS is pushed for a short period of time, the pin 3 (DRV) of the "555 Timer" switches in its "High" stage and remains there for a limited time (i.e., from several milliseconds to several minutes) determined by Rch current and Ct charging time. The bulb Bl lights during the limited time when DRV is "High" so, in other words, this monostable circuit is a "Timer" capable of keeping a load connected to its power supply source for a precise pre-established time determined by the external parts Rch/Ct (i.e., designer's option).

This monostable circuit has, also, a very large field of applications in many automations/robotic systems, where each operation involves a "time frame" of execution. Also, it could be successfully used in energy saving circuit in which a lighting system or a heating and/or cooling system is supposed to work just for a limited time and eventually shut down automatically.

Comparison Note: The present invention's monostable circuit solution comprises fewer parts and is more precise and reliable in respect to the above-presented solution, because NEWSYS internal system architecture is more reliable against variations of the supply voltage and/or variations of the ambient temperature. (See FIG. 39: "The NEWSYS Monostable Circuit Embodiment" and its related Description).

3.1.3 The "555 Timer" Astable Circuit (FIG. 4)

FIG. 4 shows a typical astable circuit including a "555 Timer", a 12V DC supply source, a Charging resistor Rch, a first Discharging resistor Rdch1, a second Discharging resistor Rdch2, a Discharging diode Ddch, a timing capacitor Ct, an "anti-noise" capacitor Cc and a 12V/100 mA incandescent bulb, BI.

When the 12V DC source is coupled at the Vcc and GND terminals, the capacitor Ct is charged with an electrical current incoming from Vcc (+) to GND (−) via Rch, Rdch and Ct. The controller's three (equal value) internal resistors coupled series from Vcc to GND provide two voltage reference to the inputs of the two comparators in such a way that the CS's reference input is set to a voltage in amount of about ⅓ of the Vcc amount and the CS's reference input is set to a voltage in amount of about ⅔ of the Vcc amount, in respect to GND (zero). During the period of time in which Ct is charged up to ⅔ of the Vcc voltage amount, the SRL's Q output is in HIGH state and its Q-bar output in LOW state so, in other words, BI is lighting and Td act as an OFF switch.

When Ct charging voltage exceeds the ⅔-voltage threshold, the SRL's outputs are triggered in opposite logic states so, now Td is switched ON and pin 3 (Output) is switched to its LOW state that shuts down BI's lighting.

When Td discharges Ct, via Rdch, down to a voltage amount lower than ⅓ of the Vcc voltage, the SRL's outputs are switched back in their initial states and the cycle is repeated indefinitely.

In other words, this entire circuit acts as a "Square Wave Oscillator", a "Square Wave Generator", a "Multivibrator", and/or a "Clock" circuit, which is actually the most popular name for this kind of classic circuits.

This astable (clock) circuit is probably the most used application of the "555 Timer" circuit, since all automation/robotic systems need a clock for synchronizing the operations and the use of square wave signals is much more efficient (in respect to sine-waves) in monitoring/warning applications.

The main inconvenience of this application consists in the fact that the "555 Timer" cannot continuously provide duty cycle ratios ranging from 1% to 99%. Typically, the chip works only in the 50% to 99% range, and for lower duty cycle, a diode (Dch) has to be attached to the system.

Comparison Note: The present invention's astable (clock) circuit solution comprises less parts and is more precise and reliable in respect to the above presented solution, because NEWSYS internal system architecture is more reliable against variations of the supply voltage and/or variations of the ambient temperature. (See FIG. 40: "The NEWSYS Astable Circuit Embodiment" and its related Description.)

Additionally, the NEWSYS Astable (Clock) Circuit has the capability to provide duty cycle ratios from less than 1% up to over 99%, continuously (i.e., no need to attach a diode or modify the System), via a potentiometer or in feedback with a sensed voltage and/or current (i.e., state-of-the-art PWM System).

3.1.3 The "555 Timer" Intruder Alarm Application (FIG. 5)

FIG. 5 shows a typical "complex" application of the "555 Timer", namely an "Automotive Intruder Alarm" circuit that includes a 12V DC supply source (the car's battery), two "555 Timer" controller ICs, 3 transistors, 12 resistors, 5 Capacitors, 2 Diodes, one Relay and a mechanical switch.

This alarm circuit does a similar job of a very simple digital microcontroller used in automation/robotics circuits, respectively it runs 2 consecutive operations in a specific order and in accordance to a pre-established time schedule (i.e., two monostable circuits connected together, for pre-setting the time of each operation):

1. Activates the alarm (the car's horn and lights) within 13 seconds since one of the car's door (or window) is opened if "the secret resetting switch" (hidden by the car's owner) is not activated during that time, and 2. Deactivates the alarm after 1 and ½ minutes, assuming "the intruder" left, shortly after the alarm started.

This is just a simple example of how a "555 Timer" could be used in automations/robotics circuit applications.

Comparison Note: The present invention's intruder alarm circuit solution comprises less parts, is able to provide, simultaneously 3 Timing Operations (i.e., NEWSYS can replace up to three "555 Timers" circuits) and is more precise and reliable in respect to the above presented solution, because NEWSYS internal system architecture is more reliable against variations of the supply voltage and/or variations of the ambient temperature. (See FIG. 41, The NEWSYS Intruder Alarm Circuit Embodiment.)

Additionally, the NEWSYS intruder alarm circuit solution is able to protect as many doors or windows as needed (i.e., a huge building), with minimum extra cost (i.e., just one switch one diode and one resistor/door).

3.2 Pulse Width Modulation (PWM) Circuits

The PWM circuits are now more and more used in Boost, Buck or Buck-Boost AC/DC-DC/DC converter, flyback, power factor correction, light control, motor control, temperature control, and battery chargers' control circuits, because of their high efficiency.

These circuits include, typically:

a) a "Large Signal" (typically V>100V, I>5 A) sub-circuit, comprising high voltage/current inductors (coils), diodes, capacitors, resistors, and "buffers" (i.e., MOSFETs, IGBT's, bipolar transistors, thyristors, triacs, etc.), and b) a "Small Signal" sub-circuit (typically V<20V, I<1 A), comprising a Controller IC (chip) and several low power, diodes, resistors, capacitors, transistors, op-amps, comparators, opto-couplers etc. that connects the controller chip, to the "Large Signal" sub-circuit.

The PWM control could be performed using different techniques, such as "Voltage Mode" or "Current Mode", "Fixed Frequency" or "Variable Fervency", and "Continuous Mode" or "Discontinuous Mode" of operations, in order to reach an optimum cost vs. performance compromise. Therefore, the PWM controller circuits industry includes many "types" and/or "families" of controller ICs, designed for specific applications. Some of these circuits are describe below, for comparison purposes.

Comparison Note: NEWSYS field of applications include boost, buck or buck-boost AC/DC-DC/DC converter, flyback, power factor correction, light control, motor control, temperature control, battery chargers control, and many others that none of the existing PWM Controllers could perform with less external parts, being capable to drive any kind of buffers, such as: MOSFETs, IGBT's, bipolar transistors, thyristors, triacs, etc.

Additionally, NEWSYS internal topology and pin-out configuration allow for the use of any of the above PWM control technique, such as: "Voltage Mode" or "Current Mode", "Fix Frequency" or "Variable Fervency", "Continuous Mode" or "Discontinuous Mode" of operations.

(See all NEWSYS PWM Application Embodiments and the related descriptions.)

3.2.1 The Voltage Mode Control Systems (FIG. 6)

FIG. 6 shows a voltage-mode PWM system comprising:

A "Large Signal" sub-circuit including in a buffer NPN transistor, having a Rsense resistor included in its emitter circuit, a high frequency transformer, two rectifier diodes, a filtrating coil and a filtrating capacitor, included in the buffer's collector circuit, and A "Small Signal" sub-circuits such as an error amplifier, a PWM comparator, an oscillator/clock, a voltage ramp capacitor and an SR (Set-Reset) latch.

As the voltage/time graph attached at the bottom of FIG. 6 shows, the voltage-mode PWM control technique works as following:

I. The oscillator block generates, simultaneously, a saw tooth voltage ramp signal (created via the voltage ramp capacitor) at one input of the PWM comparator and a rectangular clock signal at the set (S) input of the SR latch, synchronized in such a manner for the clock pulse to last just for the (relatively) short period of time when the voltage ramp pulse decays, from its maximum to its minimum amplitude value.

II. As soon as the set pulse ends (i.e., turns to the "LOW" logic state), the SRL output (Q) turns "HIGH" and activates the NPN buffer, which acts as an "ON" switch in the circuit of the inductor (i.e., the primary section of the high frequency transformer), which starts accumulating electrical energy.

III. When the voltage ramp signal amplitude reaches the amount of voltage delivered by the error amplifier's output, at the other input of the PWM comparator, "Vo", the Comparator's output reverses its logic state, resets the RS latch and turns OFF the NPN buffer.

IV. The inductor is "released" from the NPN buffer's circuit and is able to discharge the accumulated electrical energy in the secondary section of the high frequency transformer, which delivers the energy to Vout via one diode, the filtrating coil and the filtrating capacitor.

V. When the next set pulse is generated, another inductor's charging cycle is executed.

Generically, the PWM (pulse width modulation) technique relates to the capability of the controller circuit to modulate the pulse "ON" versus "OFF" time period (i.e., the duty cycle) in such a manner that the Vout remains constant in amplitude, despite large variations of the load current and/or supply voltage. (Vout amount is proportional to the duty cycle ratio.)

In the "Voltage Mode" control situation, the feedback with the load voltage (Vout) is made by the error amplifier, only, (i.e., no current feedback from Rsense) which, via its two inputs, senses the Vout amount in comparison with a precise reference voltage and adjusts its output voltage in such a manner, to increase the latch output pulse "ON" time (i.e., increasing the duty cycle) if Vout is lower than a pre-established value (i.e., in respect to the reference voltage), and, vice versa, to decrease the latch output "ON" time (i.e., decreasing the duty cycle) when Vout amount raises over the reference voltage amount.

The voltage-mode PWM systems offer several advantages such as good stability, smaller inductor size and lower cost, for converters up to 200 W output power.

The main disadvantages are slower feedback speed, higher peak current in the inductor and buffer, and, implicitly, lower efficiency in respect to other solution.

Comparison Note: NEWSYS' includes in its internal topology all the above-mentioned functional blocks, plus many more, for performing voltage-mode PWM control operations.

Additionally, NEWSYS is able to eliminate the above-mentioned disadvantages of a typical voltage-mode PWM system, being able to control large signal systems in an optimized voltage/current mode combination technique.

5.2 Current Mode Control Systems (FIG. 7)

FIG. 7 shows a current-mode PWM system having about the same configuration and comprising about the same parts, except the voltage ramp capacitor, which is not needed in this system, since the lower input of the PWM comparator is connected directly to the NPN buffer's emitter.

The error amplifier is doing the same feedback job in respect to Vout, however now, the controller is able to sense not just the output voltage, but also the current delivered to the load.

As the voltage/time graph attached at the bottom of the FIG. 7 shows, the current-mode PWM control uses the same technique in which a set pulse coming from the oscillator/clock activates (via the SR Latch) the NPN buffer, for a time period and then a reset pulse, commixing from the PWM comparator (via the same SR latch) des-activates the buffer, for another period of time.

The main difference in respect to the voltage-mode system consists in the fact that now the PWM comparator is sensing, directly, the inductor current (via the NPN Bbffer and the Rsense), so in other words, the controller is able to immediately read pulls by pulsing the maximum current in the inductor and to deactivate the NPN buffer at any time when the current reaches an amount higher than a pre-established amount.

This technique allows for continuous mode of operation with higher duty cycle ratio, lower peak current in the inductor and buffer, and implicitly allows for a better efficiency. Thus, current-mode PWM systems offer significant advantages in respect to the feedback and control speed and efficiency factors.

The disadvantages list includes less stability, larger inductor and higher total cost/solution.

Modern systems are using kind of combination between the to above presented systems, by overlapping a fraction of the oscillator Voltage Ramp signal over the current sense signal (see FIG. 9: the voltage ramp buffer circuit including Qvr, Rvr1, Rvr2), a fact which increases the current-mode system stability.

Comparison Note: NEWSYS' includes in its internal topology all the above-mentioned functional blocks (plus many more) for performing current-mode PWM control operations.

Additionally, NEWSYS is able to eliminate the above-mentioned disadvantages of a typical current-mode PWM system, being able to control large signal systems in an optimized "Voltage/Current—Discontinuous/Continuous" mode combination technique.

6. The UC384x Block Schematic (FIG. 8)

FIG. 8 shows the circuit blocks of probably the most "classic" PWM current controller in the industry, the UC3842, that belongs the UCx84x current-mode PWM controller series (family), introduced by Unitrode (USA) (now Texas Instruments) over 20 years ago.

This very popular fixed-frequency current-mode PWM integrated circuit is still built in very large volume by over 100 major manufacturers worldwide (including TI, Motorola, ST, ON Semiconductor, Fairchild, Micrel, etc.), because of its simplicity, decent performances and low cost.

The "UCx84x controller ICs family includes the UC1832/345, the UC2842/3/4/5 and the UC3842/3/4/5. All these controllers have, basically, the same internal block schematic topology, as shown in FIG. 8, however there are some minor differences in their behavior, respectively the UC184x and UC284x feature less current consumption, the UCx842/4 have a UVLO hysteresis that allows them to start operating at 16V and cease operating at 10V, while the UCx843/5 start operating at about 8.6V and cease operating when their supply voltage drop down to less than 7.8V.

The UC3842 (representative for the UC384x controller IC family) comprises 8 functional blocks included in the controller series are the (1) under-voltage lock-out (UVLO), the (2) voltage references and internal biasing (VRIB), the (3) driver (DRV), the (4) pulse width modulation Logic (PWML), the (5) error amplifier (EA), the (6) voltage limiter (VL), (7) pulse width modulation comparator (PWMC), and the oscillator (OSC) block.

Eight I/O electrodes: Comp (1), Vfb (2), Is (3), RtCt (4), GND (5), Output (6), Vc (7) and REF (8) are connecting the internal functional blocks to the controller's related circuit.

Comparison Note: For compatibility reasons, NEWSYS' has been designed with the same "Pin-Out" topology and comprises all the UC3842 eight internal functional blocks (some of them upgraded, internally), in order for NEWSYS to be able to perform the typical fixed-frequency PWM current-mode applications featuring better performances, while substantially reducing the related external circuit's parts count (9-15 parts) and also, the entire solution's size and cost.

However, the internal system block schematic topology has been substantially modified and/or upgraded, by inserting 4 more functional blocks, and accordingly changing the blocks interconnection topology, in order for the NEWSYS to be able to perform not just as a fixed-frequency current-mode PWM controller, but also as any of a variable-frequency current-mode PWM controller, a timer/clock circuit, a fixed/variable-frequency PFC controller circuit, a thyristor (SCR) controller circuit, a "Benistor" controller circuit, and/or a ZVD controller circuit, etc. (See FIG. 19, "The NEWSYS Circuit Block Schematic Embodiment" and its related description.)

6.2 The UC384x Typical AC/DC Converter (FIG. 9)

FIG. 9 shows a typical UC384x AC/DC boost converter schematic comprising a large-signal sub-circuit and a small-signal sub-circuit.

The large-signal sub-circuit, comprises: an input voltage supply unit including an electromagnetic interference filter (EMI), a bridge rectifier (BR) and 2 input filtrating capacitors (C1, C2), a high frequency transformer (Tr), a MOSFET transistor (M), a sense resistor (Rsense), a snubber circuit comprising a capacitor (Cs), a diode (Ds) and a resistor (Rs), a high voltage fast diode (Do), an output filtrating capacitor (C3) and a load resistor (Rl).

The small-signal sub-circuit comprises: a UC384x controller IC, a starting resistor (Rst), a DC supply circuit (connected to the Tr secondary coil) comprising a low voltage diode (Dsu) and a small voltage capacitor (Csu), a driving resistor (Rdrv), a current spike filter including a resistor (Ris) and a capacitor (Cis), a timing RC circuit a resistor (Rt) and a capacitor (Ct), a Voltage Ramp Driver Circuit including a NPN Transistor (Qvr) and two resistors (Rvr1, Rvr2), two feedback resistors (Rfb1, Rfb2), a compensation filter including a capacitor (Cc) and a resistor (Rc), a low voltage filtrating capacitor (Cr) and a soft start circuit including a transistor (Qss), a capacitor (Css) a resistor (Rss) and a diode (Dss).

The circuit operates in a classic boost fixed-frequency current mode, providing a stabilized voltage of about 400 VDC, across the load resistor Rl, despite the large variations (i.e., in off-line circuits, 85 Vrms-265 Vrms) of the un-stabilized input voltage, which is rectified by BR and filtrated by a bulk capacitor CF2 (about 100 uF per each 100 w input power).

The EMI block and Cf1 (100-220 nF, typically) help for attenuating (i.e., stopping most of them from going back into the 50-60 Hz electrical line) the high frequency harmonics incoming from the high power boost switching system.

The primary coil of the high frequency transformer TR acts as typical boost inductor, which for each of the MOSFET (M) buffer's switching cycle, stores electrical energy for a period of time (i.e., during the M switch "ON" time) and then releases this energy (i.e., during the M switch "OFF" time) to the load, Rl, circuit, via Do, where the output bulk capacitor Cf3 (about the same value as Cf2) stores it, until the next high frequency cycle.

A part of the inductor's electrical energy is collected by the Tr secondary coil, for supplying the controller with DC voltage, via Dsu and Csu.

The Cs, Ds, Rs circuit is a classic "Snubber" that keeps the MOSFET buffer "cool", since a low operating temperature is more safe and also, the MOSFET's aluminum heat sink could be substantially reduced, when large power is converted.

During the high power switching process, without snubbers, the MOSFET buffer's has to dissipate a huge power (over 1 kW) for a very short period of time, when M switches "OFF" and the inductor reverses its polarity, pushing the MOSFET's drain/source voltage up to 400V in almost no time.

When a MOSFET transistor drain-source current reaches an amount of 5 A peak and is shut down from its gate by the controller's driver, it needs at least 80-100 nS (unless is a very fast and expensive one) for its current to decay to 0 A. If the inductor force pushed it very fast to the load's voltage, then during that short time its dissipation will be 5 A×400V=2 kW, a fact that slowly, the transistor working temperature may increase to a dangerous level.

The snubber circuit's capacitor Cs creates a short delay in the MOSFET's drain's ascending speed, however it gives enough time to the MOSFET's drain-source current and its momentarily high power dissipation, to decrease considerably.

The main inconvenience of this type of snubber consists in the fact that a diode, Ds, and a resistor Rs have to be included in this snubber circuit for Cs to discharge its accumulated electrical energy not back into the MOSFET drain-source circuit, but into Rs, via Ds.

In other words, the electrical energy lost in Rs is the "sacrifice" designers have to accept, for cooling down the MOSFET and decrease its, voluminous, heat sink.

The MOSFET buffer, M, is switched, periodically by the PWM controller circuit, in such a manner, that when the voltage across the load Rl, exceeds a pre-established limit, the feedback resistive divider, Rfb1, Rfb2 provides an increasing voltage in the controller's EAin (pin 2) input and when this voltage exceeds 2.5V, the error amplifier's output, EAout (pin 1) starts lowering its voltage, forcing the PWM Comparator block to decrease the DRV's output signal duty cycle, until the voltage across Rl is balanced and slowly stabilizes at the pre-established value, determined by the Rfb1, Rfb2 ratio.

The Rt, Ct circuit are setting the controller's internal oscillator frequency in a classic fashion, similarly to the "555 Timer" oscillating operations, except the fact that UC384x has precise voltage references and constant current sink discharge capabilities.

Rsense, (typically 0.1-1 ohm) provides small voltage to the controller current sense Is (pin 3) terminal, direct proportional to the momentary current value amount crossing the Mosfet M, via a current spikes filter circuit, Ris, Cis. This filter is needed, to eliminate an over 1V short (about 100 nS) spike attached to the "leading edge" of each pulse (mostly in the continuous current-mode applications), which may shut down, prematurely, the controller's driving output signal.

The voltage ramp driver circuit, comprising Qvr, Rvr1 and Rvr2 that buffers the Osc (pin 4) signal to Is (pin 3) provide allows the UC384x to work in voltage mode of operations, or by adding the OSC voltage signal to the current signal incoming from Rsense, creates a "slope compensation" which increase the stability of the system, in current mode of operations.

The soft start circuit, comprising Qss, Rss, Css and Dss forces the EAout (pin 1) terminal to raise its voltage smooth, since the voltage amount of this terminal is direct proportional with the DRV's output signal duty cycle and, implicitly, with the voltage across Rl.

Cr filtrates Vref DC voltage.

The Vref electrode, after receiving validation from the UVLO block, supplies with very precise 5.0 Vdc all the small-signal external circuit related to the controller. When Vref (pin 8) is active (i.e., delivers 5.0 V) it charges, softly, Css, via Rs (typically 10 mS, with Rss=1M and Css=10n). However, when it shuts down, it acts as a switch to GND and discharges (resets), rapidly, Css.

The UC384x is a low cost and pretty versatile current-mode PWM controller circuit capable of performing, with decent performances, many applications in the power management field of industry, respectively high frequency converters, such as: flyback, boost, buck and buck-boost, operating in fixed-frequency, current mode or voltage mode with external voltage ramp driver), continuous current or discontinuous current mode system design.

Limitations/disadvantages of this controller circuit are: it operates only in fixed-frequency, it may "skip" pulses or is unable to deliver low duty cycle ratio pulses, i.e., (1-5%) in voltage mode or slope compensation applications and, in complex applications it request an external voltage ramp driver circuit, an external soft start circuit and an external current spike filter, all circuits which unnecessarily increase the parts count, size and cost of the entire solution.

Comparison Note: NEWSYS comprises all the UC384x internal functional blocks, plus several novel functional blocks (see FIG. 19, "The NEWSYS Circuit Block Schematic Embodiment") that allows for higher performances (does not skip pulses, but oppositely, it is capable of delivering short pulses at even less than 1% duty cycle), higher precision reliability, by using OPAM as internal voltage ramp driver, has more internal protections, faster shut-down control systems and offers a much larger field of applications.

As a big benefit, NEWSYS offers the same "8 pin-out" topology as the UC3846, however, it eliminates the need for several frequently use external circuits such as voltage ramp driver (3 parts), soft start (4 parts) and current spike filter (2 parts), a fact that substantially reduces the external parts count (a total of at least 9 parts, without considering the extra parts used internally, for upgrading purposes), the circuit size and the total solution cost and reliability.

Additionally, because of its remarkable versatility, by controlling a boost converter system pretty similar to the one presented above, the NEWSYS is capable of performing the exact same job as the UC3842 (i.e., comprising all the UC3842's internal functional blocks and a few novel ones) with less external parts count, higher efficiency, because of a more efficient snubber circuit and power factor near unity (i.e., PF=0.999). (See FIG. 48: "The NEWSYS PFC AC/DC Boost Converter Embodiment" and its related descriptions.)

7. Power Factor Correction Circuits

All existing electronic devices (such as computers, TV sets, monitors, stereos, industrial equipment, medical equipment, etc.) require an internal DC voltage supply, obtained by converting the AC current available from the standard 120-240V/50-60 Hz power line. In order to perform this AC/DC conversion, in most of the cases a low cost circuit comprising a bridge rectifier and a relatively large value (100-470 uF) bulk capacitor are used, typically.

Because the bulk capacitor is a "reactive device" which acts as an electrical energy storage device, after a few cycles, the voltage across the capacitor remains at a high DC value amount, slightly lower than the picked input voltage. As a result of this charge storage property, the capacitor re-charges periodically only for a short part of the AC cycle, when the momentary AC voltage amount exceeds the capacitor voltage amount (the rectifier bridge's diodes are direct polarized) and stops charging just as the AC voltage reaches its maximum peak value and the rectifier bridge's diodes start being reversed polarized.

As a negative result, the circuit current shape becomes a sharp pulse looking more like a triangle than a sine wave, which lasts only about 2 mS from the total period of about 8.33 mS of a 60 Hz sine wave generator's half cycle, the peak current in the circuit must be now higher for delivering the same power in shorter time, a fact that results in a higher RMS current amount, lowering the PF parameter considerable less than 1 (typically 0.65 for computers, monitors, printers, etc.).

Even worse, since it is well known that any current shape, except perfect sine waves (which are virtually impossible to be obtain), generates a large amount of noisy harmonics that may create serious perturbations to a lot of sensible pieces of equipments such as telecommunications devices, medical equipment and/or high precision industrial robots.

Because of all these above, the electrical utilities (the high power transformers as well as the wiring circuit's size are calculated proportional to the RMS current's amount) must employ, unnecessarily, much more generating and distributing capacity.

Therefore, since the energy conservation is the most important problem at the planetary level and, on the other hand, near unity (i.e., PF=0.999) power factor correction devices have been already proven to be real and reliable at the industrial level, from now on there is not just a vital need, but also a duty to resolve the PFC and THD issues rapidly, economically and efficiently.

8.2 The MC33260 (FIG. 10)

FIG. 10 illustrates the MC33260 circuit, as a classic ON Semiconductor's low cost 80 W PFC solution to be used for florescent bulb ballast applications, featuring the following:

0.967<PF<0.996 7.0%<$A$-THD<18.8%

90.2%<Eff<95.7% $/IC=0.84

As FIG. 10 shows, the MC33260 PFC circuit, buffered by a high power MOSFET transistor (MTP4N50E) has been introduced between the bridge rectifier (i.e., 4×1N4007 rectifier diodes) and the bulk capacitor (C2=47 uF/450V) with the purpose for the generator (i.e., the AC electrical line) to do not "feel" the reactance (i.e., the non-linear behavior mentioned above) of the bulk capacitor. The C1 (330 nF/500V) has a too small value for affecting, significantly, the generator's sine-wave current shape and reduce the PF parameter.

Similarly to the boost converter circuit's behavior, fully described above, after several high frequency oscillating cycles, the oscillating inductor L1 (320 uH) (charged, periodically by Q1) will charge C2, via D5 (MUR460E) to an amount of voltage higher than the maximum Vin, a fact that will allow the PWM controller IC (MC33260) to modulate, pulse by pulse (in high frequency) the entire circuit's current shape, pretty similar to the generator's voltage shape, respectively a sine wave. That correction improves the power factor and decreases the THD parameters in accordance to the chart shown at the bottom section of FIG. 10.

The internal architecture of the MC33260 PFC controller is pretty similar to the UC384x PWM controller, both circuits comprising an oscillator block, a feedback (error) amplifier block, a UVLO block, a PWMC block, a PWML block, an output buffer block, etc. However, despite the fact that does not include a "classic multiplier" block (a relatively expensive sub-circuit, included in most of the PFC controller ICs' internal topography), the MC33260 has several different functional blocks that are not included in the UC384x block schematic, and, of course, because of that, each chip has different pin-out configuration and applications.

No multiplier, lower inductor (320 uH), lower size and lower solution cost, represent the main advantages that made this solution very popular in the existing large volume market.

The disadvantages of the MC33260 PFC present circuit solution are: lower performances, variable operation frequency (higher EMI noise) and variable voltage delivered to the load (i.e., from 181V up to 392V).

Comparison Note: NEWSYS also does not comprise an expensive multiplier block, but is capable to perform PFC operations in variable frequency mode and is also capable of working in "voltage-follower" mode (i.e., variable voltage delivered to the load, increasing proportionally with the input voltage, for higher efficiency at low input voltage) when designers prefer that specific configuration.

Additionally, NEWSYS is capable to provide fixed-frequency, fixed-load voltage (400V) PFC solutions with better performances (PF=0.994-0.999, A.THD=1.9%-7%, Eff=90%-96%) and lower cost/unit (about 45 c/IC)

(See FIG. 48: "The NEWSYS PFC AC/DC Boost Converter Embodiment" and the related description and charts.)

8.3 The MC33368 (FIG. 11)

FIG. 11 illustrates the MC33368 circuit, as a classic ON Semiconductor's high performances 180 W PFC solution, featuring the following:

$$0.972 < PF < 0.997 \quad 0.6\% < A\text{-}THD < 5.8\%$$

$$92.2\% < Eff < 96.8\% \quad \$/IC = 1.64.$$

As FIG. 11 shows, the MC33260 PFC circuit is more powerful, buffered by a higher power MOSFET transistor (MTW20N50E) which has been also introduced between the bridge rectifier (i.e., 4×1N5406 higher current rectifier diodes) and the bulk capacitor (C2=330 uF) with the purpose for the generator (i.e., the AC electrical line) to do not "feel" the reactance (i.e., the non-linear behavior mentioned above) of the Bulk Capacitor. This circuit works in a classic fashion: the multiplier sub-circuit included in the MC33360 internal topography modulates, in high frequency pulses, the entire circuit current, reaching almost a perfect sine-wave (see PF=0.997 in the attached chart).

There are some similarities between the internal architecture of the MC33368 PFC controller and the UC384x PWM controller, however the MC3368 has many different functional block which are not included in the UC384x block schematic, and, of course, because of that, the two chips have different pin-out configuration and applications.

The main advantage of the MC33260 PFC circuit solution is: Excellent performances that reach the highest level in the industry.

The disadvantages of the MC33260 PFC circuit solution are: Cost/chip about double than the previous one, more parts count (25), larger size of the oscillating inductor (L1=720 uH) and, implicitly, larger size and higher cost/solution.

These factors are incompatible with the immediately needs of the large volume/affordable cost market that targets to replace, shortly millions of computers, monitors, printers and all the other electrical Devices with more efficient ones, for saving at leas the significant amount of electrical energy which is wasted now in unneeded overheat.

Comparison Note: NEWSYS is capable of controlling PFC circuits having about the same performances (PF=0.994-0.999, A.THD=1.9%-7%, Eff=90%-96%), but under lower cost/IC (about 45 c). Additionally, the entire system has less parts count, smaller size and total solution cost.

(See FIG. 48: "The NEWSYS PFC AC/DC Boost Converter Embodiment" and the related description and charts.)

9. The PCSD Conversion System (FIGS. 12 and 13)

The Parallel Charge-Series Discharge (PCSD) power conversion method has been introduced by Acatrinei (same author) in the U.S. Pat. No. 6,465,990 (Power Factor Correction Circuit—Oct. 15, 2002) as a highly efficient way of converting the electrical energy with Near Unity Power Factor and Low Harmonic Distortions.

At that time (2001), the PCSD concept has been successfully proven by using a "555 Timer" chip as a controller device (i.e., the first Apparatus Prototype), however that circuit had many limitations because it does not include in its internal architecture several important functional block required in the PWM/PFC applications, such as the Error Amplifier, the UVLO, the PWMC, the PWML, fast/high power DRV circuit, etc.

Comparison Note: NEWSYS is capable to control all PCSD PFC circuits, cost effectively and with high performances (PF=0.994-0.999, A.THD=1.9%-7%, Eff=90%-96%).

Additionally, the NEWSYS complexity in respect to the "555 Timer" controller allows for a more safe and reliable PCSD application circuit.

Figure 48:
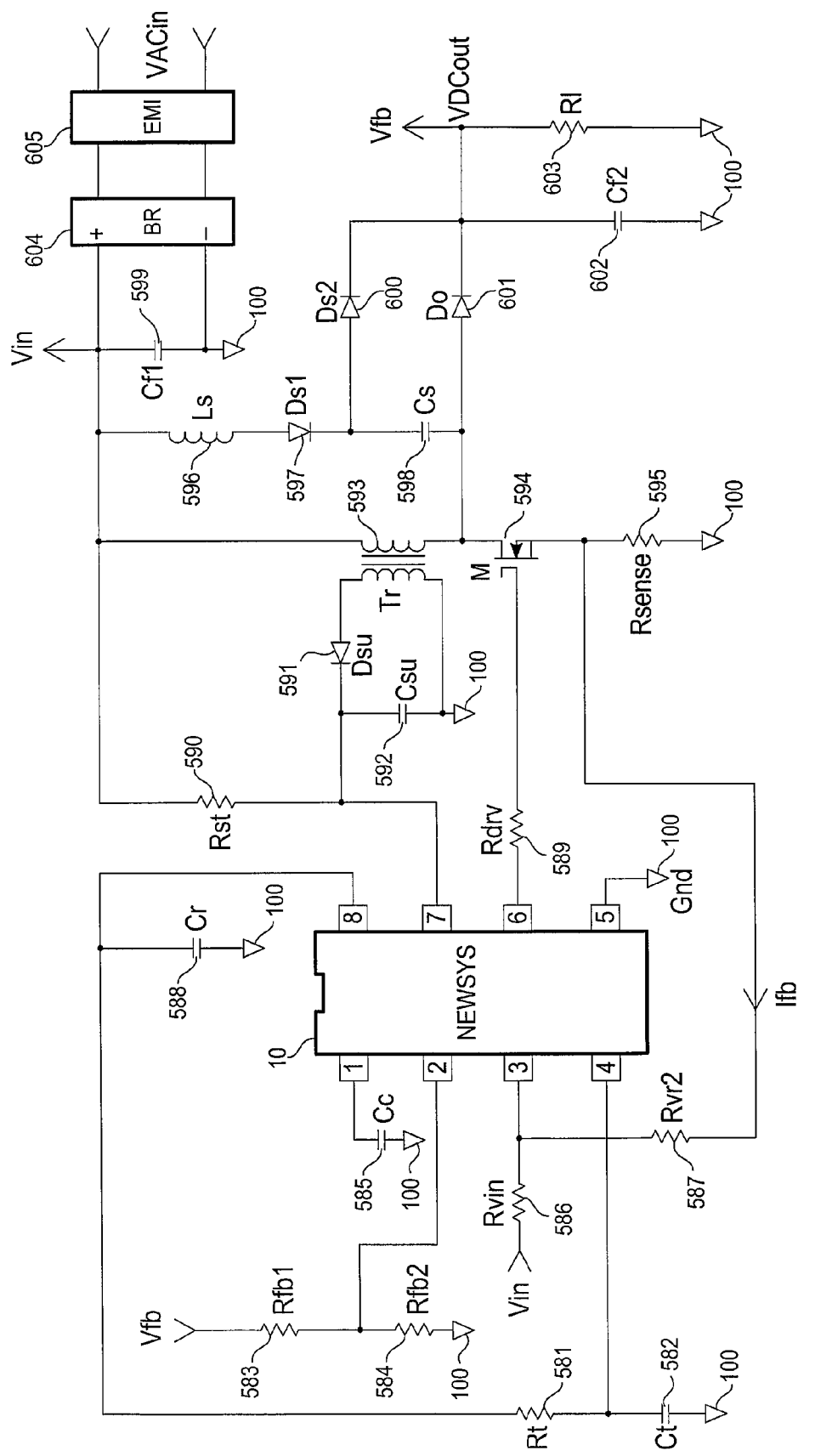

(See FIG. 48: "The NEWSYS PFC AC/DC Boost Converter Embodiment" and the related description and charts.)

10.1 The SCR's Control Circuit (FIGS. 14 and 15A-15C)

The Thyristor (or Silicon Control Rectifier—SCR), having three electrodes such as Anode, Cathode and Gate, is still the most powerful device ever created in the Power Management industry, because its "avalanche" (i.e., simply presented, a kind of "ignition" that push its junctions to complete saturation) capability allows it to switch ON-OFF currents of hundreds Amperes, beyond all the other high power devices (i.e., MOSFETs, IGBTs and Triacs) capability.

However, a disadvantage of its "avalanche" feature consist in the fact that a high power Thyristor (there are some bi-operational small power Thyristors) could be just "Turned ON" from its gate and after that it will remain in ON state (no matter the voltage in its gate) until its external anodic current is interrupted, for a short period of time.

Therefore in most of their applications, the Thyristors anodic circuit is supplied not with "filtrated DC" but with "un-filtrated DC" voltage, incoming directly (i.e., no filtrating bulk capacitor) from a high power Bridge Rectifier (see FIG. 15A, Vin), and therefore Thyristor gate's control is more sophisticated than a transistor's control.

Figure 14:
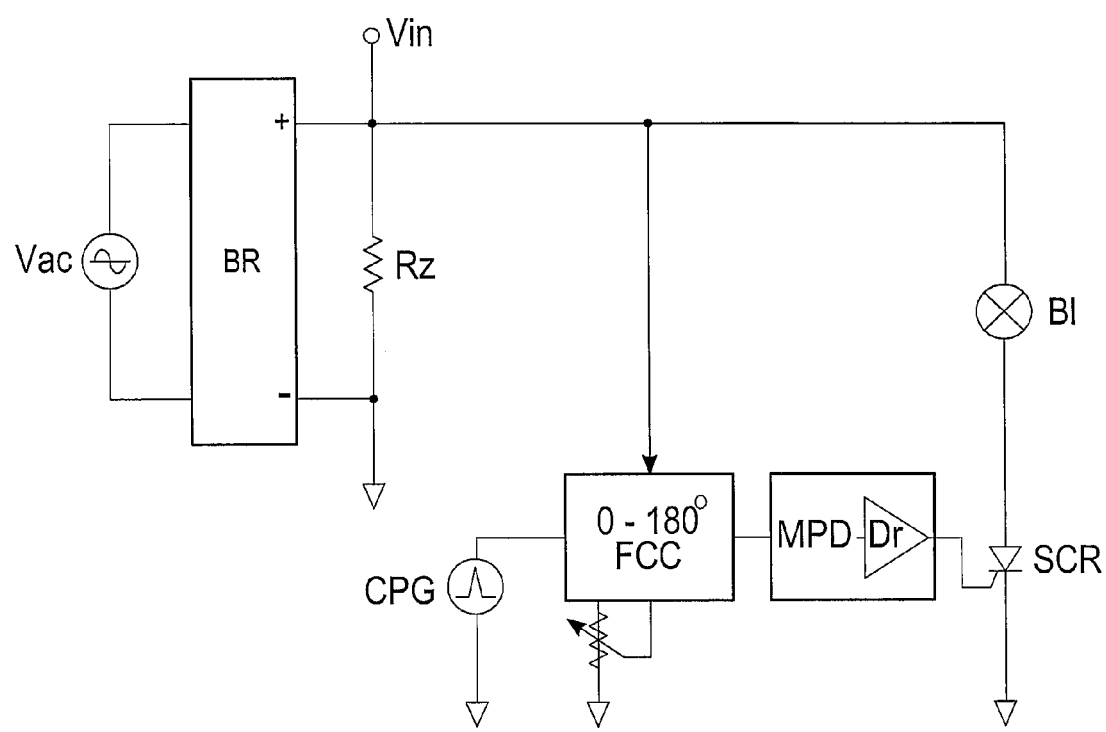

FIG. 14 shows a typical SCR's (Thyristor's) control circuit schematic diagram comprising an alternative current generator Vac, a bridge rectifier BR, a "zero volts" resistor Rz, a Control Pulse Generator CPG, a Phase Control Circuit (FCC), a Multiple Pulses Driver, a Thyristor SCR and a bulb BI.

The Typical SCR's Control Circuit shown in FIG. 14 refers to a light control system (dimmer) in which the Thyristor is able to adjust, smoothly, the light intensity of the bulb, from 0 to its maximum lighting power, by receiving a control pulse in its gate, at the right moment in respect to the Vac supply pulse. In other words, since the Thyristor is turned ON with a short pulse in the gate and after that it will remain ON (i.e., acting as a fast ON switch for BI) until the 50-60 Hz supply bridge rectified wave reached it's next 0V level, if the gate control pulse is delivered at the beginning of the rectified wave, BI will be supplied during the entire wave time (i.e., receiving the hole power) and if the gate control pulse is delivered at the middle of the wave, BI will be supplied just with half of the power and its light intensity will be also half. Therefore, by synchronizing the CPG short pulses with the moment when the Vac wave reaches 0V and then by controlling the phase with a phase control circuit, from 0 to 180 degrees (i.e., half of a sine wave), the Thyristor could be turned ON at any time, in respect to the rectified supply wave, and by using a potentiometer, the BI lighting intensity can be adjust, from 0 to its maxim power, with a precision of 180 increments. FIG. 15B (Gate Pulse) and FIG. 15C (Vout SCR) show the Gate and Anode signal for 10 increments in which the power in the BI bulb is smoothly decrease, from the "hole half wave" down to zero. Rz is included in the circuit for making sure that the high power diodes, included in BR are biased and the rectified wave decays near 0V (for being able to sense the "zero cross" moment and synchronize the CPG signal), because until the Thyristor turns ON there is no load (and no current) for the Bridge Rectifier. For the same reason, the large power Tyristors are turned ON with Multiple Pulses Drivers, because the Thyristor may shut down if after receiving just one short pulse, its anodic current is not large enough for maintaining its self-sustaining "avalanche".

Comparison Note: NEWSYS is capable to control Thyristors in the necessarily 0-180 degrees range, in cost effectible and reliable circuit solutions.

Additionally, NEWSYS is capable to control even Transistor, in a "Thyristor" way, respectively, by switching the Buffer Transistor ON at any time, however always resetting (switching OFF) the Buffer Transistor at the very next "Zero Cross" moment (i.e., the moment when the sine wave decay near 0V.

Figure 44:
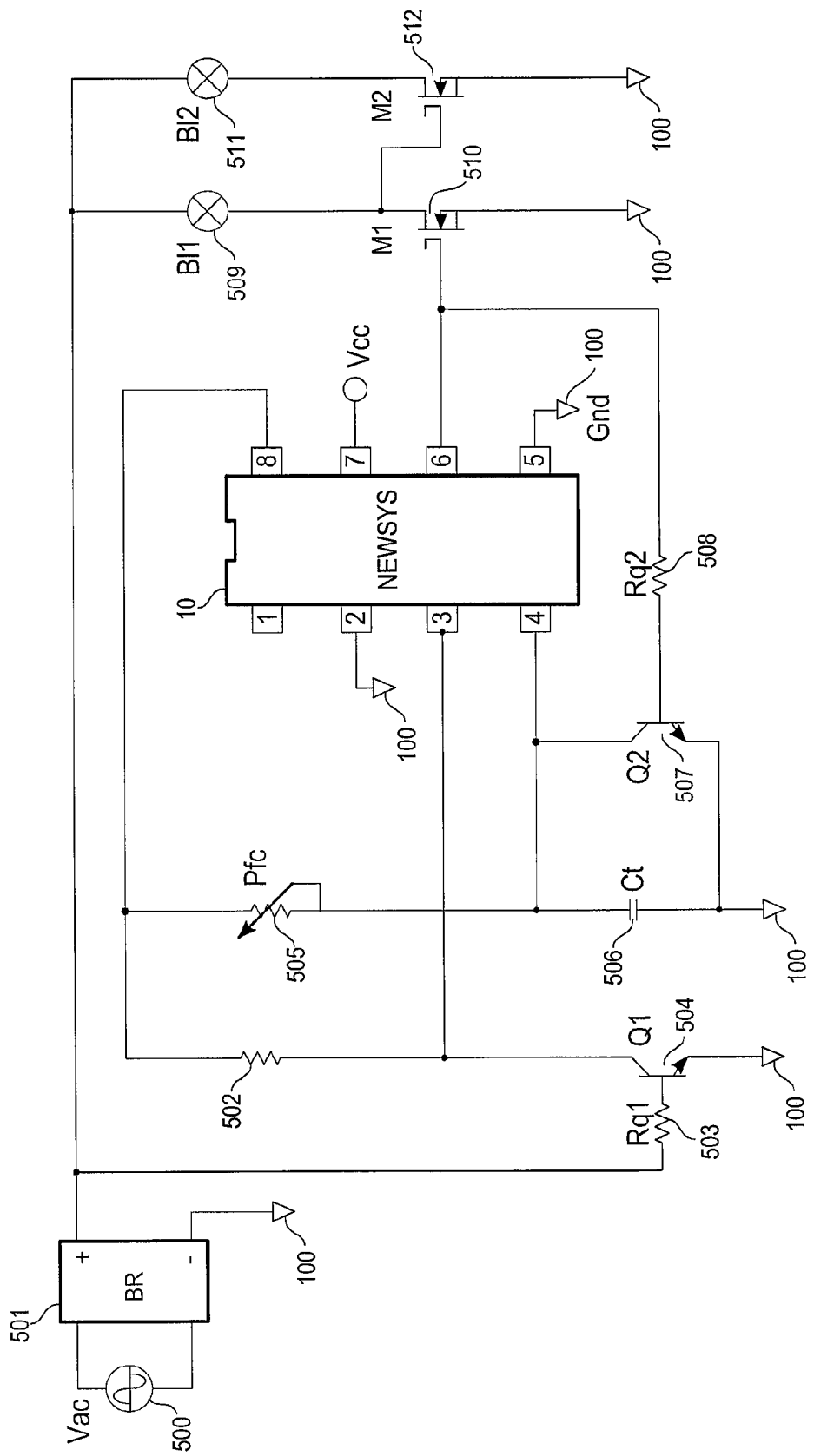
Figure 47:
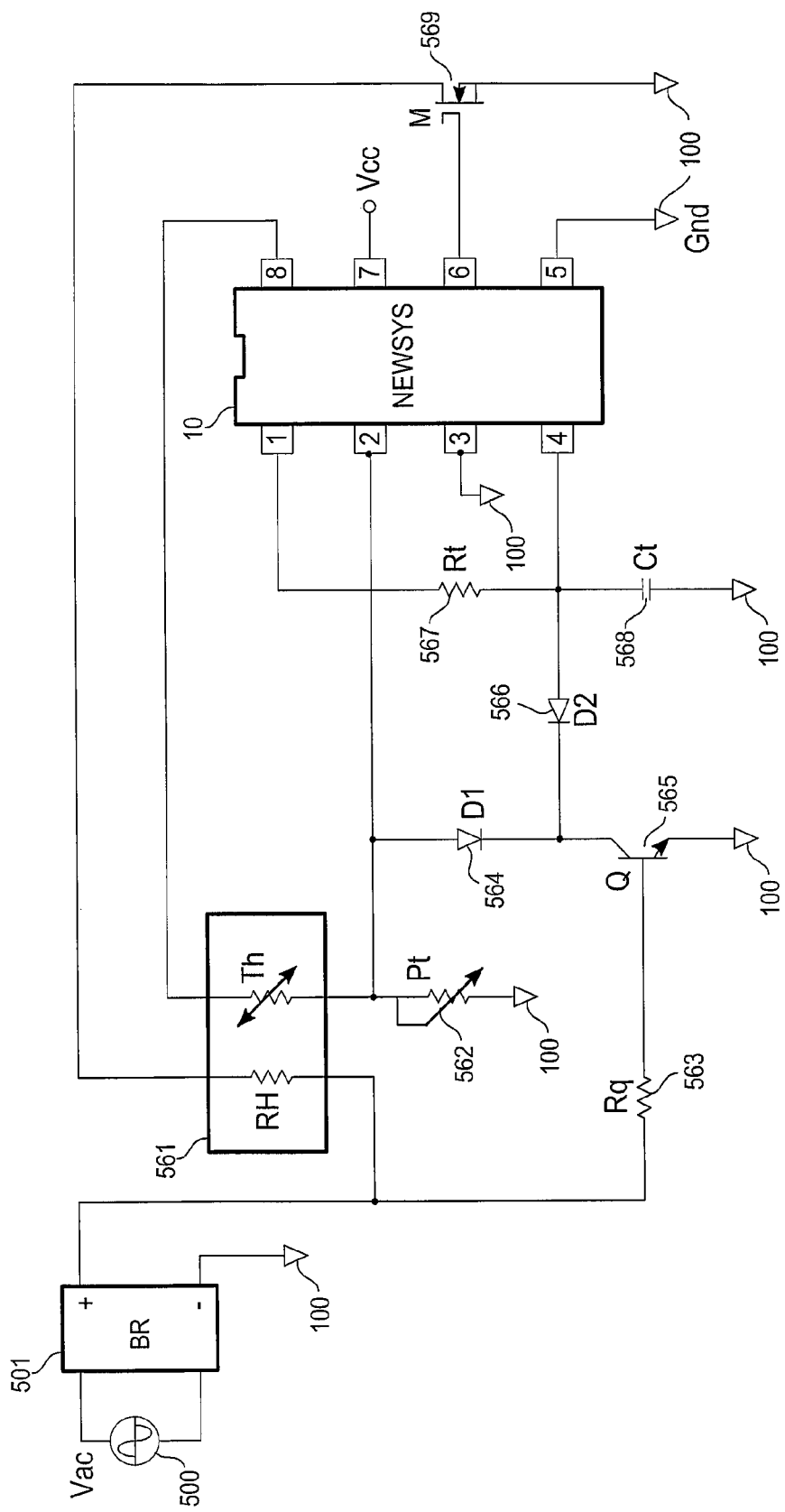

(See FIG. 44, FIG. 47 and the related descriptions and charts.)

10.1 The ZVD Control Circuit (FIGS. 15D-15E)

A particularly way of controlling the electrical energy from a generator to a load is the "ZVD" (Zero Voltage Drive or Zero Voltage Switching "ZVS") mode that offers, besides very good efficiency, almost "No Switching Loss and/or Noise".

This method is ideal for controlling the heaters' power, because heaters are capable to "store heat" for a relatively long period of time and do not request fast switching speed.

The method consists in switching ON or OFF the power control device (Buffer) only when the Vac wave crosses its zero voltage line, providing to the heater either the "hole power wave" (i.e., half of a sine wave, after bridge rectifying) or "no power wave" in a relatively slow feedback (i.e., seconds or minutes) that can keep, constant the temperature, in a room, or in a cooking oven, or in a molding plastic oven, etc.

The Thyristor is an ideal control device for this application, because it is capable to turn itself OFF at the end of each Vac power wave semi-cycle.

FIG. 15D (Gate Pulse) and FIG. 15E (Vout ZVD) show the Gate and Anode signals in a ZVD circuit control application.

However, for small and medium power, buffers such as Bipolar, MOSFET and IGBT transistors could offer even better efficiency under lower size and cost.

Comparison Note: NEWSYS is an ideal controller circuit for these kinds of applications, being capable to drive, in a ZVD mode of operations, not just Thyristors but Bipolar, MOSFET and IGBT transistors, as well. (See FIG. 45, FIG. 47 and the related descriptions and charts.)

11. The Benistor (FIGS. 16 and 17A-17G)

The "Benistor" has been introduced by Acatrinei (same author) in the U.S. Pat. No. 5,903,140 (Low Dissipation Controllable Electron Valve—May 11, 1999 and has obtained a "Cover Story" appreciation from the Electronic Design Magazine of Jun. 6, 1998) as an extremely versatile "Controllable Electron Valve" having separate control electrodes for effective voltage control (EVC), for maxim voltage control (MVC), for positive phase current (CC+) and for negative phase current (CC).

Figure 16:
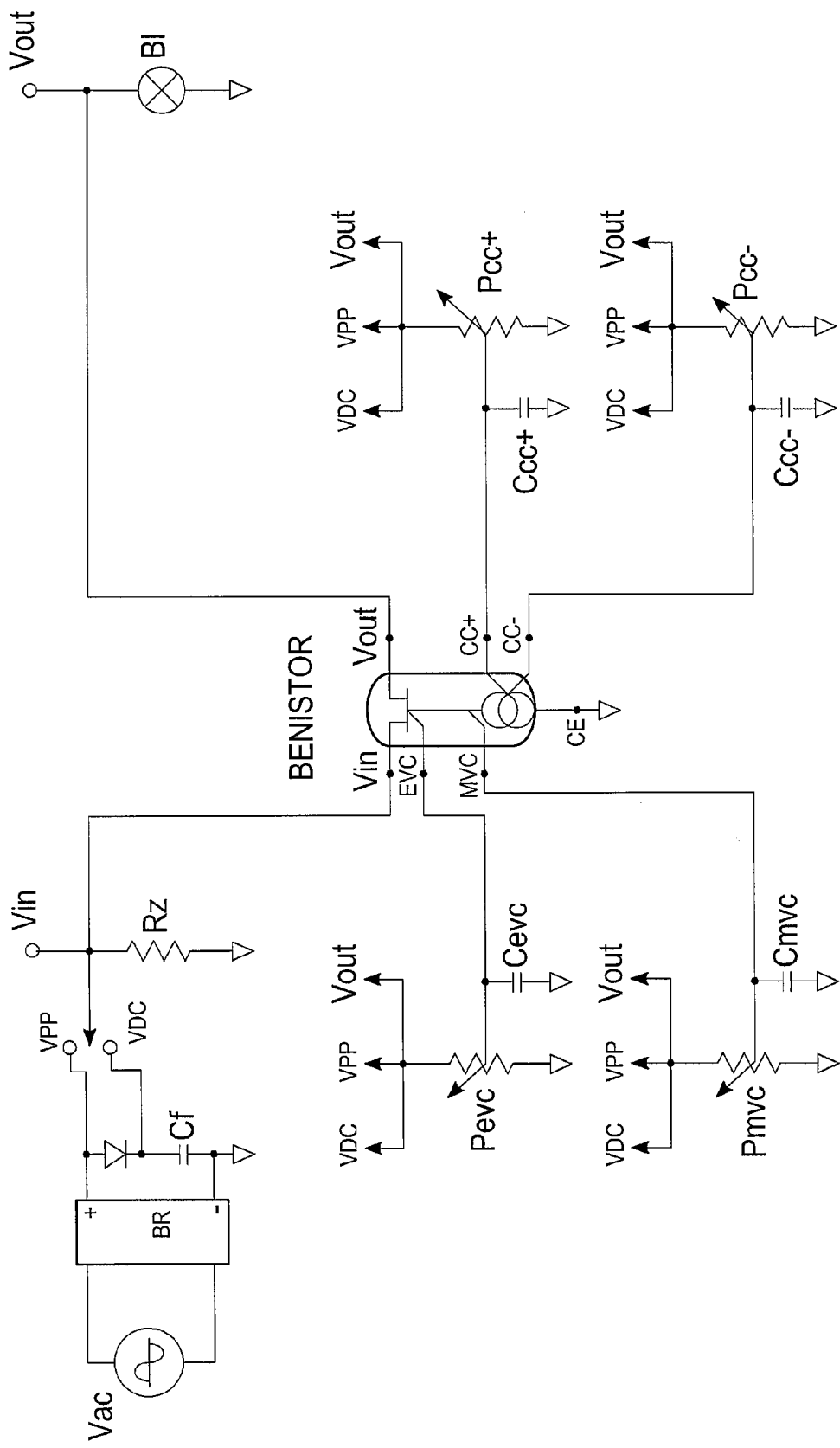

FIG. 16 illustrates the Benistor Test Fixture Diagram comprising, primarily, an alternative current generator Vac, a Bridge Rectifier BR, a rectifier diode Dr, a filtrating capacitor Cf, a Benistor circuit, a bulb Bl and several switches and capacitors included in all the Benistor's I/O terminals, for capabilities test and demo purposes.

This device is actually an analog signal processor, able process a given input signal, change its shape or modulating it with sine waves, triangular or square waves.

By changing the setting of the five switches and four potentiometers, the Benistor is able to generate waves of infinite combinations.

In FIGS. 17B-17G have been selected just several waveforms, having applications in the Power Management industry, that the Benistor is able to process at its Vout electrode, having just a rectified sine wave inputted at its Vin electrode.

FIG. 17A (Vin) shows the Bridge Rectified power wave inputted at Vin.

FIG. 17B (PWM) shows that the Benistor is capable to process a rectified sine wave by outputting a square wave that is perfectly synchronized with the original wave and located, consistently, in the middle of the rectified sine wave. Applications: PWM, Peak Detector, A/D interface.

FIG. 17C (SCR) shows that the Benistor is capable to process a rectified sine wave by outputting a "Thyristor Control" wave which is perfectly synchronized with the original wave. Applications: Low/Medium Power Thyristors' application.

FIG. 17D (RSCR) shows that the Benistor is capable to process a rectified sine wave by outputting a "Reverse-Thyristor Control" wave that is perfectly synchronized with the original wave. Applications: Replacing Thyristors in applications where there is a need for a "smooth start".

FIG. 17E (EVC) shows that the Benistor is capable to process a rectified sine wave by outputting a "Effective Voltage Control" wave which is perfectly synchronized with the original wave and located, consistently, in the middle of the rectified sine wave. Applications: AC-PWM, Peak Detector, Motor RPM Control.

FIG. 17F (MVC) shows that the Benistor is capable to process a rectified sine wave by outputting a "Maxim Voltage Control" wave which is perfectly synchronized with the original wave and located, consistently, in the middle of the rectified sine wave. Applications: AC-PWM, Light Control, Replacing Thyristor in Low/Med Power Applications.

FIG. 17G (ZVD) shows that the Benistor is capable to perform as a controller for ZVD circuit applications.

Comparison Note: NEWSYS is capable to perform all Benistor's "Stitching and Self-switching" mode of operation applications (i.e., reaching al the current/voltage graphs shapes shown in FIG. 17).

Additionally, NEWSYS internal system architecture is much more complex than the Benistor's one (i.e., the Benistor has been design to be just a simple "valve" like a "multiterminals transistor, included in future IC systems) which allows for less external parts, smaller size and lower cost in most of the "complex circuits", which may require 10-20 Benistors, for performing, safely, the same job.

Therefore, a need exists for an Low Cost Ultra Versatile Mixed Signal Controller Circuit which is affordable, reliable, efficient, low sized, simple in design, allows for less external parts, is capable to perform all the applications presented above and additionally, many more applications that none of the above presented devices is capable to perform.

SUMMARY OF THE INVENTION

13. Brief Summary

Accordingly, the present invention is directed to an Low Cost Ultra Versatile Mixed Signal Controller Circuit, including novel methods, systems and apparatuses that substantially reduce one or more of the problems due to limitations and disadvantages of the related and/or prior art.

These related art circuit's limitations and/or disadvantages can be sensed in one or more of their technical and economical feature such as: Power Factor, Total Harmonic Distortions (THD), Efficiency (Eff), Performances, Simplicity in Design and Implementation, Circuit's Parts Count (LPC), Size, Weight, Working Temperature, Total Solution Cost, etc.

A high PF is needed, because as closed is the amount of this parameter to 1, as low is the loss in heat in an AC Generator Wiring Systems and more consumers can be connected to the same AC Buss Line.

A low THD is requested, because as low is the amount of this parameter, as low is the electrical noise introduced by each Complex Load System (such as computers, monitors, printers, copiers, TV sets, etc.) back into the AC Buss Line.

A high Eff. is important, because as closed is the amount of this parameter to 100%, as less un-needed heat (because of the electrical devices' dissipation) attached to computers, monitors or any other electronic units, is included in the consumers' monthly electrical bill.

The Controller IC's Performances reflects the value of the entire PFC Circuit, however its cost depends of its internal complexity and pins count (typically 8, 14 or 16 pin standard packaging). For about $1/unit the 8 pin IC configurations, having less than 15 extra parts included in the related circuit, are now the most appreciated PFC IC Controllers.

The Simplicity in Design and Implementation aspect is important for giving equal chances of production to large and small manufacturers, for up grading their existing products. In other words, the best novel product is not the one which has fantastic performances, however each new specific custom design requests a few months of computer simulations plus bench prototyping process and more than that, only 2 or 3 Hi-Tech manufactures (in the entire world) are capable to provide the main circuit's components or sub-ensembles.

A low CPC is essential for decreasing the unit production cost (i.e., fewer devices in the assembling, soldering and testing process) and for increasing the reliability of the entire circuit (less parts—lower failures chances).

Lower size and weight are essential features not only for end users' advantages but also for significant worldwide transportation's cost savings.

Lower working temperature means better safety and reliability, less size and in some situations a significant cost savings, since most of low (or reasonable) cost parts' ambient working temperature is limited to a maximum of 70*C. Over this temperature threshold, most of the electronic parts' (such as Integrated Circuits, transistors, resistors, capacitors, diodes and coils' cores) may double their cost.

The reduction of the Entire Circuit's Cost is an imperative, because these PFC circuits will be introduced (sooner or later) in all power supplies that may represent a threat for the safety of the electrical buss lines and the production of such power supplies exceeds already one hundred million units/year, worldwide.

Decreasing any one or more of the parts count, the size of the inductor, the MOSFET's aluminum heat sink, the working temperature and/or the Controller IC complexity can achieve a lower cost/circuit without altering the circuit's performances.

Recently, new and much (6-10 times) more efficient light sources have been introduced in the worldwide market, respectively the Ultra Bright White LED bulbs.

According to all prognoses, these LEDs (Light Emitting Diodes) are going to replace all the existing Incandescent, Halogen, Sodium, and Fluorescent bulbs during the next 5-10 years.

It is true that 10 W LED Light could be equivalent with 60 W Incandescent Light, and after the replacement of Hundred of Millions Bulbs, the save of electrical energy will be huge, eliminating the need for over 100 Medium Size Thermocentrals, at the country level.

However, when these new and very efficient 10 W LED Lamps will reach Hundred of Millions amount, in day by day use and split all over the country, a poor Power Factor (typically 0.65 now) and High A.THD (typically 75% now) may create a so strong (i.e., the cumulative effect) "static noise" that all Private, Governmental, Business, Satellite and Internet telecommunications will be seriously affected.

Since the main objective of this patent application is to provide a Low Cost Ultra Versatile Mixed Signal Controller Circuit, all the above exposed items represent the present invention new circuit's (NEWSYS') targets for improvements, upgrades and cost reducing.

In order to prove the present inventions' (NEWSYS') high performances under low cost, several circuit embodiments will be further fully described, as systems, subsystems and/or related systems of a Low Cost Ultra Versatile Mixed Signal Controller Circuit, the main subject of the present invention.

14. Objects of the Invention

It is an object of the present invention to provide a new Low Cost Ultra Versatile Mixed Signal Controller Circuit (NEWSYS) having a novel internal system architecture and/or novel functional blocks that allow for an improved reliability, better performances and high versatility in performing many applications with less parts count and lower cost.

It is another object of the present invention to provide a new Low Cost Ultra Versatile Mixed Signal Controller Circuit (NEWSYS) including in its internal system architecture, besides the typical PWM functional blocks, a novel Oscillator block featuring significant improvements in respect to the classic Oscillator blocks.

It is yet another object of the present invention to provide a new Low Cost Ultra Versatile Mixed Signal Controller Circuit (NEWSYS) including in its internal system architecture, besides the typical PWM functional blocks, a novel Sync Voltage Ramp Driver block featuring significant improvements in respect to the classic Voltage Ramp blocks.

It is still another object of the present invention to provide a new Low Cost Ultra Versatile Mixed Signal Controller Circuit (NEWSYS) including in its internal system architecture, besides the typical PWM functional blocks, a novel Sync Current Spikes Filter block featuring significant improvements in respect to the classic Current Spikes Filter blocks.

It is also an object of the present invention to provide a new Low Cost Ultra Versatile Mixed Signal Controller Circuit (NEWSYS) including in its internal system architecture, besides the typical PWM functional blocks, a novel Sync Soft Start block featuring significant improvements in respect to the classic Soft Start blocks.

It is yet an object of the present invention to provide a new Low Cost Ultra Versatile Mixed Signal Controller Circuit (NEWSYS) including in its internal system architecture, besides the typical PWM functional blocks, a novel Sync Pulse Width Modulation Comparator block featuring significant improvements in respect to the classic Pulse Width Modulation Comparator blocks.

It is another object of the present invention to provide a new Low Cost Ultra Versatile Mixed Signal Controller Circuit (NEWSYS) including in its internal system architecture, besides the typical PWM functional blocks, a novel Sync Pulse Width Modulation Logic block featuring significant improvements in respect to the classic Pulse Width Modulation Logic blocks.

It is also another object of the present invention to provide a new Low Cost Ultra Versatile Mixed Signal Controller Circuit (NEWSYS) including in its internal system architecture, besides the typical PWM functional blocks, a novel Sync Master Switch System block that substantially improve the entire controller performances.

It is another object of the present invention to provide a new Low Cost Ultra Versatile Mixed Signal Controller Circuit (NEWSYS) able to supersede circuits, such as the "555 Timer" Controller Circuit in many typical applications with solutions providing less parts count, lower cost and "state of the art" performance.

It is also an object of the present invention to provide a new Low Cost Ultra Versatile Mixed Signal Controller Circuit (NEWSYS) able to supersede circuits, such as the "UC3842" PWM Controller Circuit in many typical applications with solutions providing less parts count, lower cost and "state of the art" performance.

It is still an object of the present invention to provide a new Low Cost Ultra Versatile Mixed Signal Controller Circuit (NEWSYS) able to supersede circuits, such as the "MC33260" PFC Control Circuits in many typical applications with solutions providing less parts count, lower cost and "state of the art" performance.

It is yet an object of the present invention to provide a new Low Cost Ultra Versatile Mixed Signal Controller Circuit (NEWSYS) able to replace circuits, such as the "555 Timer" in the "PCSD PFC" circuits with solutions providing higher reliability, less parts count, lower cost and "state of the art" performance.

It is also an object of the present invention to provide a new Low Cost Ultra Versatile Mixed Signal Controller Circuit (NEWSYS) able to drive high power buffers, such as Thyristors in a classic or ZVD mode of operations, with solutions providing less parts count, lower cost and "state of the art" performance.

It is still another object of the present invention to provide a new Low Cost Ultra Versatile Mixed Signal Controller Circuit (NEWSYS) able to drive buffers, such as Bipolar, MOSFET or IGBT Transistors in the Thyristor way or ZVD mode of operations, with solutions providing less parts count, lower cost and "state of the art" performance.

It is also another object of the present invention to provide a new Low Ultra Versatile Mixed Signal Controller Circuit (NEWSYS) able to drive Bipolar, MOSFET or IGBT Transistors and/or Thyristor in the "Benistor" way, with solutions providing fewer parts count, lower cost and "state of the art" performance.

It is yet an object of the present invention to provide a new Low Ultra Versatile Mixed Signal Controller Circuit (NEWSYS) Bistable Circuit Apparatus Embodiment.

It is another object of the present invention to provide a new Low Ultra Versatile Mixed Signal Controller Circuit (NEWSYS) Monostable Circuit Apparatus Embodiment.

It is also another object of the present invention to provide a new Low Ultra Versatile Mixed Signal Controller Circuit (NEWSYS) Astable Circuit Apparatus Embodiment.

It is still another object of the present invention to provide a new Low Ultra Versatile Mixed Signal Controller Circuit (NEWSYS) Intruder Alarm Circuit Apparatus Embodiment.

It is also an object of the present invention to provide a new Low Ultra Versatile Mixed Signal Controller Circuit (NEWSYS) Battery Charger Circuit Apparatus Embodiment.

It is also another object of the present invention to provide a new Low Ultra Versatile Mixed Signal Controller Circuit (NEWSYS) Motor Controller Circuit Apparatus Embodiment.

It is still another object of the present invention to provide a new Low Ultra Versatile Mixed Signal Controller Circuit (NEWSYS) Thyristor (SCR) Control Circuit Apparatus Embodiment.

It is yet another object of the present invention to provide a new Low Ultra Versatile Mixed Signal Controller Circuit (NEWSYS) SCR-ZVD Control Circuit Apparatus Embodiment.

It is also an object of the present invention to provide a new Low Ultra Versatile Mixed Signal Controller Circuit (NEWSYS) Benistor MVC-EVC Control Circuit Apparatus Embodiment.

It is another object of the present invention to provide a new Low Ultra Versatile Mixed Signal Controller Circuit (NEWSYS) Benistor ZVD Temperature Control Circuit Apparatus Embodiment.

It is also another object of the present invention to provide a new Low Ultra Versatile Mixed Signal Controller Circuit (NEWSYS) Boost Converter Circuit Apparatus Embodiment.

To achieve these and other advantages, and in accordance with the purpose of the present invention, as embodied and broadly described herein, the present invention is a Low Cost Ultra Versatile Mixed Signal Controller Circuit (NEWSYS) which generically includes all the classic block included in the "555 Timer" and the "UCx38x" Fix Frequency Current Mode PWM Controller plus several other novel functional block that confer NEWSYS the necessarily versatility and capability to perform all the above mentioned applications, providing fewer parts count, lower cost and "state of the art" performance.

BRIEF DESCRIPTION OF THE DRAWINGS 15.1 Prior Art Drawings

Figure 1:
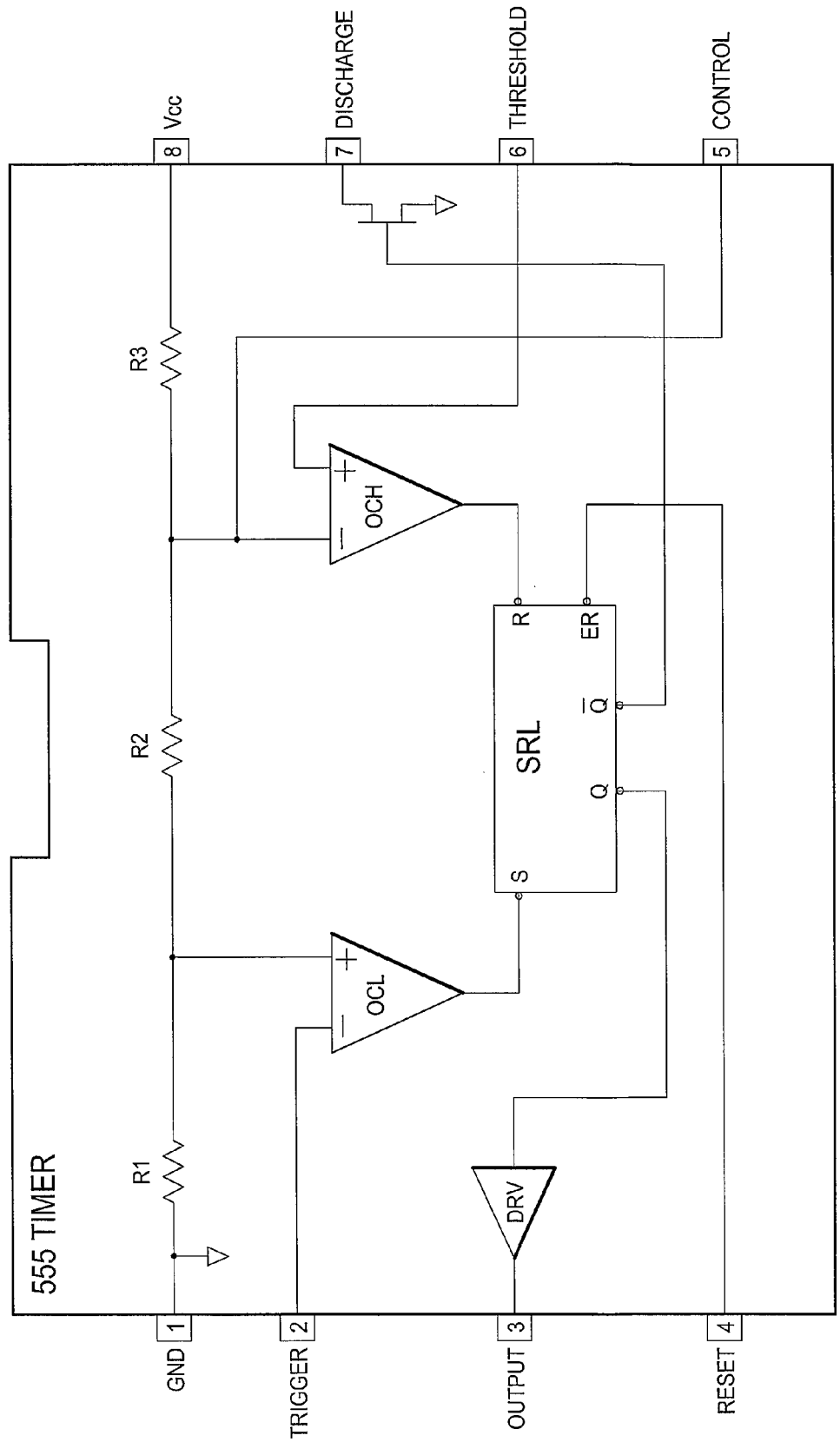

FIG. 1 is a classic Block Schematic Diagram of the 8 pin NE555 Timer control circuit comprising three resistors (R1, R2, R3), two comparators (OCL and OCH), a SR Latch (SRL), a Driver (DRV) and a Discharge Transistor (Td).

Figure 2:
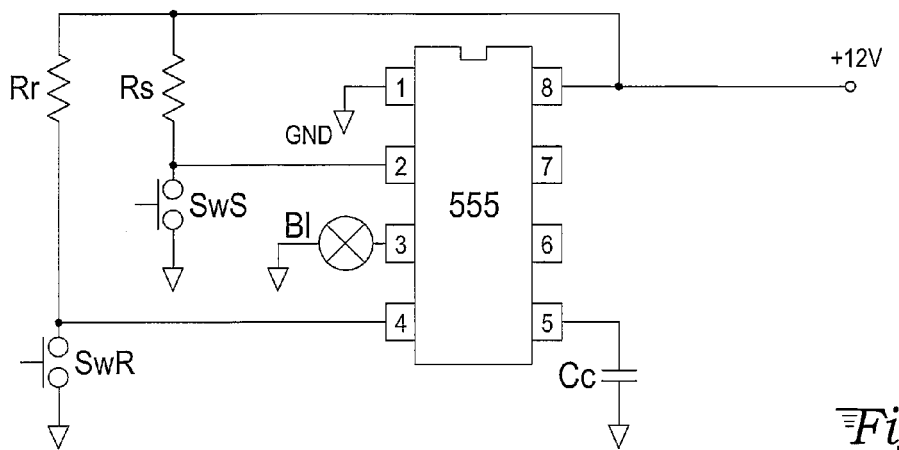

FIG. 2 is a typical Bistable circuit comprising a 555 Timer, two resistors (Rr, Rs), one capacitor (Cc), a set switch SwS, a reset switch SwR and a bulb Load Bl.

Figure 3:
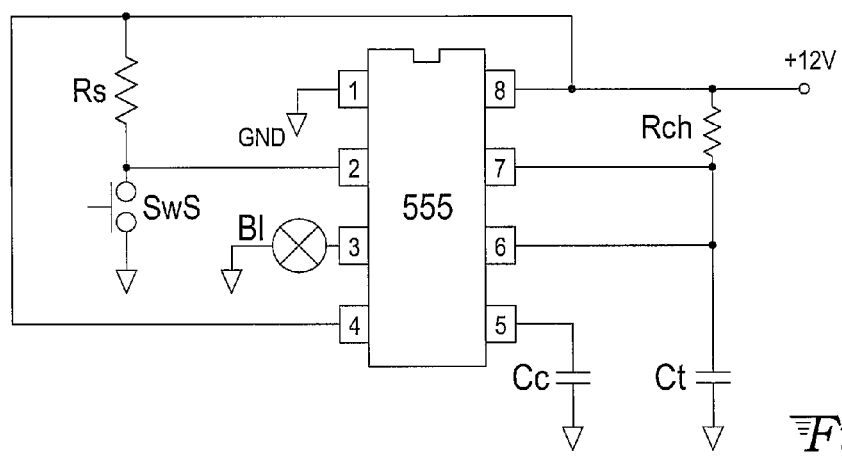

FIG. 3 is a typical Monostable circuit comprising a 555 Timer, two resistors (Rs, Rch), two capacitors (Cc, Ct), a set switch SwS and a bulb Load Bl.

Figure 4:
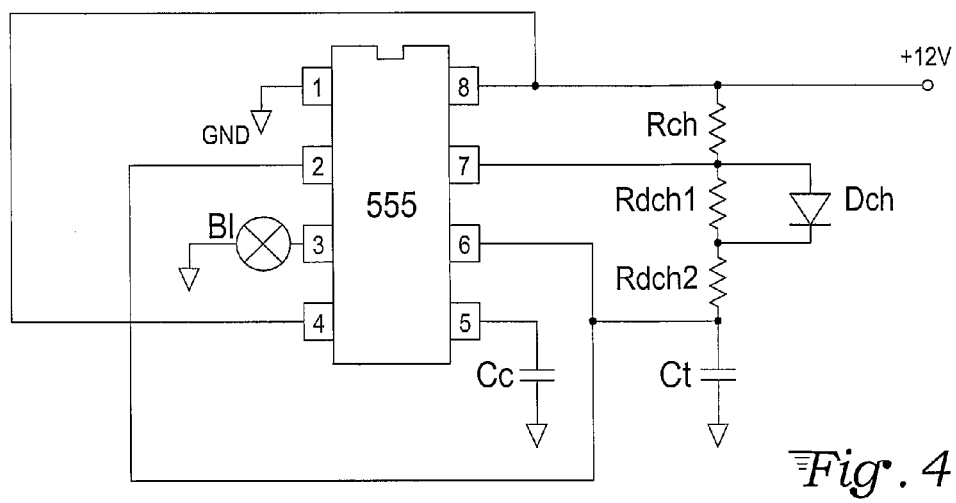

FIG. 4 is a typical Astable circuit comprising a 555 Timer, three resistors (Rch, Rch1, Rch2), two capacitors (Cc, Ct), a diode Dch and bulb Load Bl.

Figure 5:
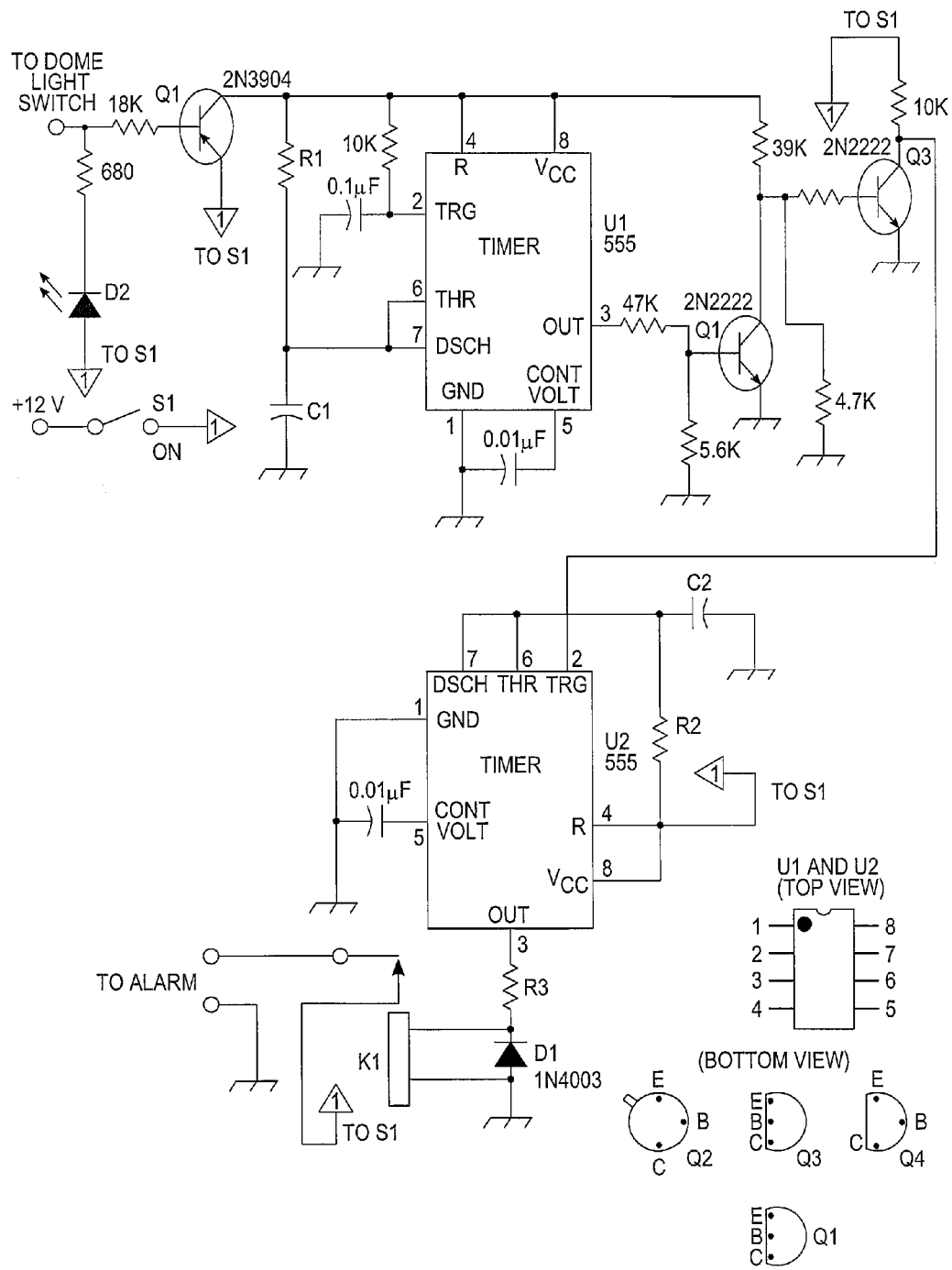

FIG. 5 is a Automotive Burglar Alarm circuit presented in the Encyclopedia of Electronic Circuits, Vol. 1, Page 3 comprising two 555 Timer circuits, three transistors, twelve resistors, five capacitors, two diodes and one relay.

Figure 6:
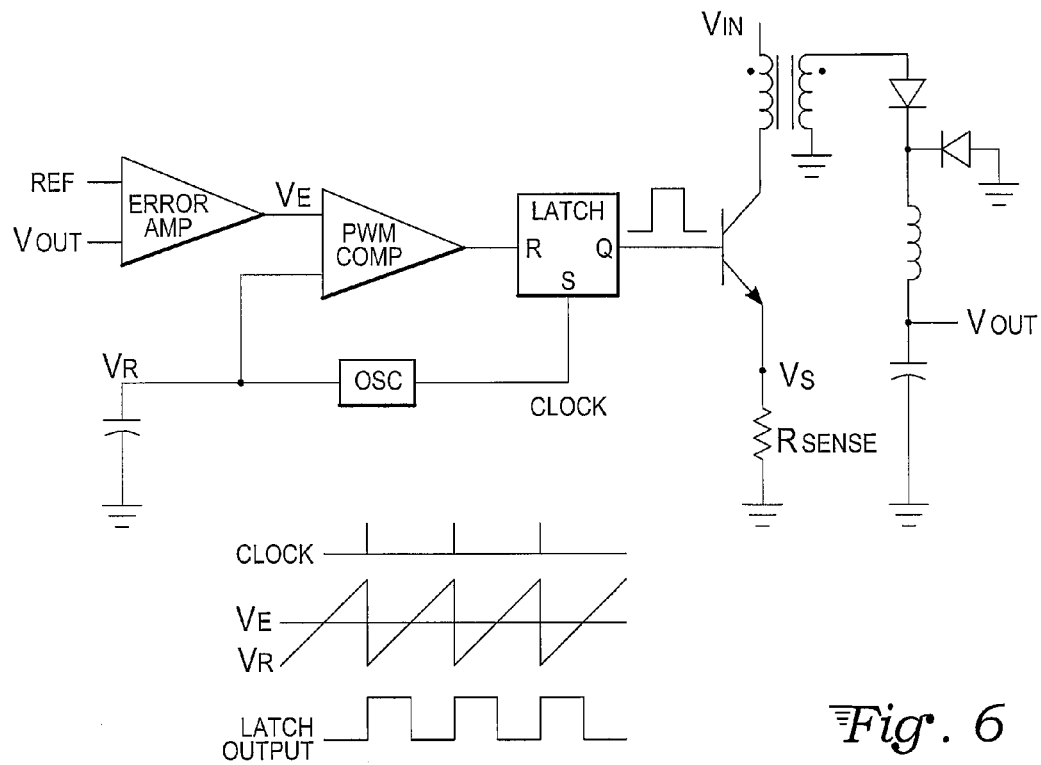

FIG. 6 is a classic Voltage Mode PWM System including a first drawing illustrating schematic diagram comprising an Error Amplifier, a PWM Comparator, an RS Latch, an oscillator (OSC) an NPN transistor, a sense Resistor, two capacitors, two diodes, a coil and a transformer and second drawing illustrating the typical PWM waveform graphs.

Figure 7:
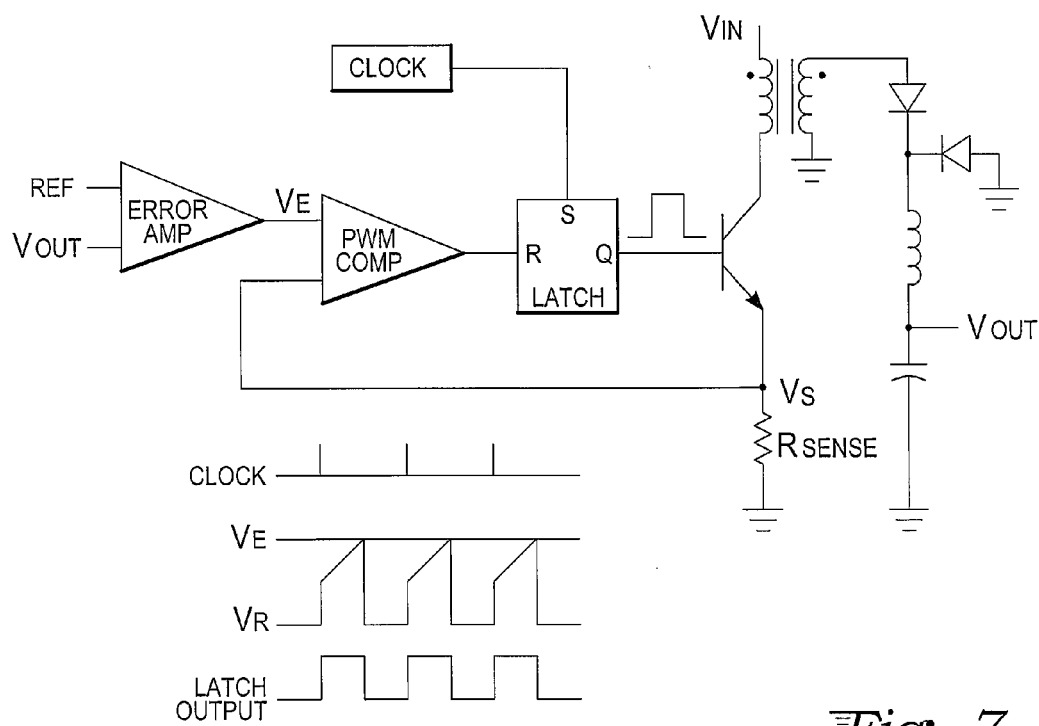

FIG. 7 is a classic Current Mode PWM System including a first drawing illustrating schematic diagram comprising an Error Amplifier, a PWM Comparator, an RS Latch, an oscillator (OSC) an NPN transistor, a sense Resistor, one capacitor, two diodes, a coil and a transformer and second drawing illustrating the typical PWM waveform graphs.

Figure 8:
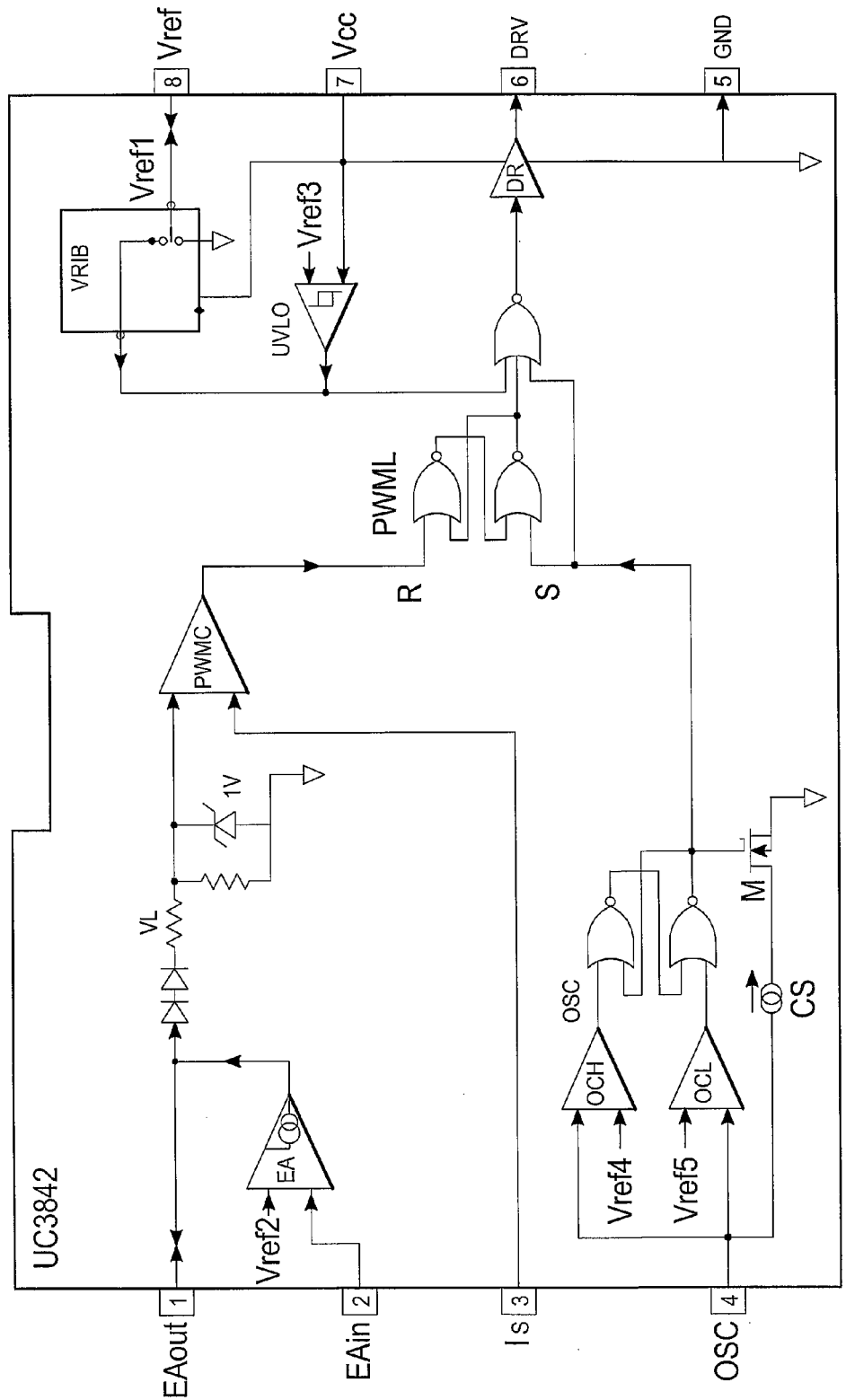

FIG. 8 is a typical UC3842 Block Schematic Diagram comprising an Error Amplifier (EA) a "two diodes two resistors one zener diode" voltage limiter (VL), a comparator (PWMC), a "two comparators two NOR gates one MOSFET transistor (M) one constant current sink" oscillator (OSC), a three NOR gates PWM logic circuit (PWML), a driver (DR), a Schmitt Trigger (UVLO) and a voltage reference block VRIB.

Figure 9:
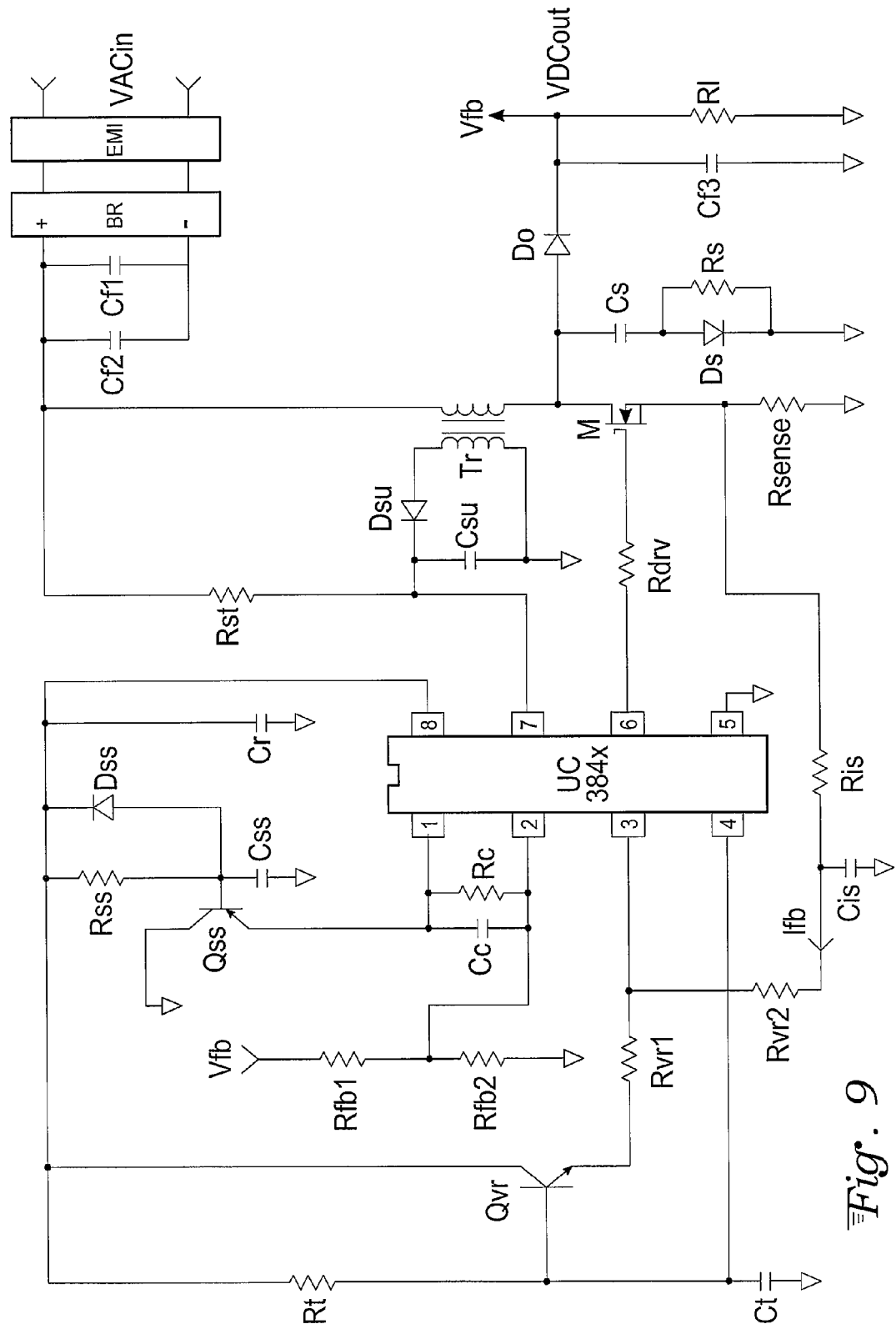

FIG. 9 is a generic AC/DC Converter Schematic Diagram comprising a UC384x, a bridge rectifier block (BR), a input filter block (EMI), one PNP transistor (Qss), one NPN transistor (Qvr), one MOSFET transistor (M), one transformer (Tr), thirteen resistors, nine capacitors and four diodes.

Figure 10A:
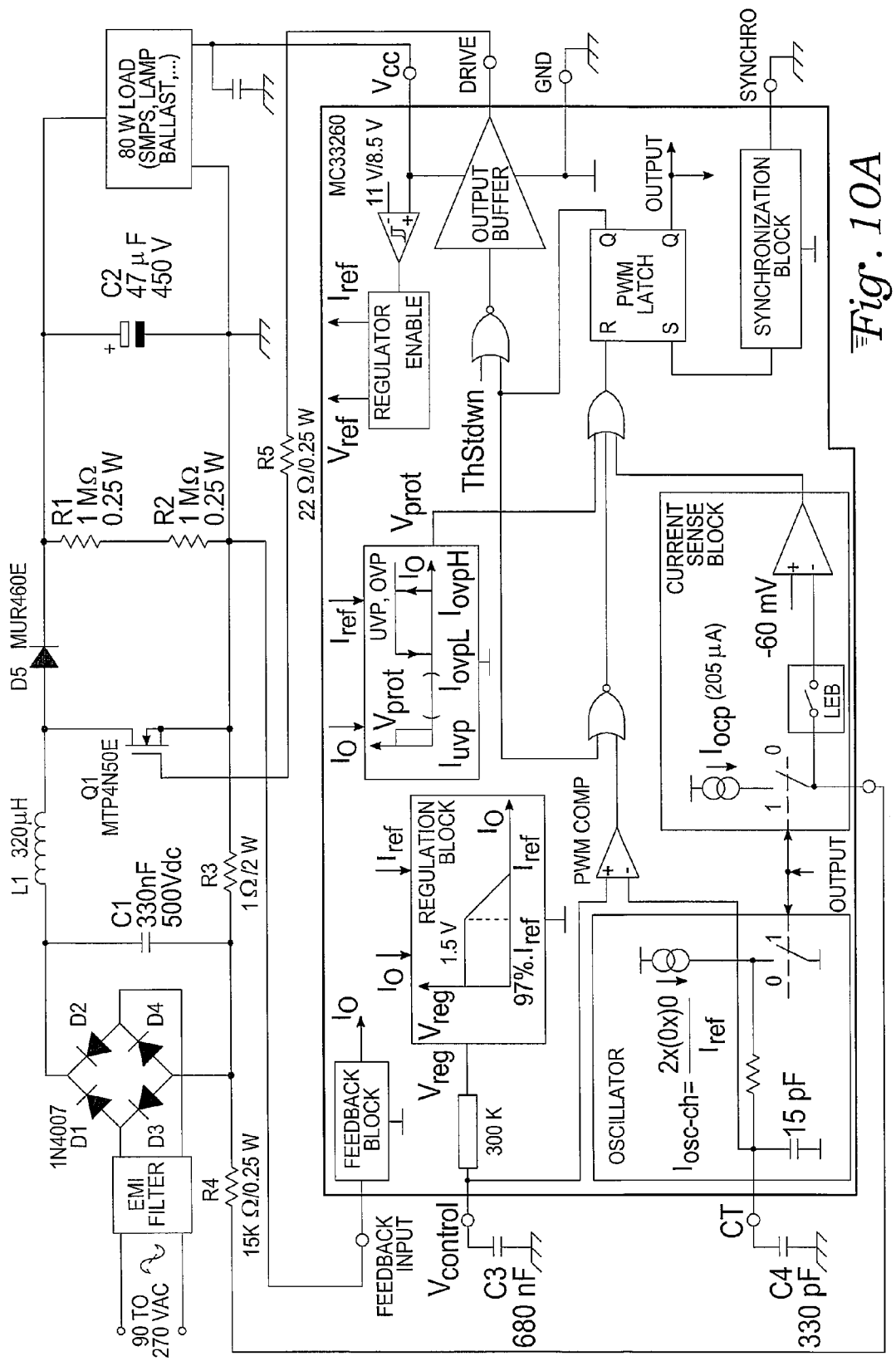

FIG. 10 is a Low Cost Power Factor Correction Circuit Solution showing the ON Semiconductor's MC33260 PFC circuit diagram and its Test Data chart.

Figure 11A:
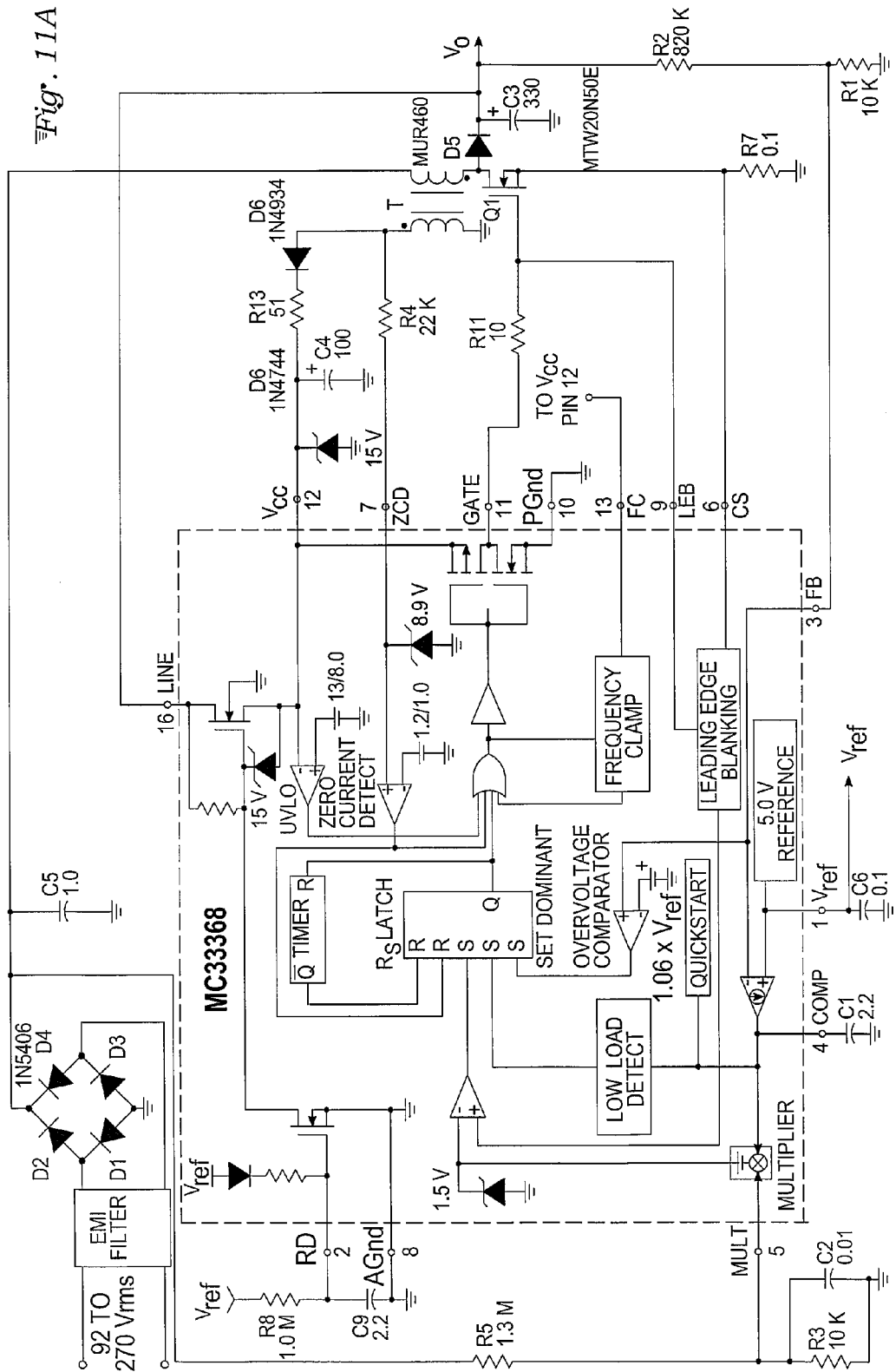

FIG. 11 is a High Performance Power Factor Correction Circuit Solution showing the ON Semiconductor's MC33368 PFC circuit diagram and its Test Data chart.

Figure 12:
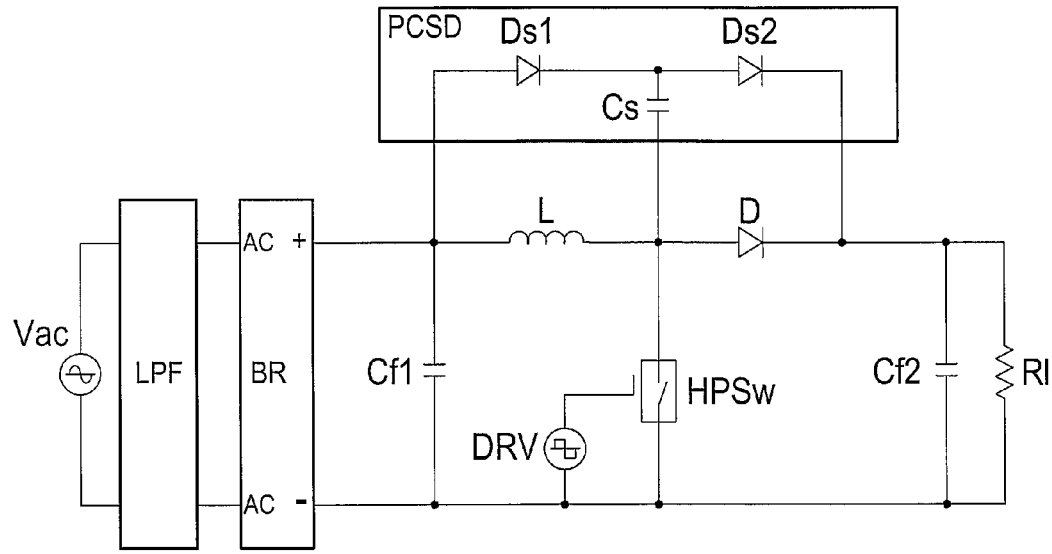
FIG. 12 illustrates a typical minimum-parts PCSD Boost Converter System.

FIG. 12 is a Parallel Charge-Series Discharge (PCSD) PFC circuit schematic diagram introduced by the U.S. Pat. No. 6,465,990/Oct. 15, 2002—Acatrinei et al., comprising an alternative current generator Vac, a low pass filter LPF, a bridge rectifier BR, three capacitors CF1, CF2 and Cs, three diodes D, Ds1 and Ds2, a coil L, a resistive load Rl and a square wave generator DRV.

Figure 13:
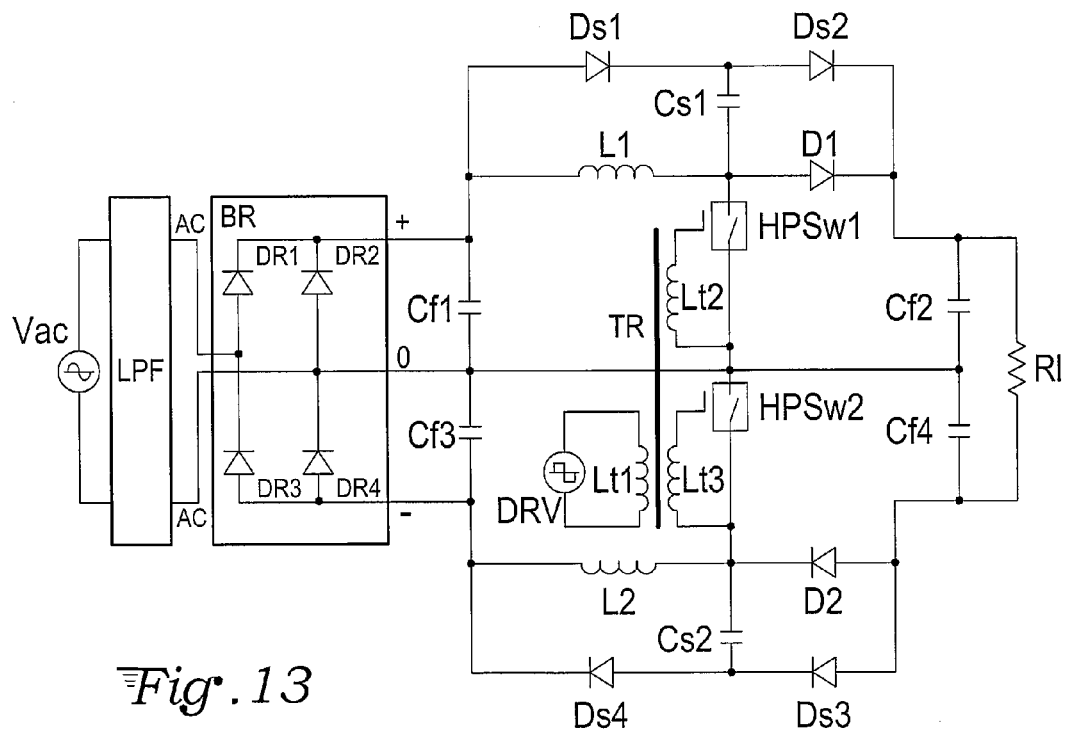
FIG. 13 illustrates a PCSD Voltage Doubler Boost Converter System, which uses the same concept, however, it is very efficient at small input AC voltage (i.e., 85-120 Vrms), being able to deliver up to 1 KW output power, with PF>0.99 and A.THD<5%.

FIG. 13 is a Parallel Charge-Series Discharge (PCSD) Voltage Doubler PFC circuit schematic diagram, also introduced by the U.S. Pat. No. 6,465,990/Oct. 15, 2002—Acatrinei et al., comprising, two times the parts presented in FIG. 12, coupled symmetrical via a high frequency transformer TR.

FIG. 14 is a typical SCR's Control Circuit Block Schematic diagram comprising an alternative current generator Vac, a bridge rectifier BR, a zero resistor Rz, a control pulse generator CPG, a phase control block FCC a multi-pulse driver block MPD a thyristor SCR and a bulb load Bl.

Figure 15:
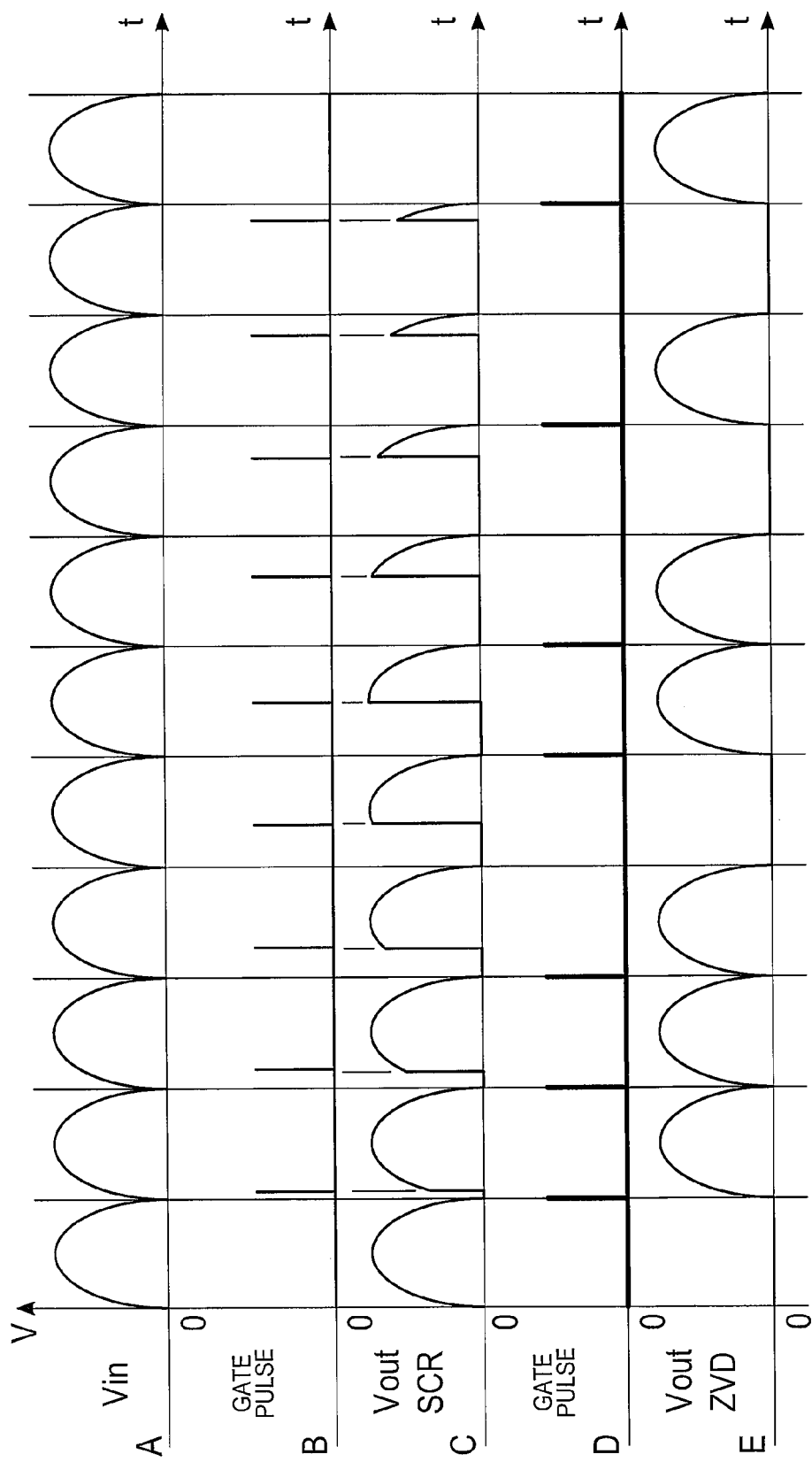

FIG. 15 is a SCR's Output Voltage/Current graphs chart illustrating the typical AC PWM and the ZVD way of controlling the output, function of the input voltage (Vin) and the gate pulse difference of faze.

FIG. 16 is a Benistor Test Fixture circuit diagram introduced by the U.S. Pat. No. 5,903,140/May 11, 1999—Acatrinei, comprising a BENISTOR controller circuit, an alternative current generator Vac, a bridge rectifier BR, four potentiometers, five capacitors, one diode (Dr), one zero resistor Rz, four 3 position (VDC, VPP, Vout) switches and a bulb load Bl.

Figure 17:
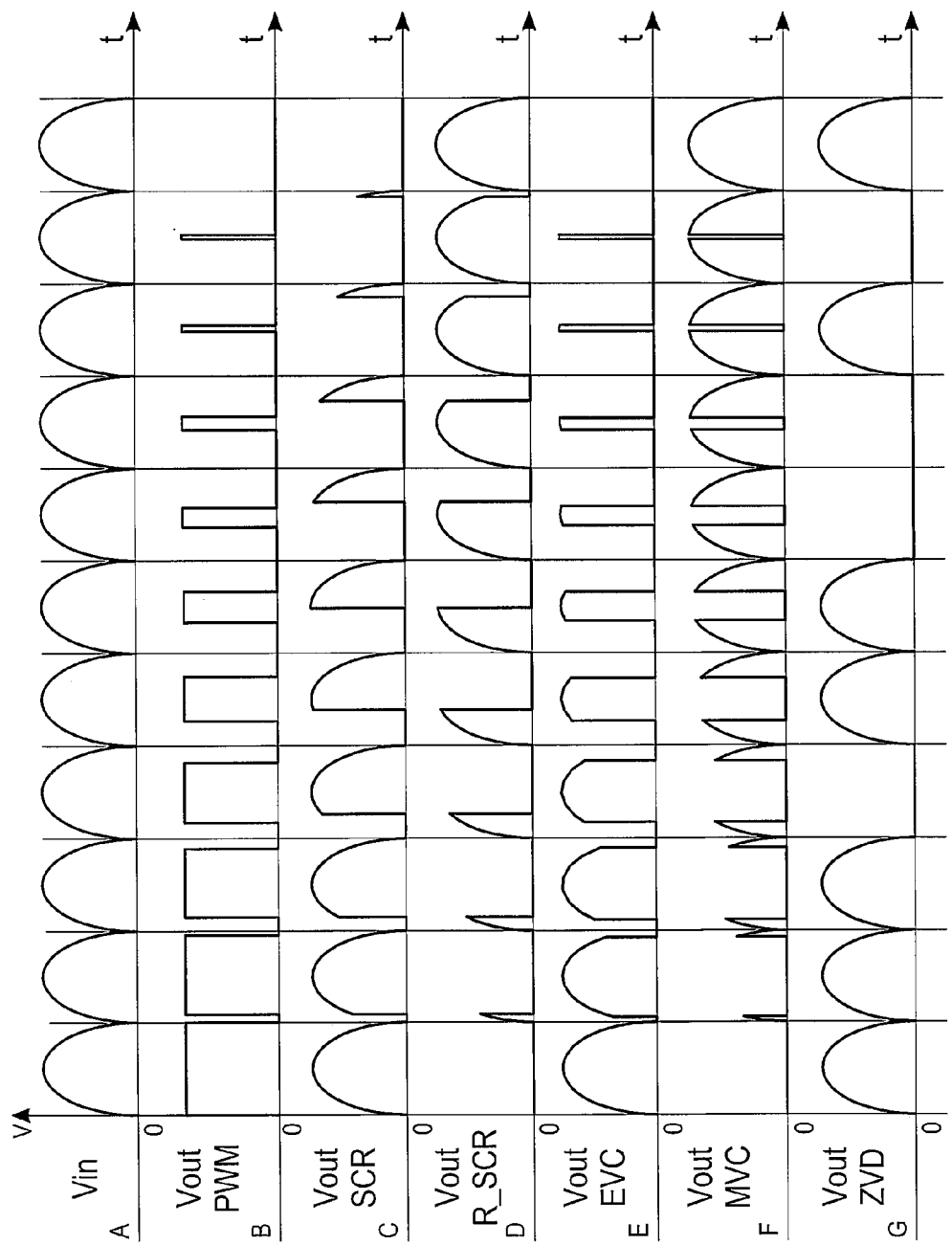
Figure 18A:
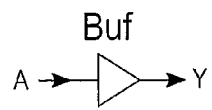
Figure 18B:
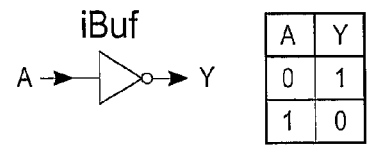
Figure 18C:
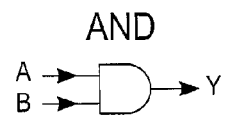
Figure 18D:
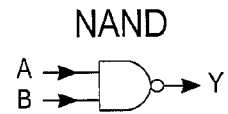
Figure 18E:
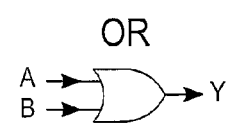
Figure 18F:
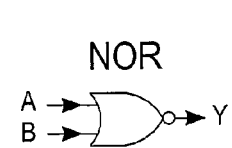
Figure 18G:
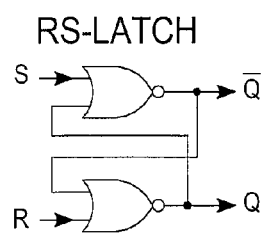
Figure 18G:
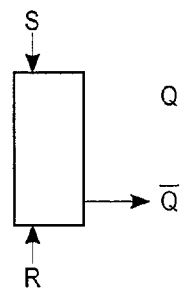
Figure 18H:
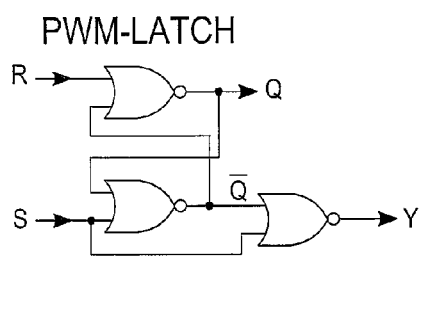
Figure 18H:
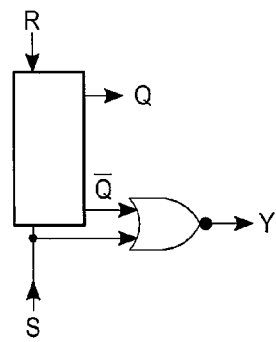

FIG. 17 is a Benistor's Output Current/Voltage Graphs chart showing the AC and the DC PWM control capability of this device connected like FIG. 16 illustrates.

FIG. 18 is a Logic Circuits Symbols and Truth Table chart illustrating the truth table of simple logic gates, as well as RS-Latch and PWM-Latch.

15.2 Embodiments Drawings

Figure 19:
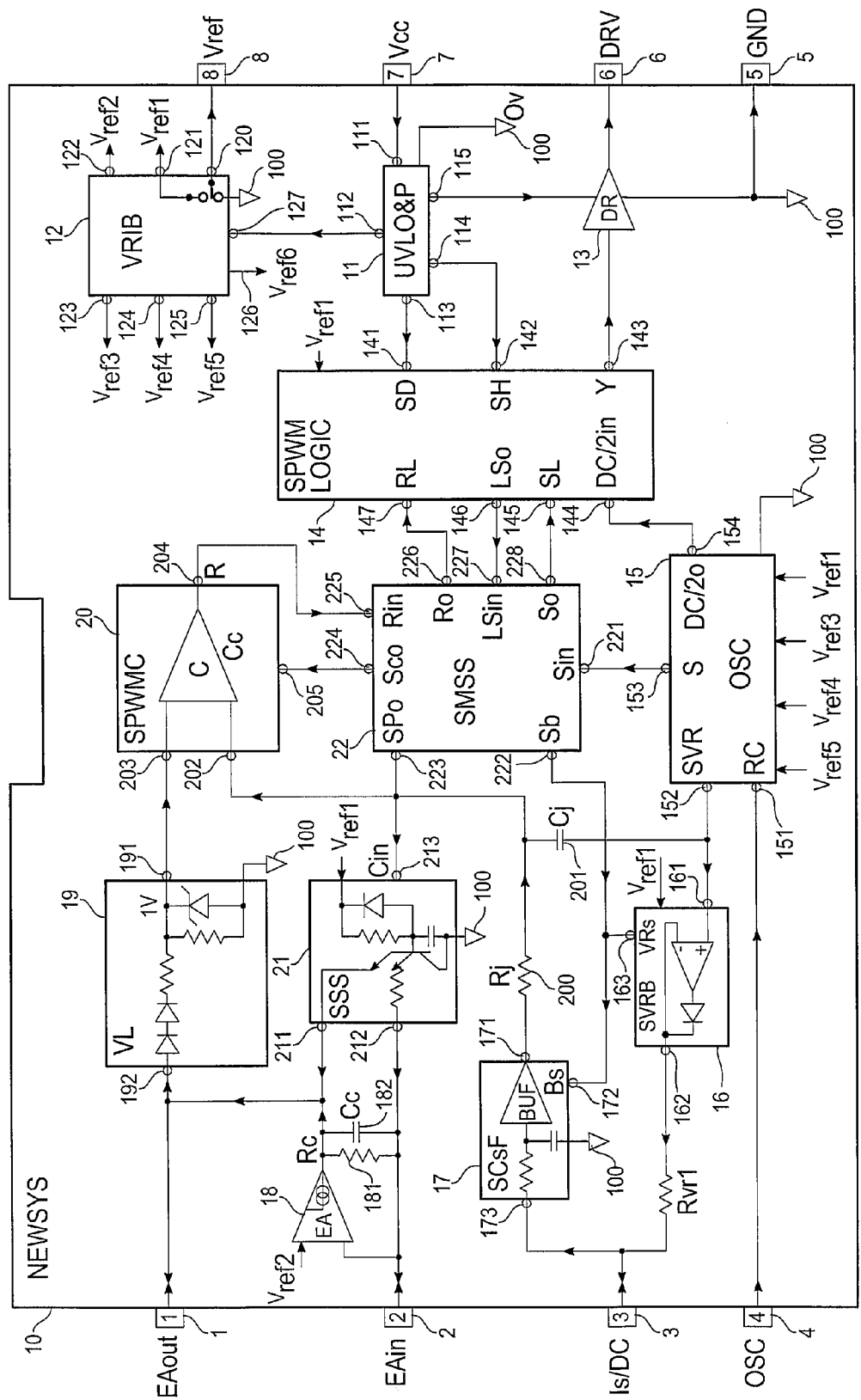

FIG. 19 is a generic block schematic of the novel controlling system and/or apparatus embodiment NEWSYS, comprising an Error Amplifier EA, a "two diodes two resistors one zener diode" voltage limiter (VL), a syncro-pulse width modulation comparator block SPWMC, an oscillator block OSC, a syncro-pulse with modulation logic block SPWM Logic, a driver (DR), a under voltage locked out and protection block UVLO&P, a voltage reference and internal bias block VRIB, a syncro-voltage ramp buffer block SVRB, a syncro-current spike filter block SCsF, a syncro-safe soft start block SSS and a syncro-mixed signal system block SMSS.

Figure 20:
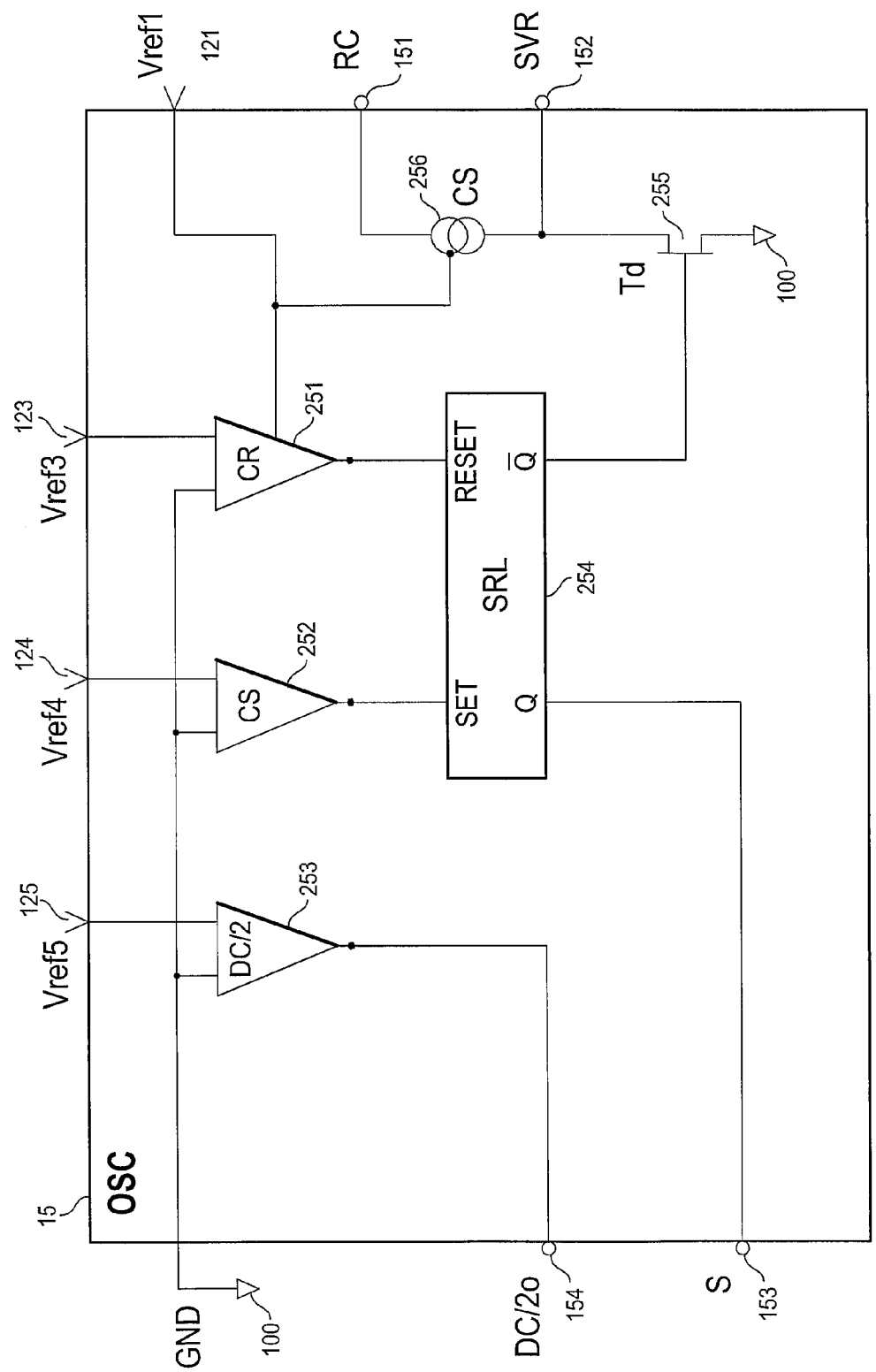

FIG. 20 is a block schematic of the NEWSYS oscillator apparatus embodiment, comprising three comparators (DC/2, CS and CR) one SR latch SRL, one discharge transistor (Td) and one constant current sink CS.

Figure 21:
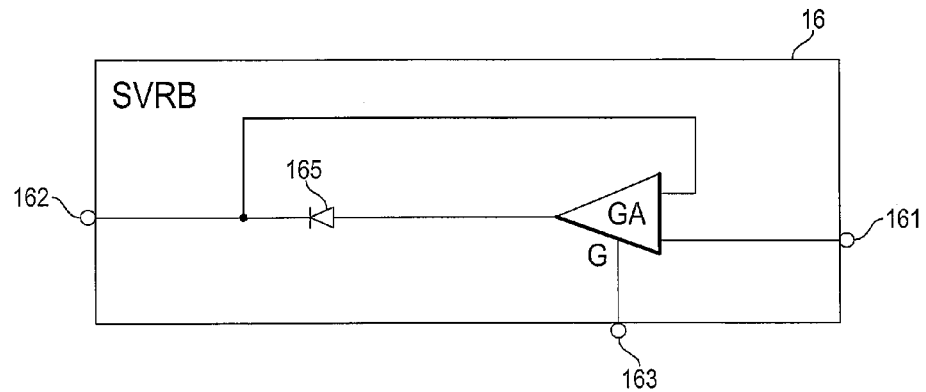

FIG. 21 is a first embodiment of the NEWSYS Syncro-Voltage Ramp Buffer (SVRB) internal functional block apparatus embodiment, comprising a diode and a gated amplifier GA.

Figure 22:
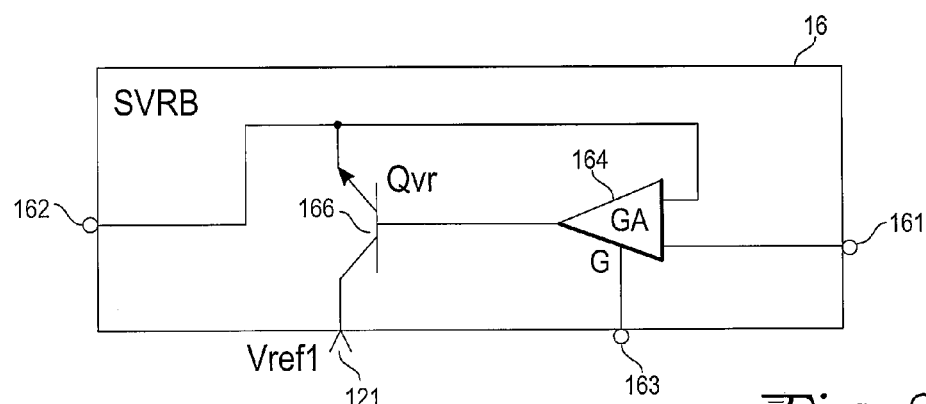

FIG. 22 is a second embodiment of the NEWSYS Syncro-Voltage Ramp Buffer (SVRB) internal functional block apparatus embodiment, comprising a transistor Qvr and a gated amplifier GA.

Figure 23:
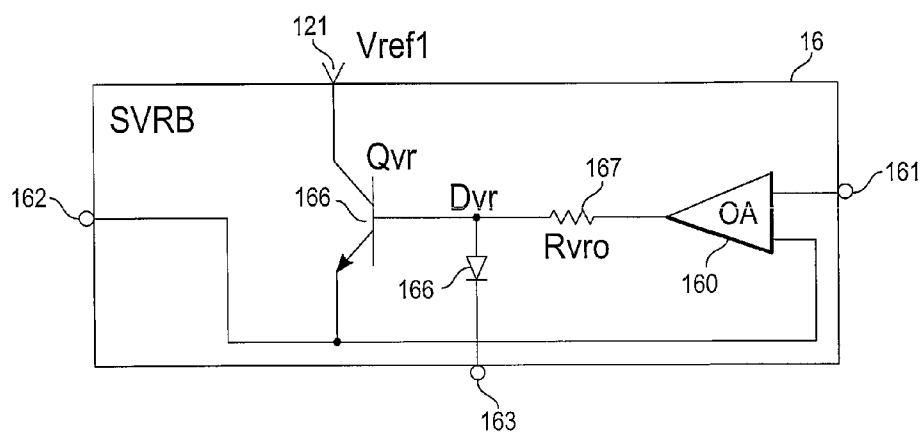

FIG. 23 is a third embodiment of the NEWSYS Syncro-Voltage Ramp Buffer (SVRB) internal functional block apparatus embodiment, comprising a transistor Qvr a diode Dvr, a resistor Rvro and an operational amplifier OA.

Figure 24:
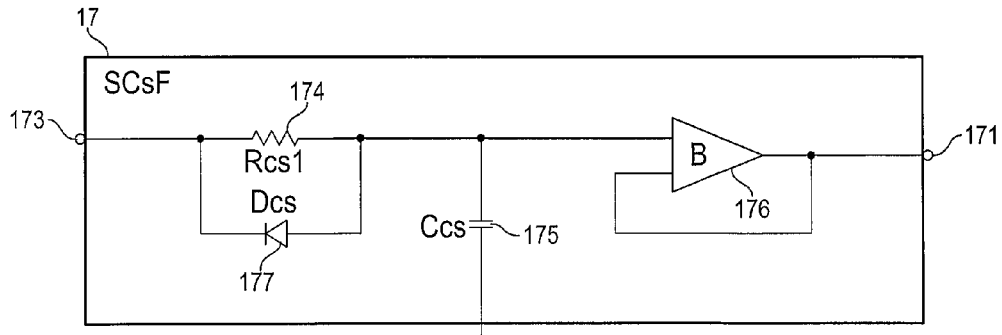

FIG. 24 is a first embodiment of the NEWSYS Syncro-Current Spike Filter (SCsF) internal functional block apparatus embodiment, comprising a diode Dcs a resistor Rcs1, a capacitor Ccs and buffer B.

Figure 25:
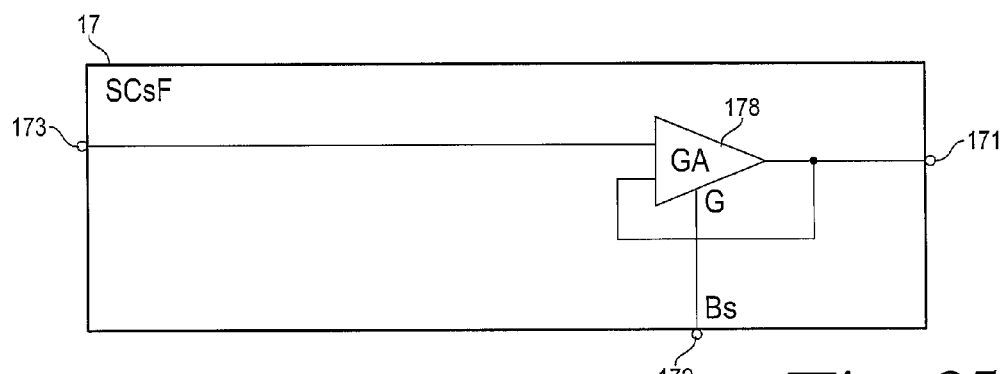

FIG. 25 is a second embodiment of the NEWSYS Syncro-Current Spike Filter (SCsF) internal functional block apparatus embodiment, comprising a gated amplifier GA only.

Figure 26:
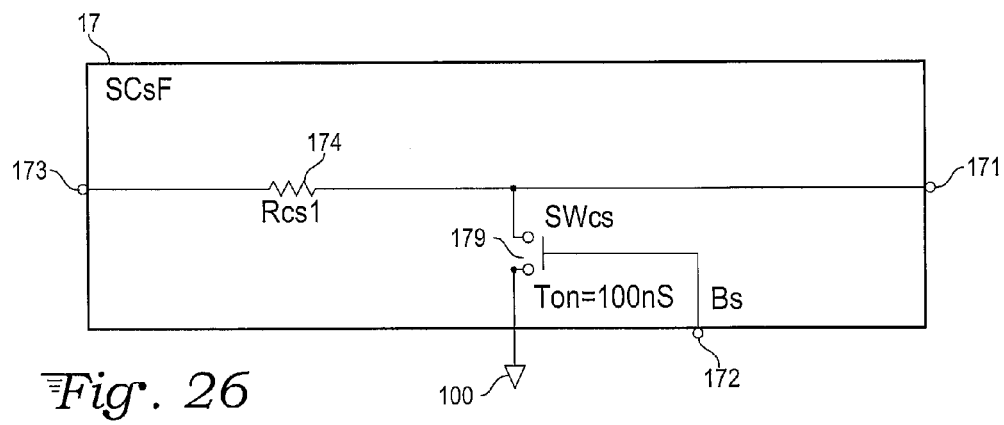

FIG. 26 is a third embodiment of the NEWSYS Syncro-Current Spike Filter (SCsF) internal functional block apparatus embodiment, comprising a resistor Rcs1 and a 100-nanoseconds ON switch SWcs.

Figure 27:
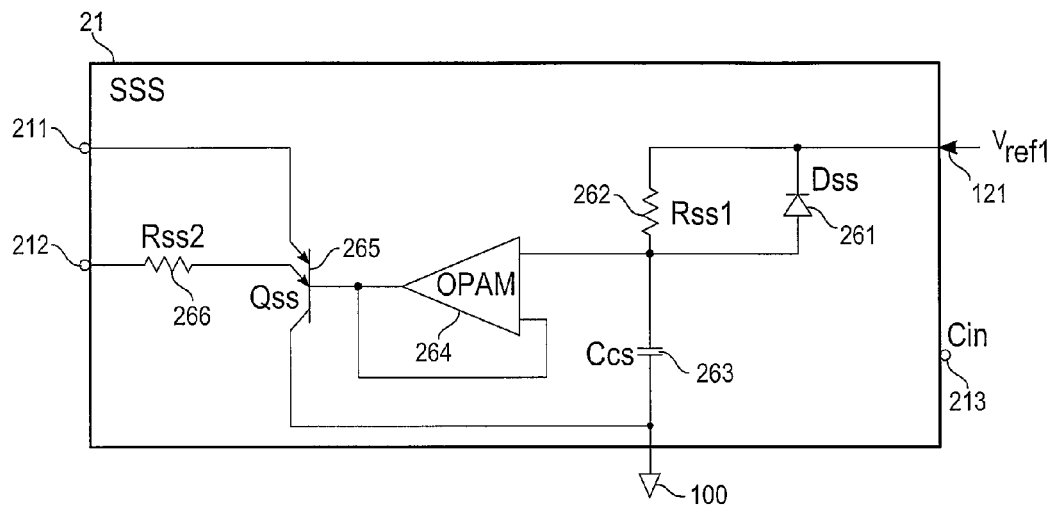

FIG. 27 is a first embodiment of the NEWSYS Safe Soft Start (SSS) internal functional block apparatus embodiment, comprising two resistors (Rss1, Rss2), a double emitter PNP transistor Qss, an operational amplifier OPAM, a capacitor Css and a diode Dss.

Figure 28:
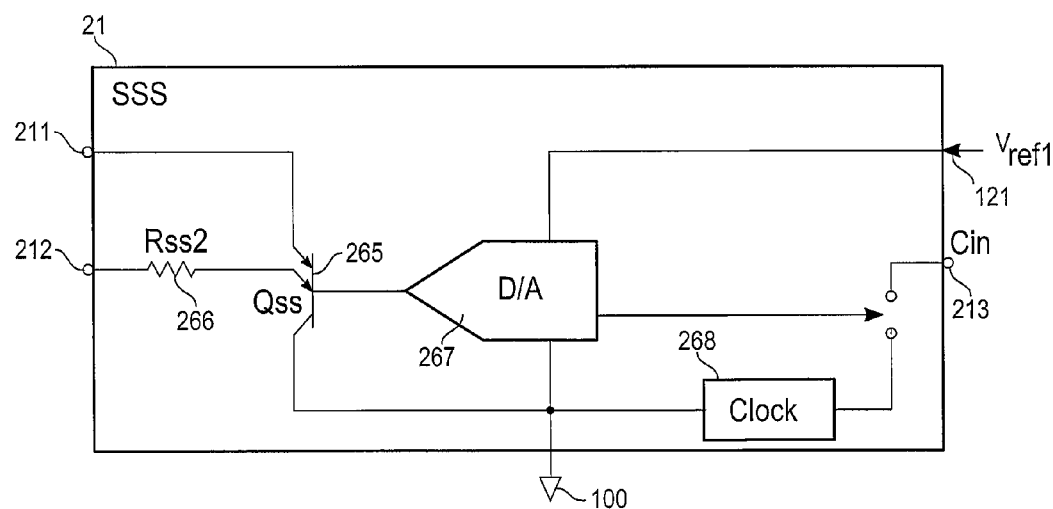

FIG. 28 is a second embodiment of the NEWSYS Safe Soft Start (SSS) internal functional block apparatus embodiment, comprising one resistor Rss2, a double emitter PNP transistor Qss, a digital to analog converter D/A, a two positions switch and a Clock.

Figure 29:
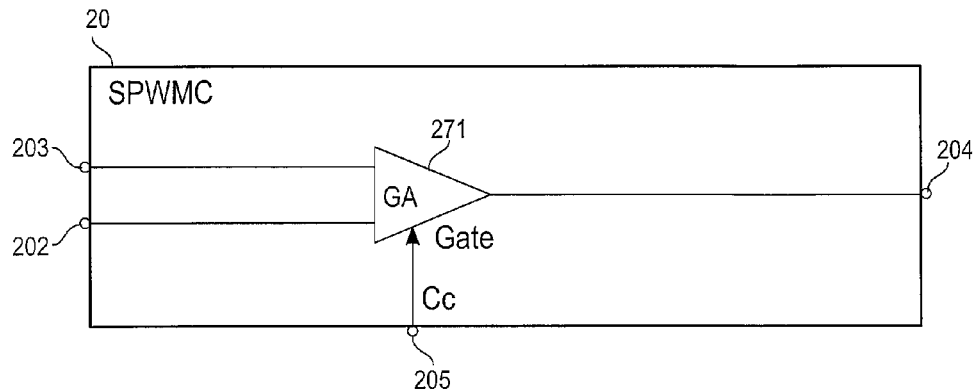

FIG. 29 is a first embodiment of the NEWSYS Syncro-Pulse Width Modulation Comparator (SPWMC) internal functional block apparatus embodiment, comprising a gated amplifier, GA, only.

Figure 30:
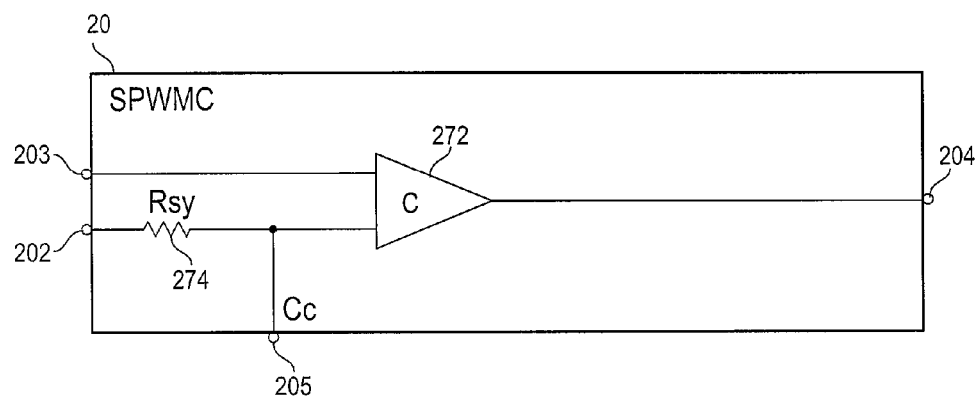

FIG. 30 is a second embodiment of the NEWSYS Syncro-Pulse Width Modulation Comparator (SPWMC) internal functional block apparatus embodiment, comprising a resistor Rsy and a comparator, C.

Figure 31:
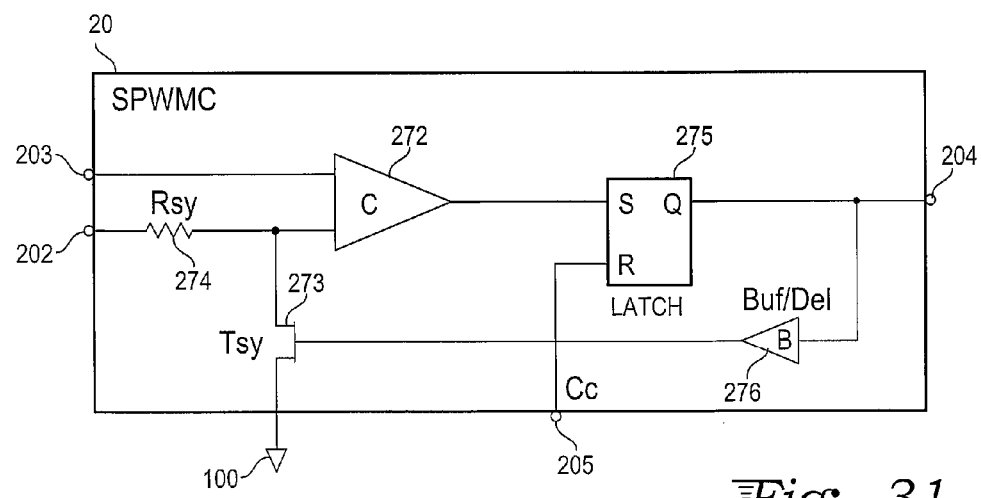

FIG. 31 is a third embodiment of the NEWSYS Syncro-Pulse Width Modulation Comparator (SPWMC) internal functional block apparatus embodiment, comprising a resistor Rsy, a transistor Tsy, a comparator C, an SR Latch and a buffer Buf/Del.

Figure 32:
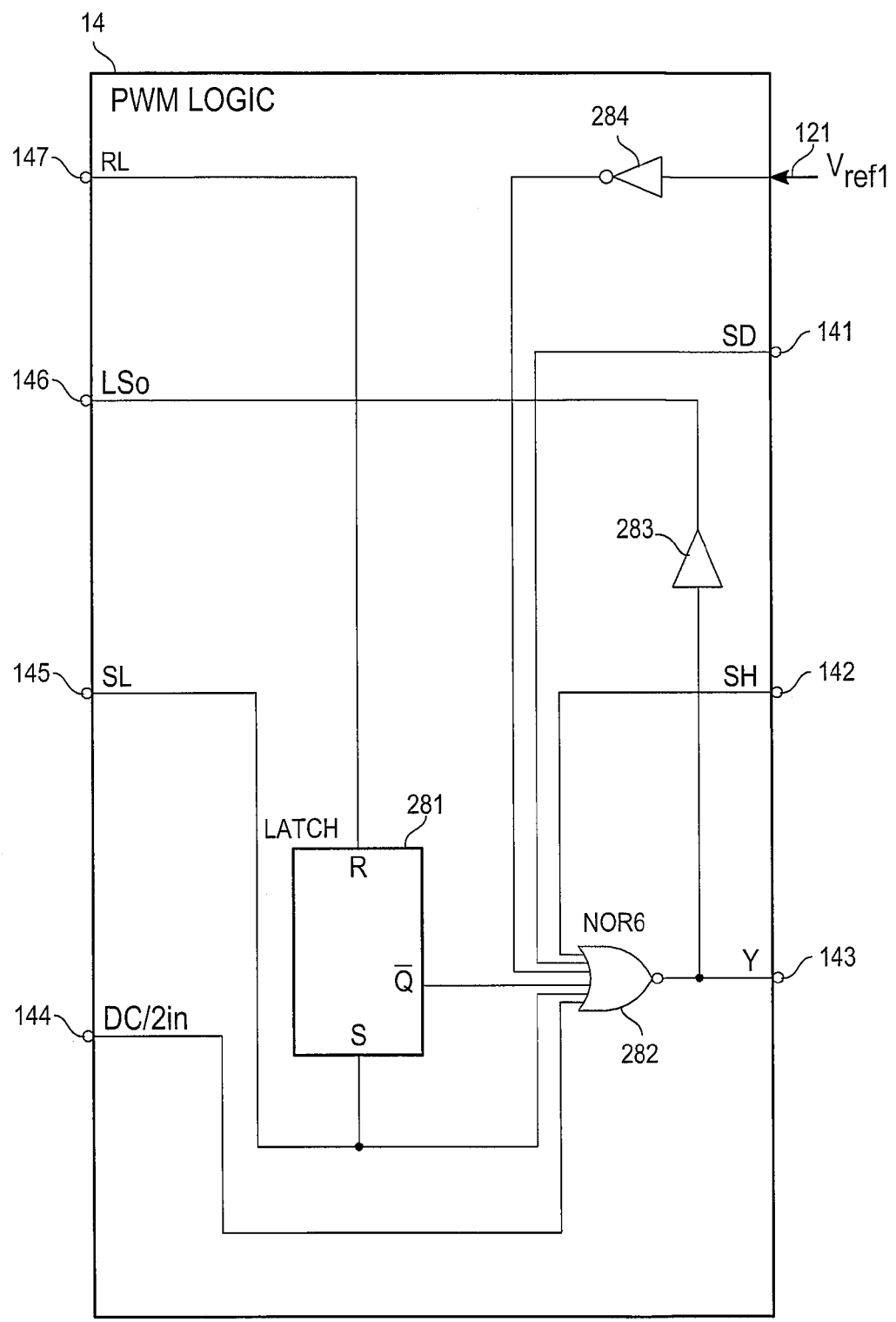

FIG. 32 is a first embodiment of the NEWSYS Pulse Width Modulation Logic (PWM Logic) internal functional block apparatus embodiment, comprising a Latch, a six inputs nor gate NOR6 an inverting buffer and a non-inverting buffer.

Figure 33:
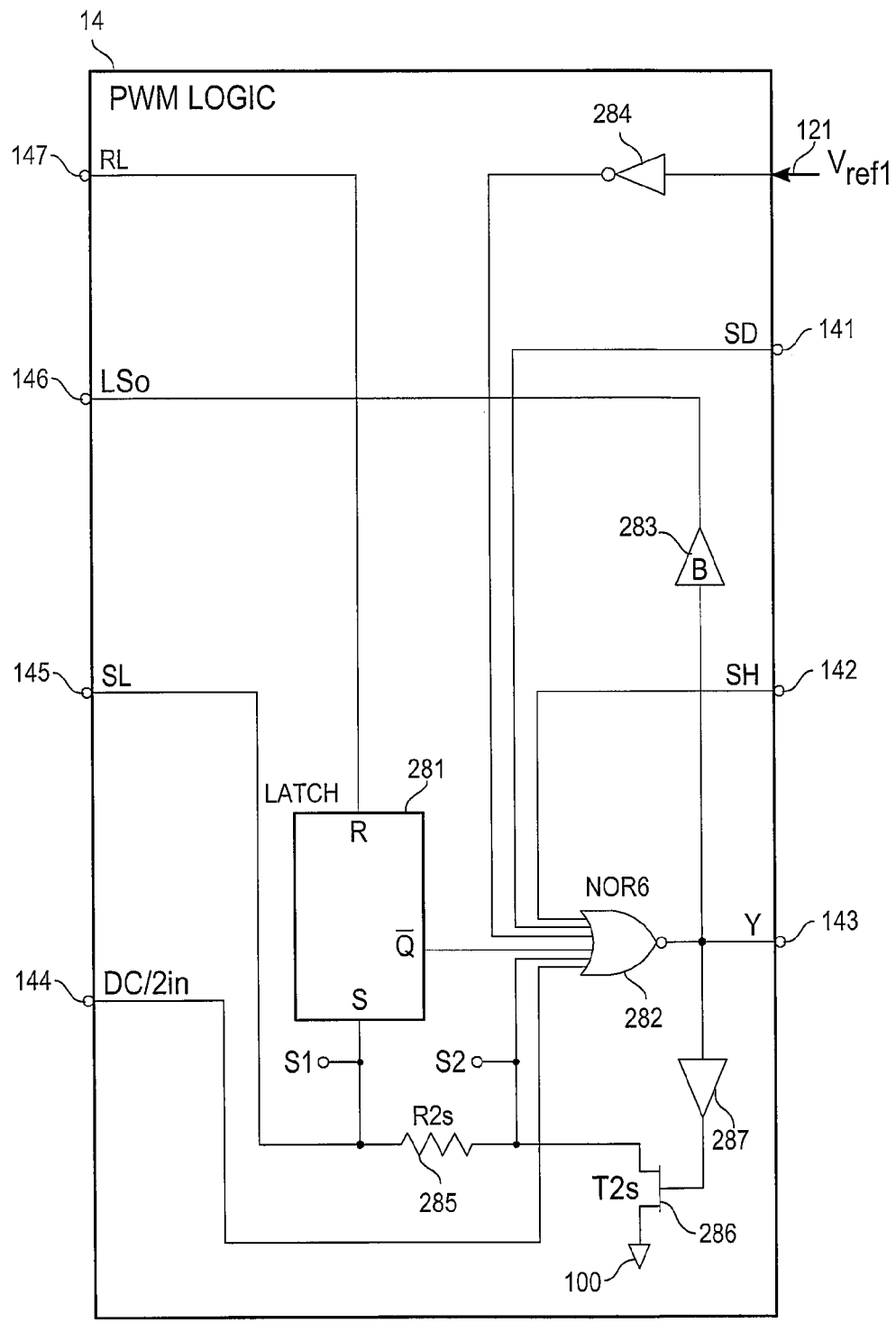

FIG. 33 is a second embodiment of the NEWSYS Pulse Width Modulation Logic (PWM Logic) internal functional block apparatus embodiment, comprising a Latch, a six inputs nor gate NOR6 an inverting buffer, two non-inverting buffers, a resistor R2s and a transistor T2s.

Figure 34:
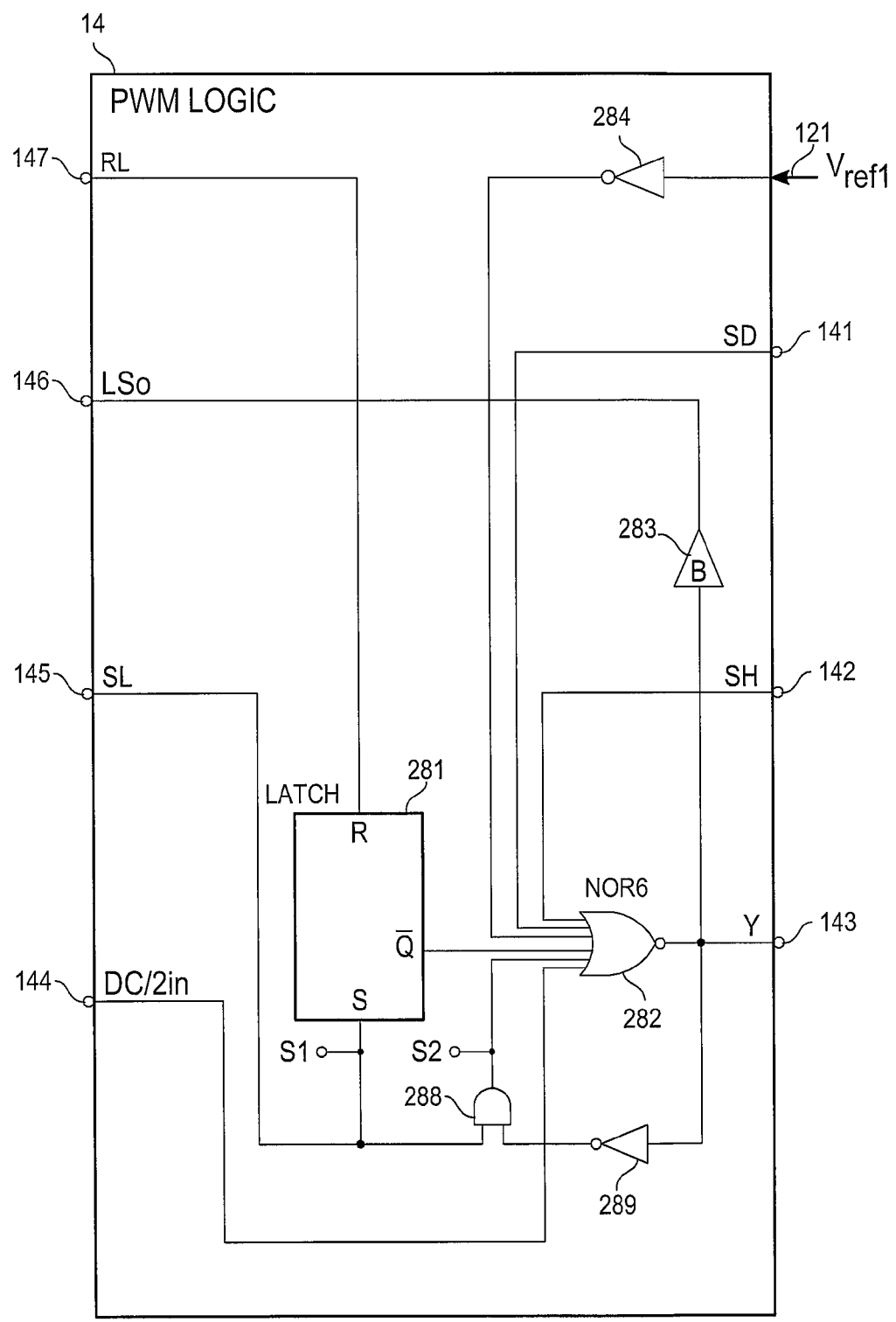

FIG. 34 is a third embodiment of the NEWSYS Pulse Width Modulation Logic (PWM Logic) internal functional block apparatus embodiment, comprising a Latch, a six inputs nor gate NOR6 two inverting buffers, a non-inverting buffer and an OR gate.

Figure 35:
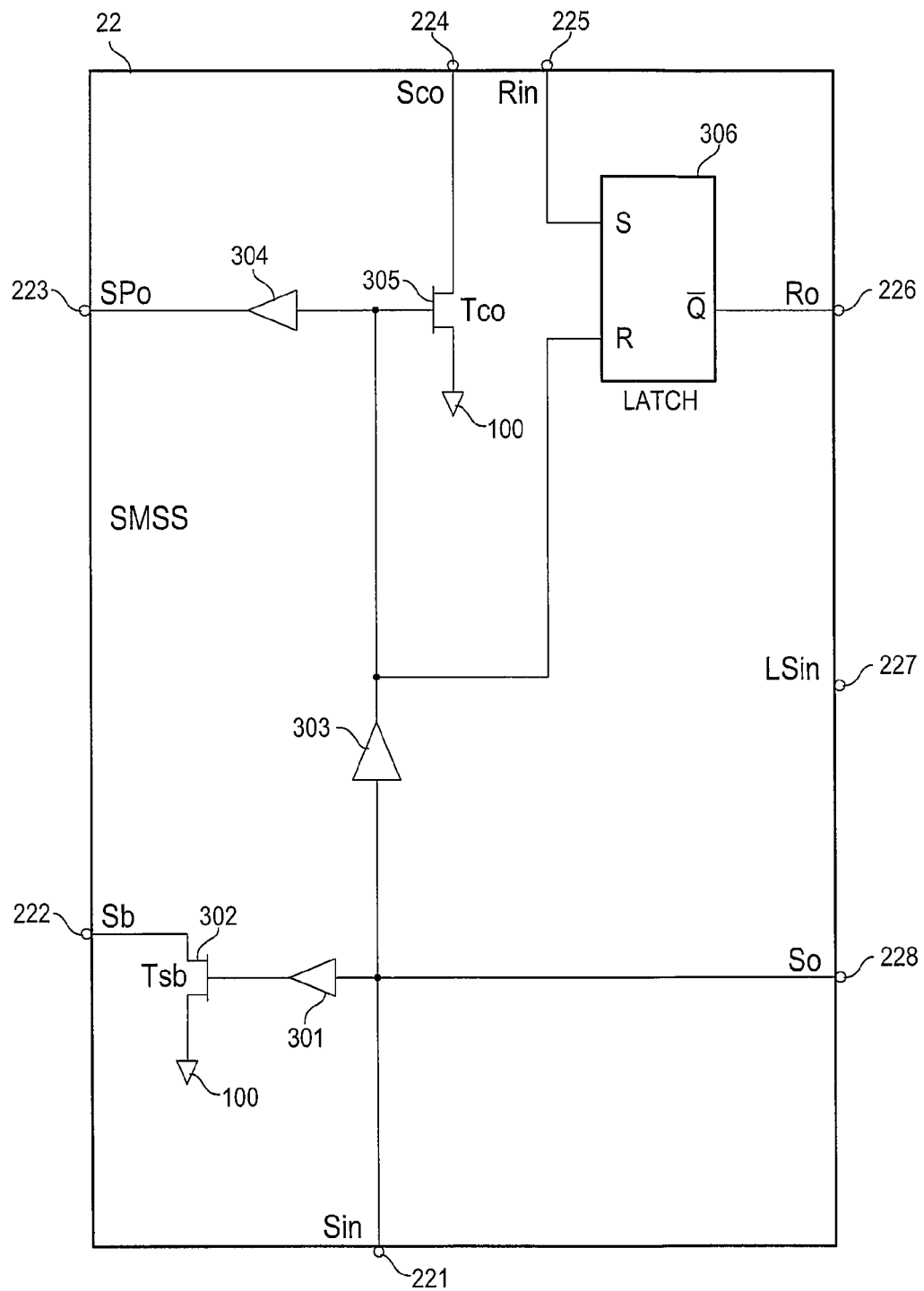

FIG. 35 is a first embodiment of the NEWSYS Syncro Mixed Signal System (SMSS) internal functional block apparatus embodiment, comprising an SR Latch coupled with its Q bar output to the Ro (226) block's output, three non-inverting buffers and two transistors (Tco and Tsb).

Figure 36:
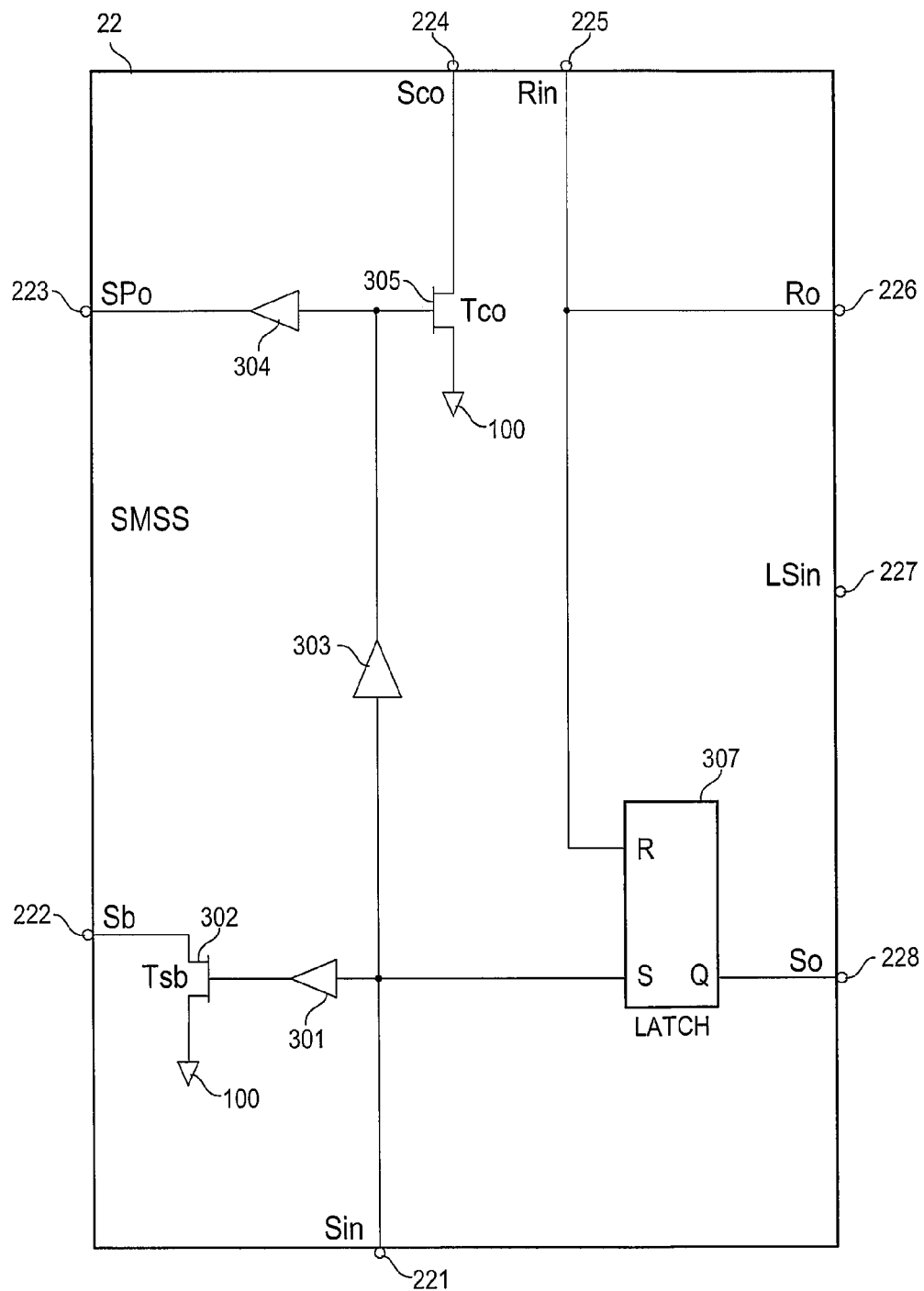

FIG. 36 is a second embodiment of the NEWSYS Syncro Mixed Signal System (SMSS) internal functional block apparatus embodiment, comprising a SR Latch coupled with its Q output to the So (228) block's output, three non-inverting buffers and two transistors (Tco and Tsb).

Figure 37:
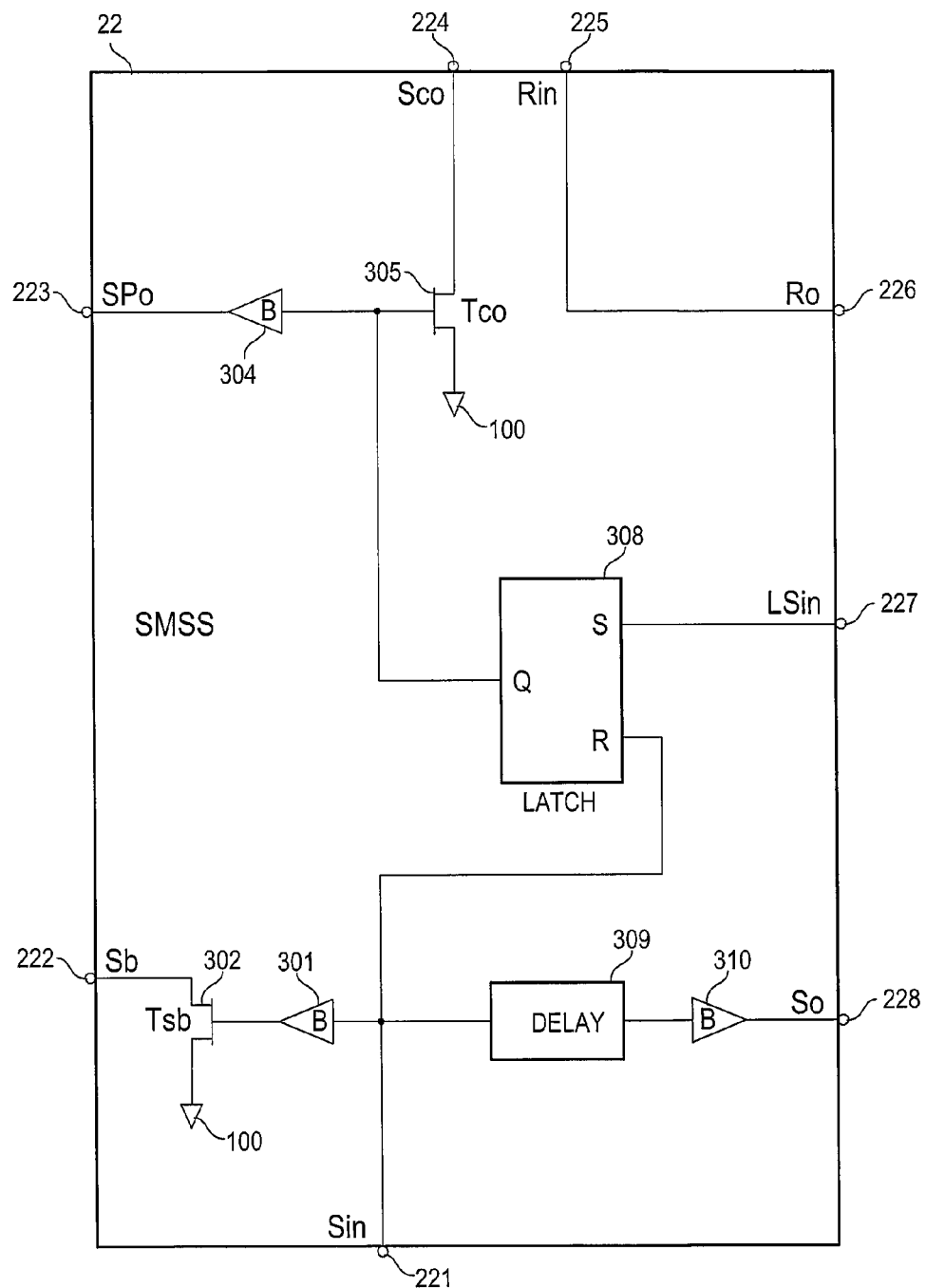

FIG. 37 is a third embodiment of the NEWSYS Syncro Mixed Signal System (SMSS) internal functional block apparatus embodiment, comprising a SR Latch coupled with its S input to the Lsin (227) block's input, three non-inverting buffers and two transistors (Tco and Tsb).

Figure 38:
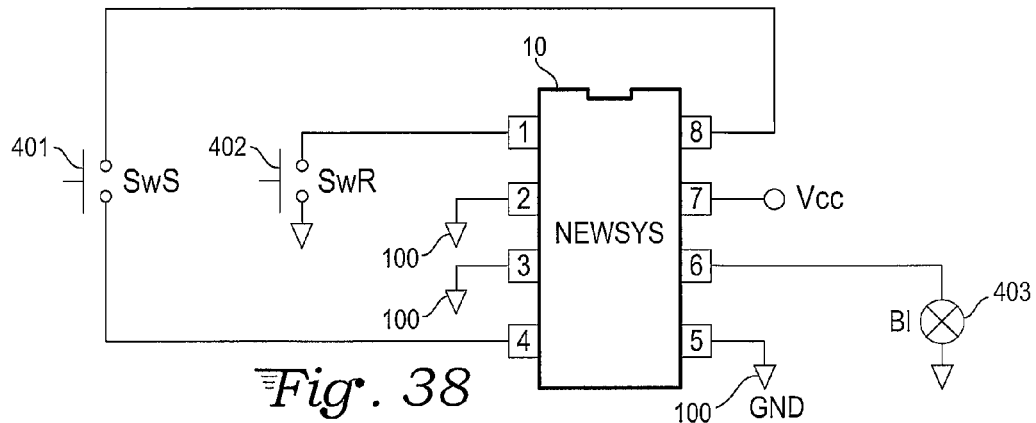

FIG. 38 is a NEWSYS Bistable circuit apparatus embodiment comprising a NEWSYS controller, a set switch SwS, a reset switch SwR and a bulb Load Bl.

Figure 39:
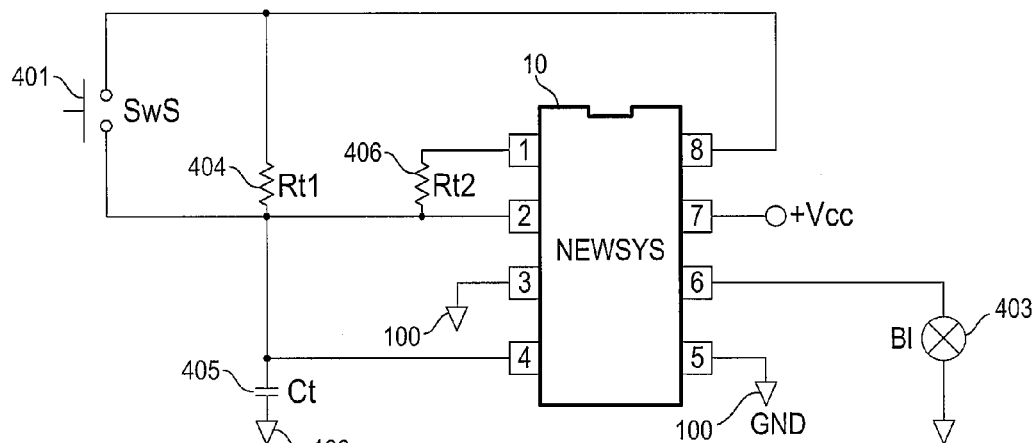

FIG. 39 is a NEWSYS Monostable circuit apparatus embodiment comprising a NEWSYS controller, two resistors (Rt1, Rt2), one capacitor Ct, a set switch SwS and a bulb Load Bl.

Figure 40:
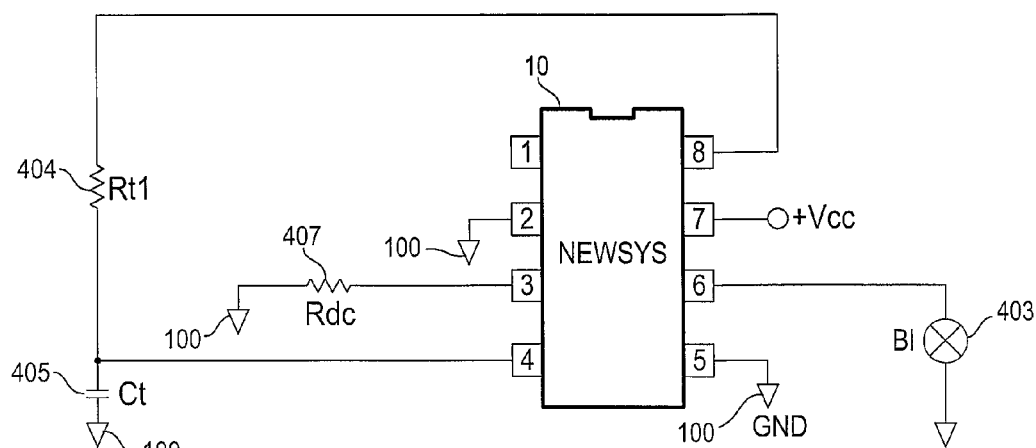

FIG. 40 is a NEWSYS Astable circuit apparatus embodiment comprising a NEWSYS controller, two resistors (Rt and Rdc), one capacitor Ct and bulb Load Bl.

Figure 41:
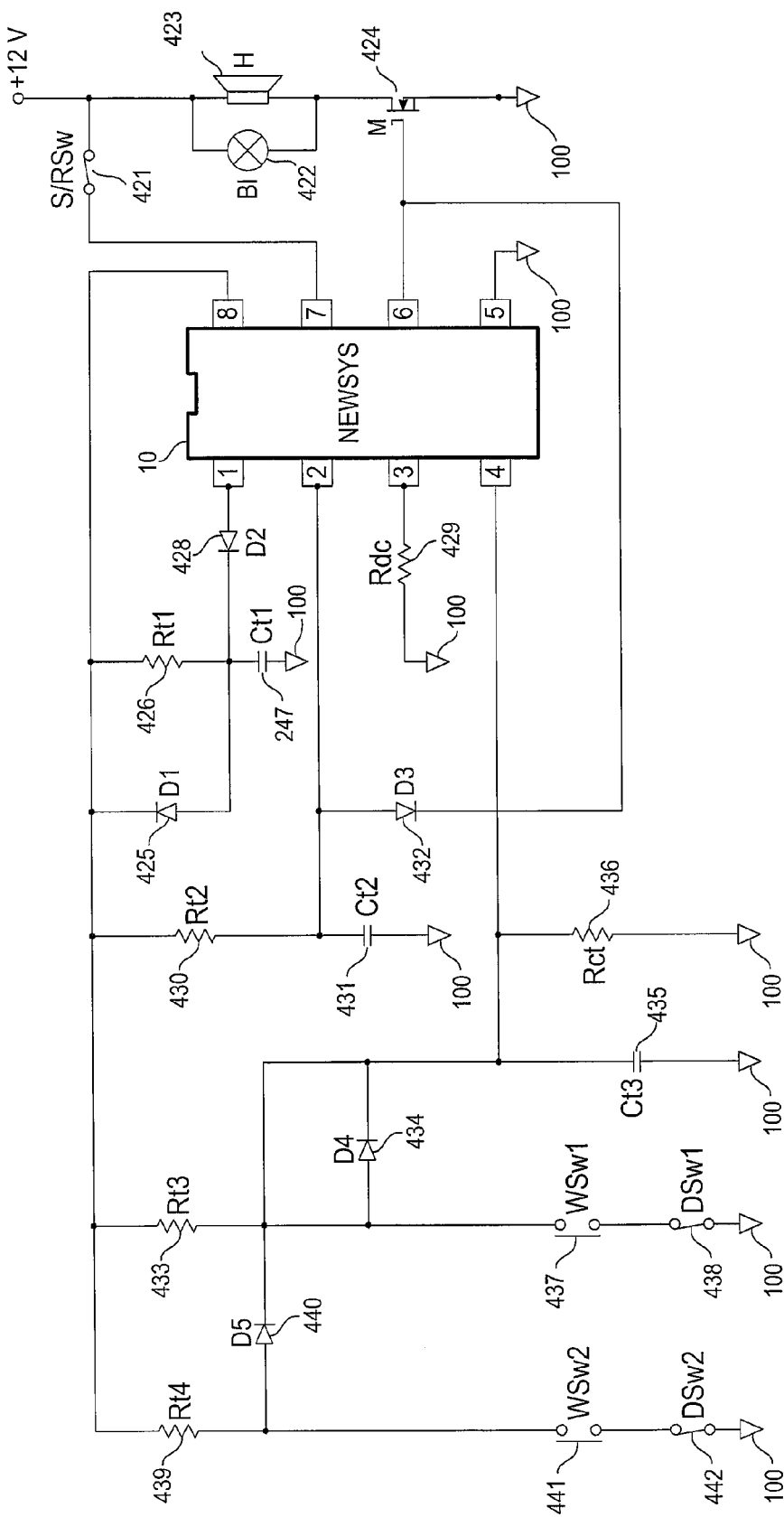

FIG. 41 is a NEWSYS Intruder Alarm circuit apparatus embodiment comprising a NEWSYS controller, six resistors, five diodes, three capacitors, five switches, a MOSFET transistor M, a horn/spikier H and bulb Load Bl.

Figure 42:
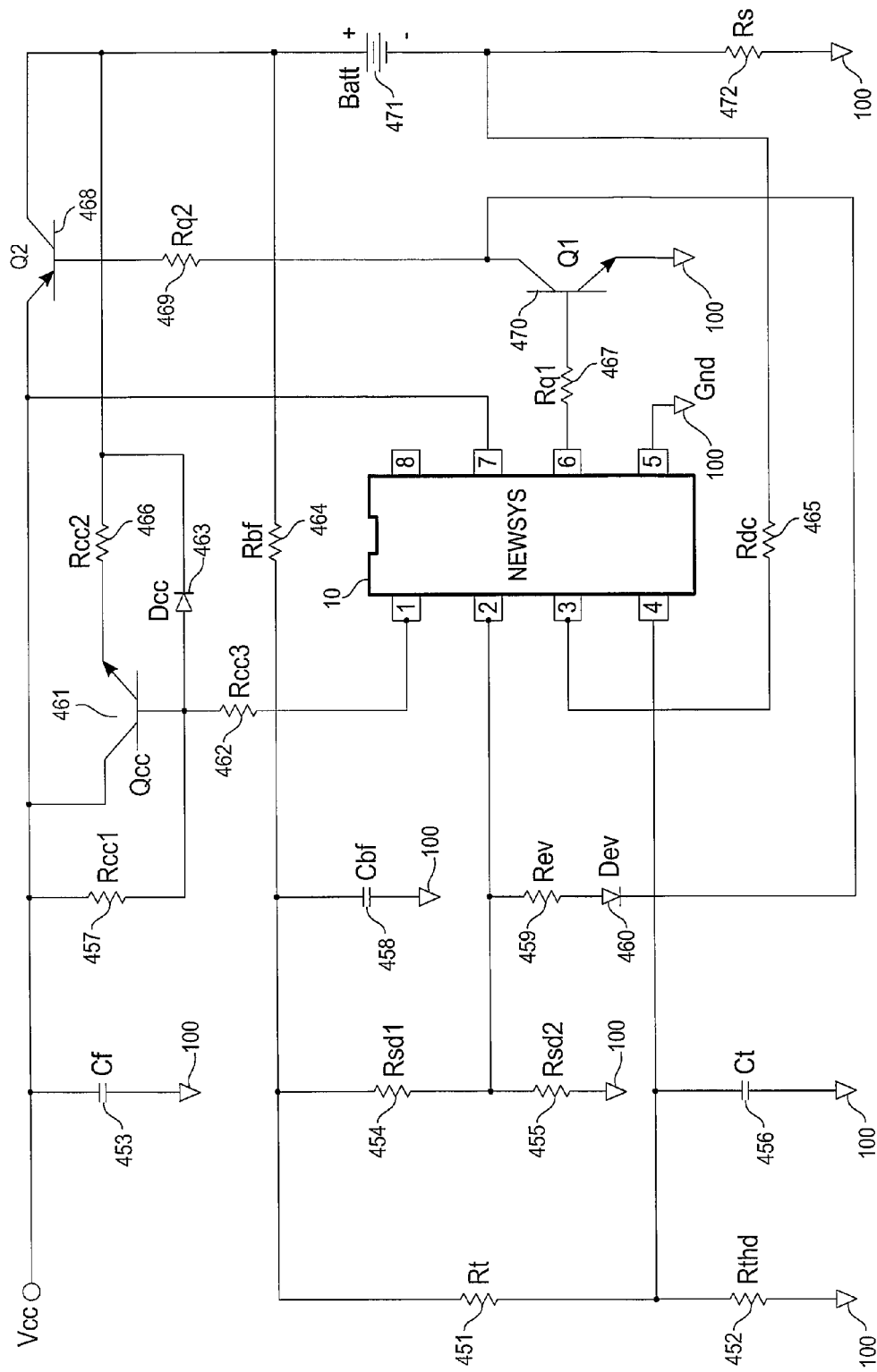

FIG. 42 is a NEWSYS Battery Charger circuit apparatus embodiment comprising a NEWSYS controller, thirteen resistors, two diodes (Dcc and Dev), three capacitors (Cf, Ct and Cbf), two bipolar transistors (Q1, Q2), and a battery Batt.

Figure 43:
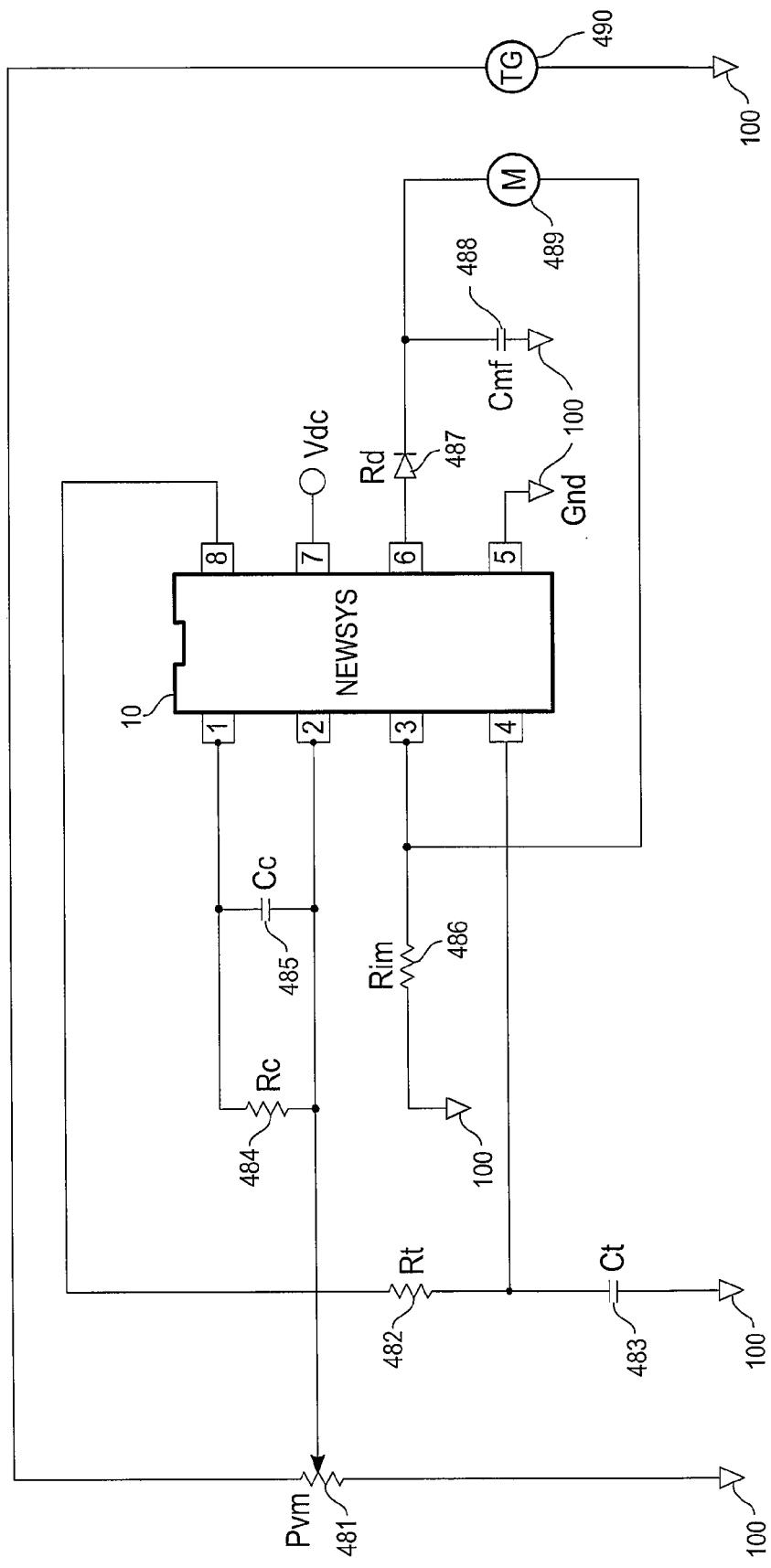

FIG. 43 is a NEWSYS Motor Control circuit apparatus embodiment comprising a NEWSYS controller, three resistors, one diode (Rd), three capacitors (Cmf, Ct and Cc), one potentiometer Pvm, a motor M and a taco-generator TG.

FIG. 44 is a NEWSYS SCR/R-SCR Control circuit apparatus embodiment comprising a NEWSYS controller, a Vac generator, a bridge rectifier BR, three resistors, one capacitors Ct, two bipolar transistors (Q1, Q2), two MOSFET transistors (M1, M2), a potentiometer Pfc and two bulb loads Bl1 and Bl2.

Figure 45:
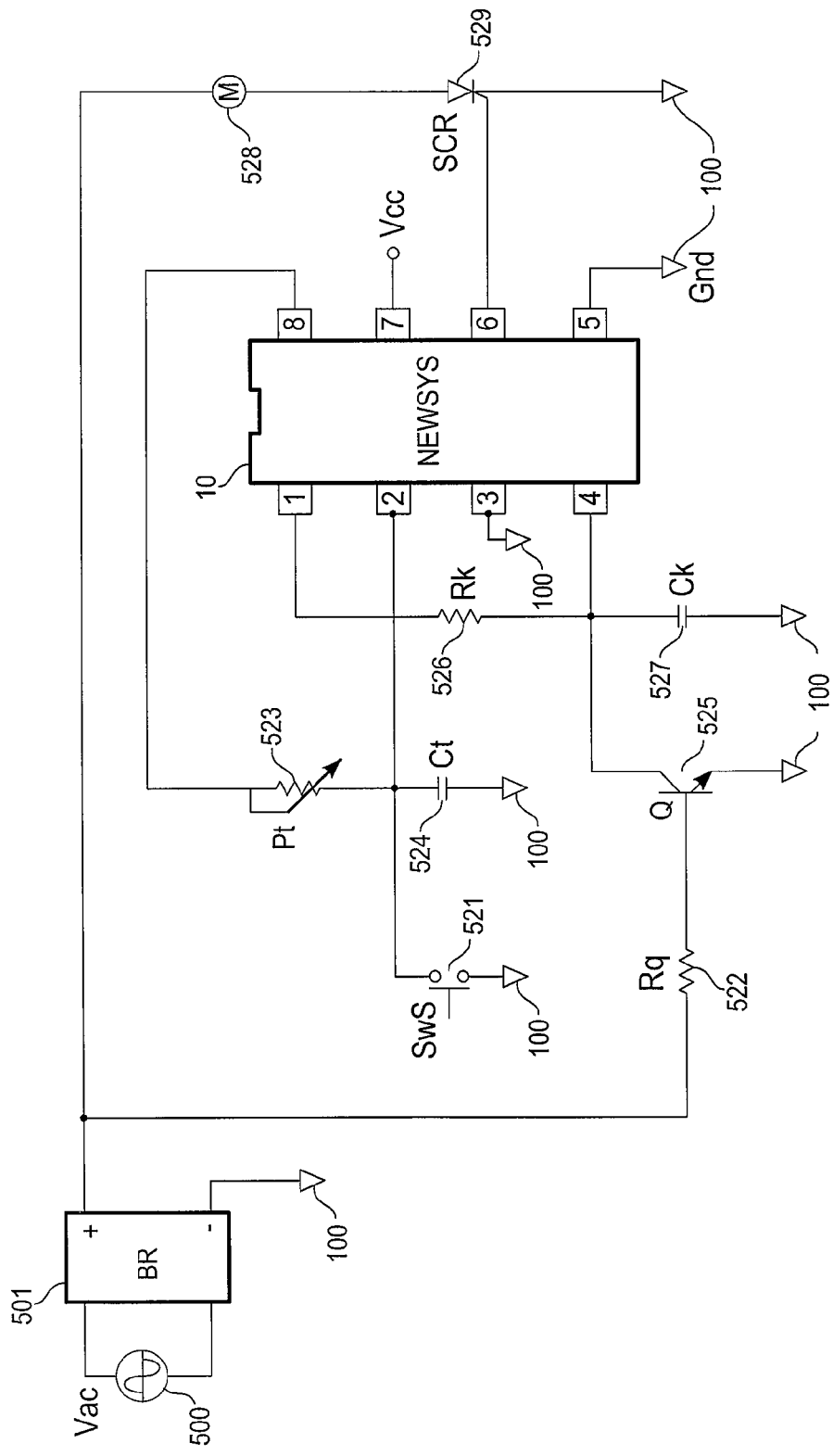

FIG. 45 is a NEWSYS SCR/ZVD Control circuit apparatus embodiment comprising a NEWSYS controller, a Vac generator, a bridge rectifier BR, three resistors, one capacitors Ct, two bipolar transistors (Q1, Q2), two MOSFET transistors (M1, M2), a potentiometer Pfc and two bulb loads Bl1 and Bl2.

Figure 46:
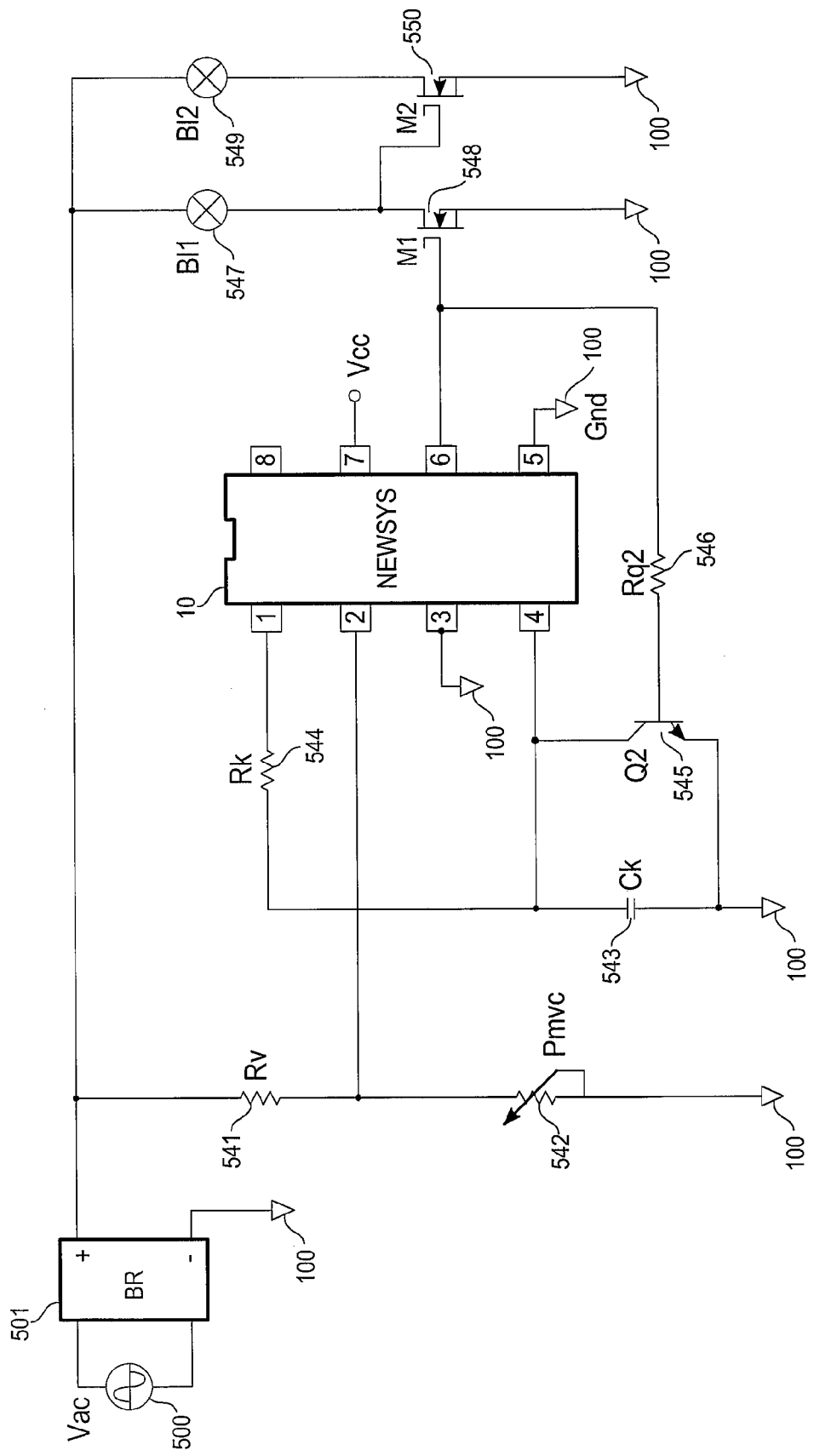

FIG. 46 is a NEWSYS MVC/EVC Control circuit apparatus embodiment comprising a NEWSYS controller, a Vac generator, a bridge rectifier BR, three resistors (Rv, Rk, Rq2), one capacitors Ck, one bipolar transistors (Q2), two MOSFET transistors (M1, M2), a potentiometer Pmvc and two bulb loads Bl1 and Bl2.

FIG. 47 is a NEWSYS Benistor-ZVD Temperature Control circuit apparatus embodiment comprising a NEWSYS controller, a Vac generator, a bridge rectifier BR, one resistors Rt, one capacitor Ck, one bipolar transistor (Q), one MOSFET transistors M, a potentiometer Pt and a RH-Th load-thermistor block.

FIG. 48 is a NEWSYS PFC AC/DC Boost Converter circuit apparatus embodiment comprising a NEWSYS controller, a EMI filter, a bridge rectifier BR, eleven resistors, six capacitors, four diodes, one MOSFET transistors M, a transformer Tr and a coil Ls.

15.3 PFC Graphs and Comparative Test Data

Figure 49:
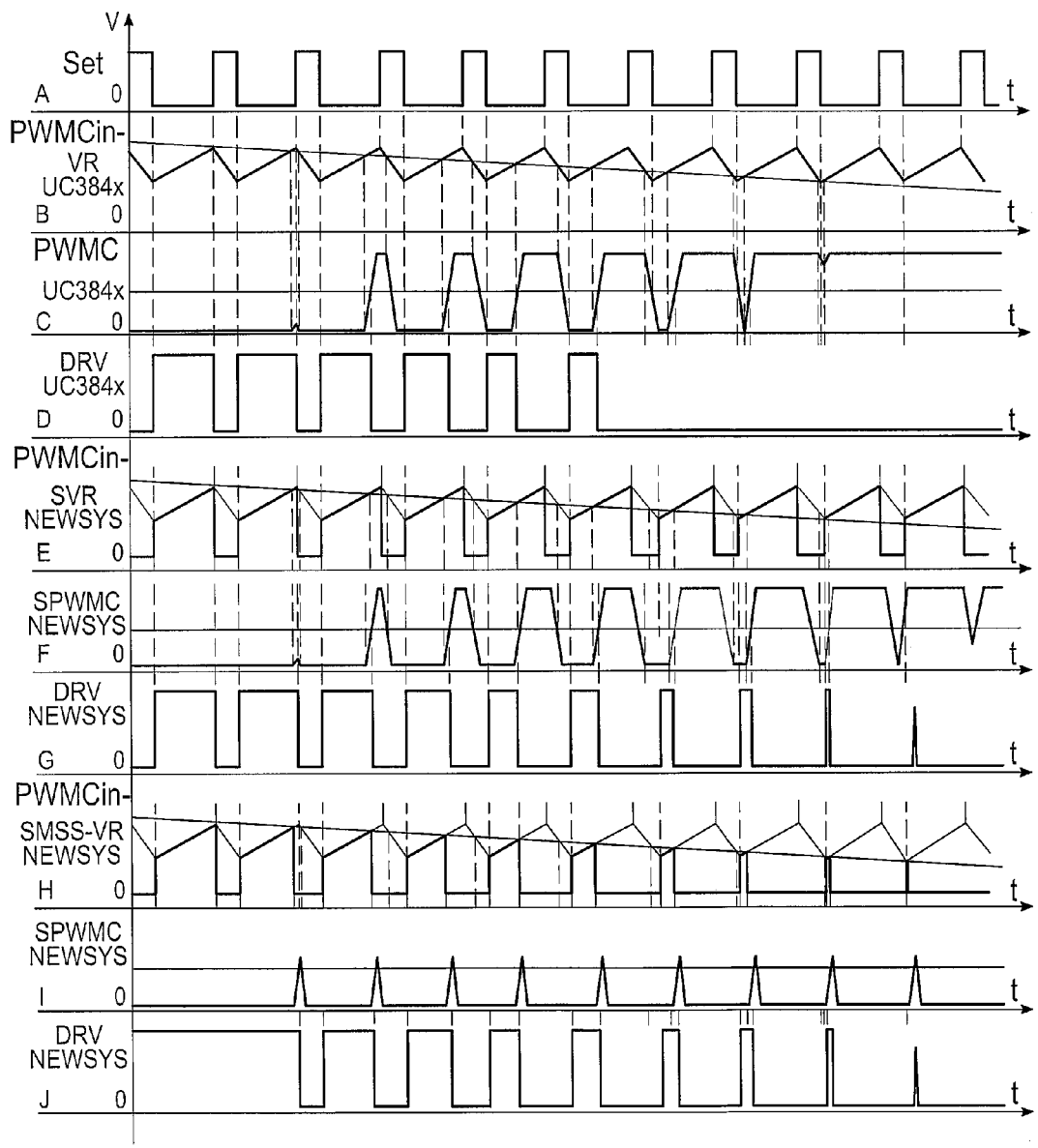

FIG. 49 is a NEWSYS vs. UC384x I/O Mixed Signal Graphs chart illustrating ten (A-J) comparative graphs lines.

Figure 50:
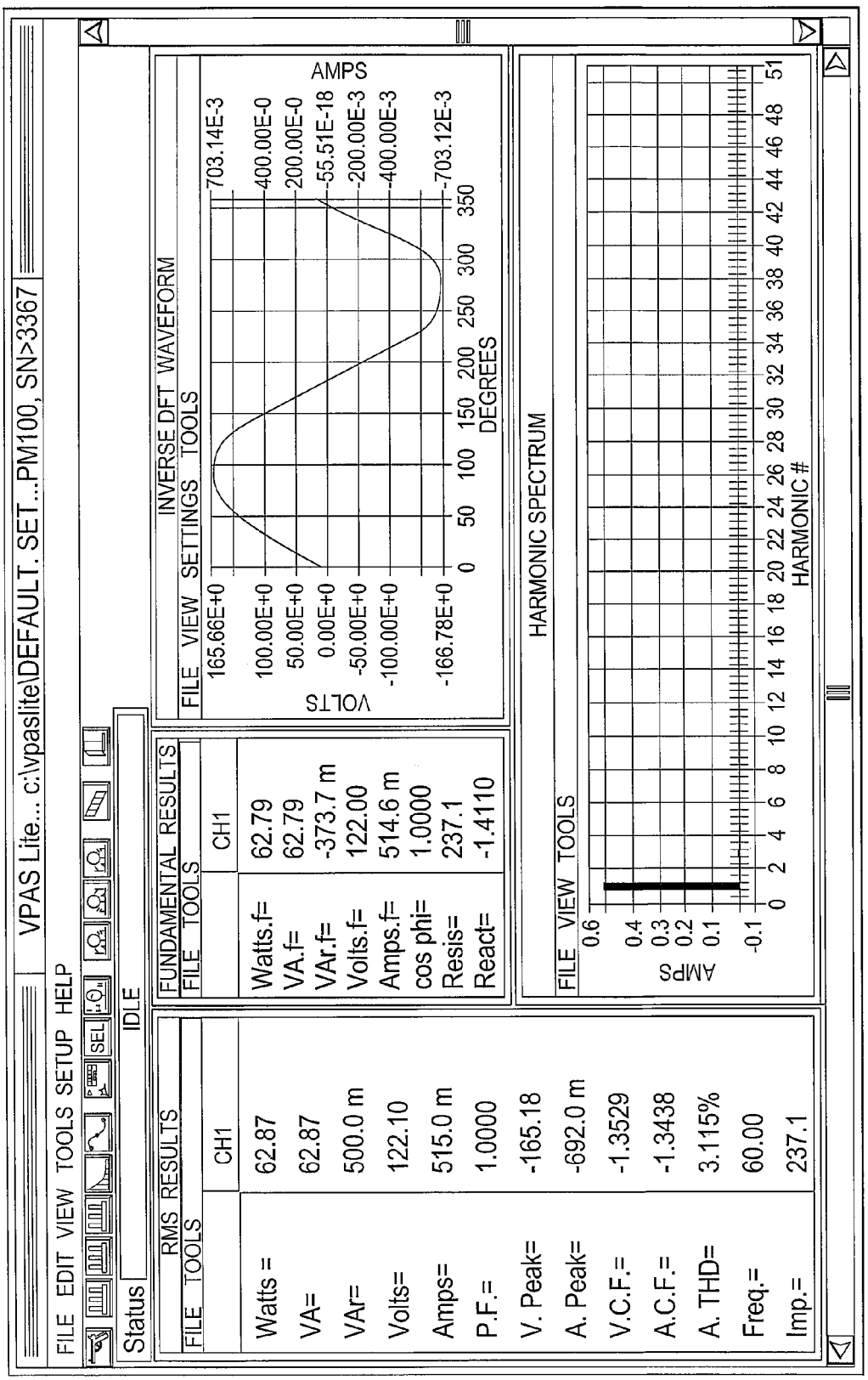

FIG. 50 is a chart illustrating the Power Factor and other comparative bench test data for a 120V/60 w Incandescent Bulb Lamp (i.e. resistive load) connected to a PM100 testing device.

Figure 51:
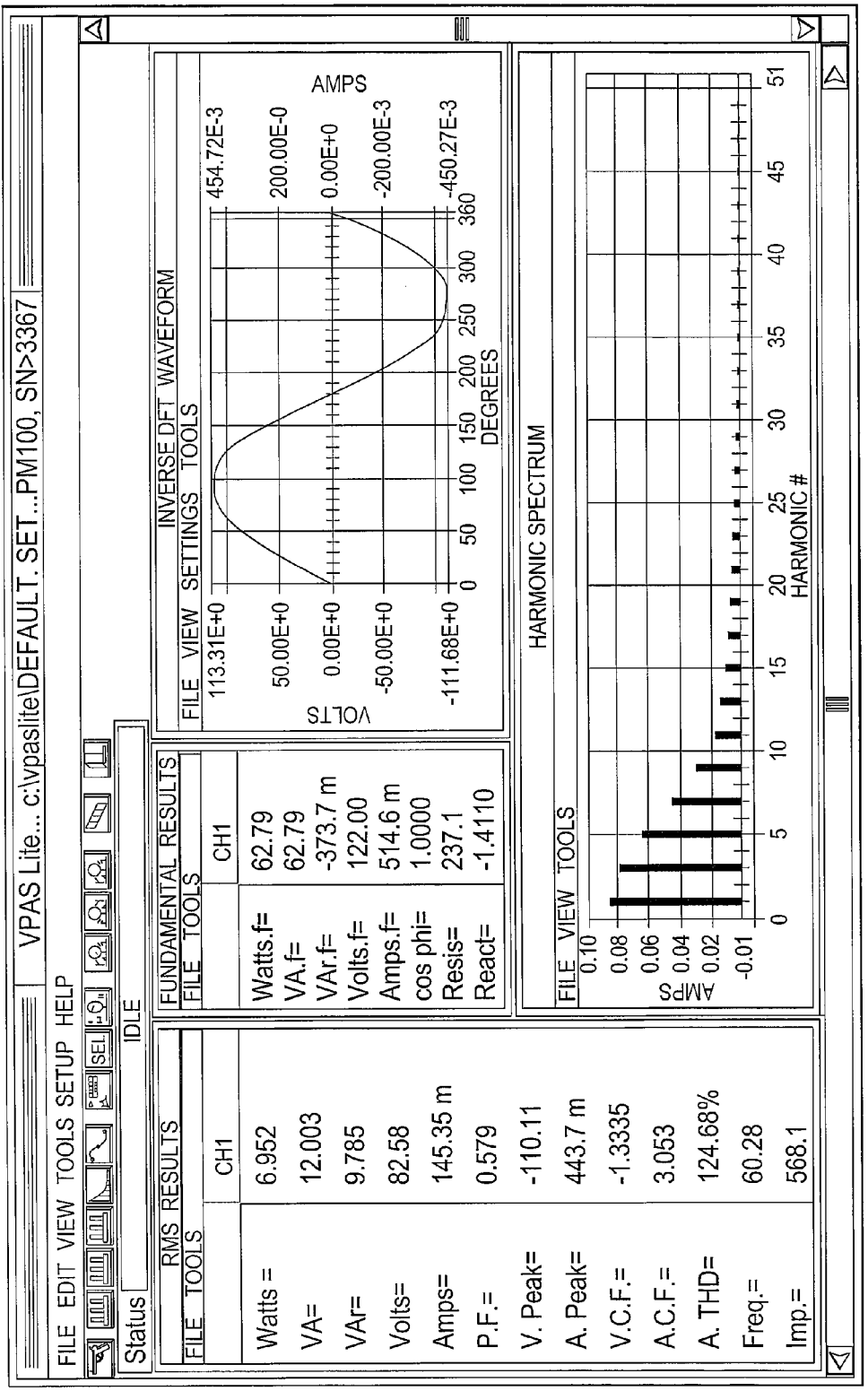

FIG. 51 is a chart illustrating the Power Factor and other comparative bench test data for a No PFC Power Supply connected to a PM100 testing device.

Figure 52:
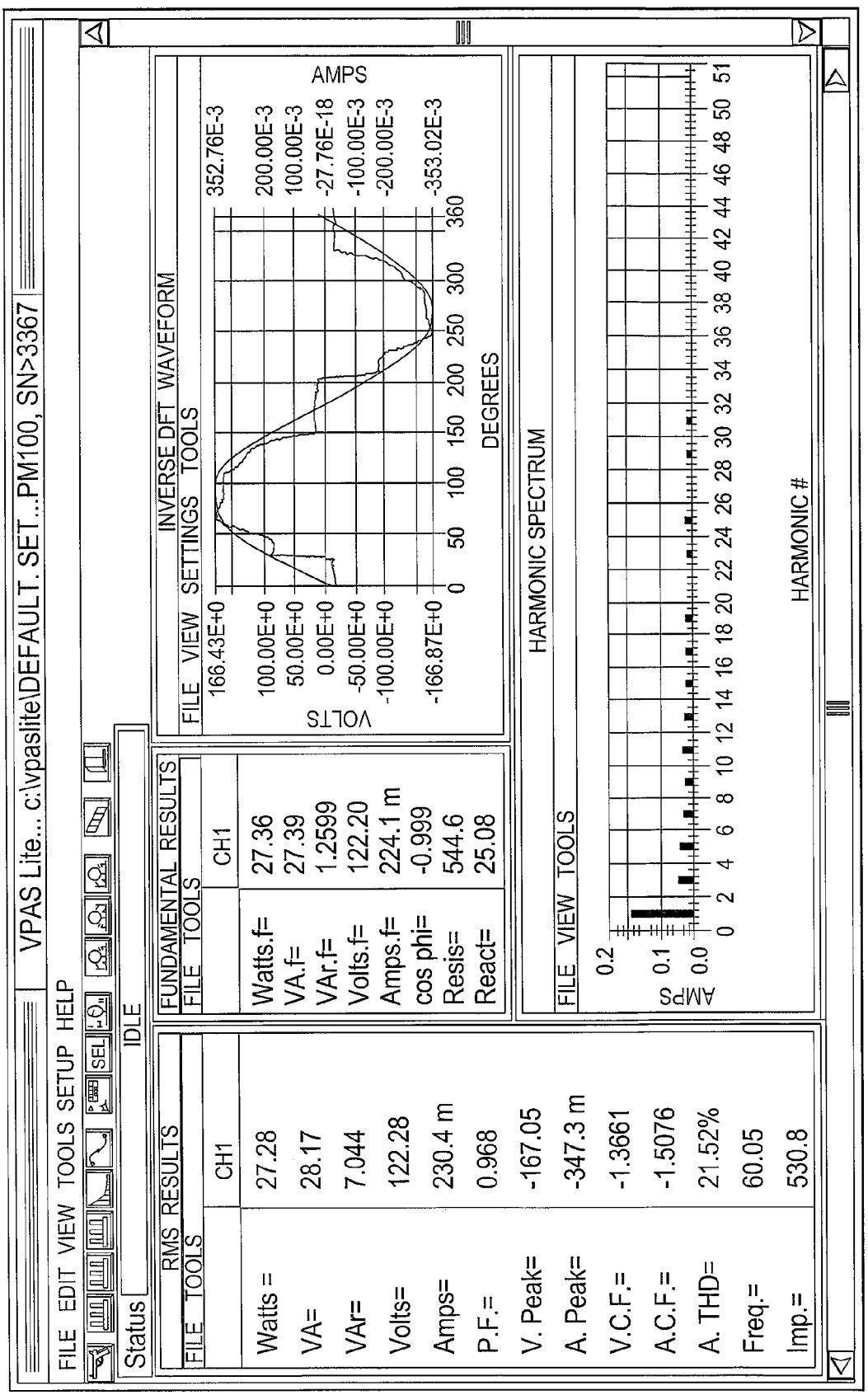

FIG. 52 is a chart illustrating the Power Factor and other comparative bench test data for a 120V/30 W Florescent Lamp Ballast connected to a PM100 testing device.

Figure 53:
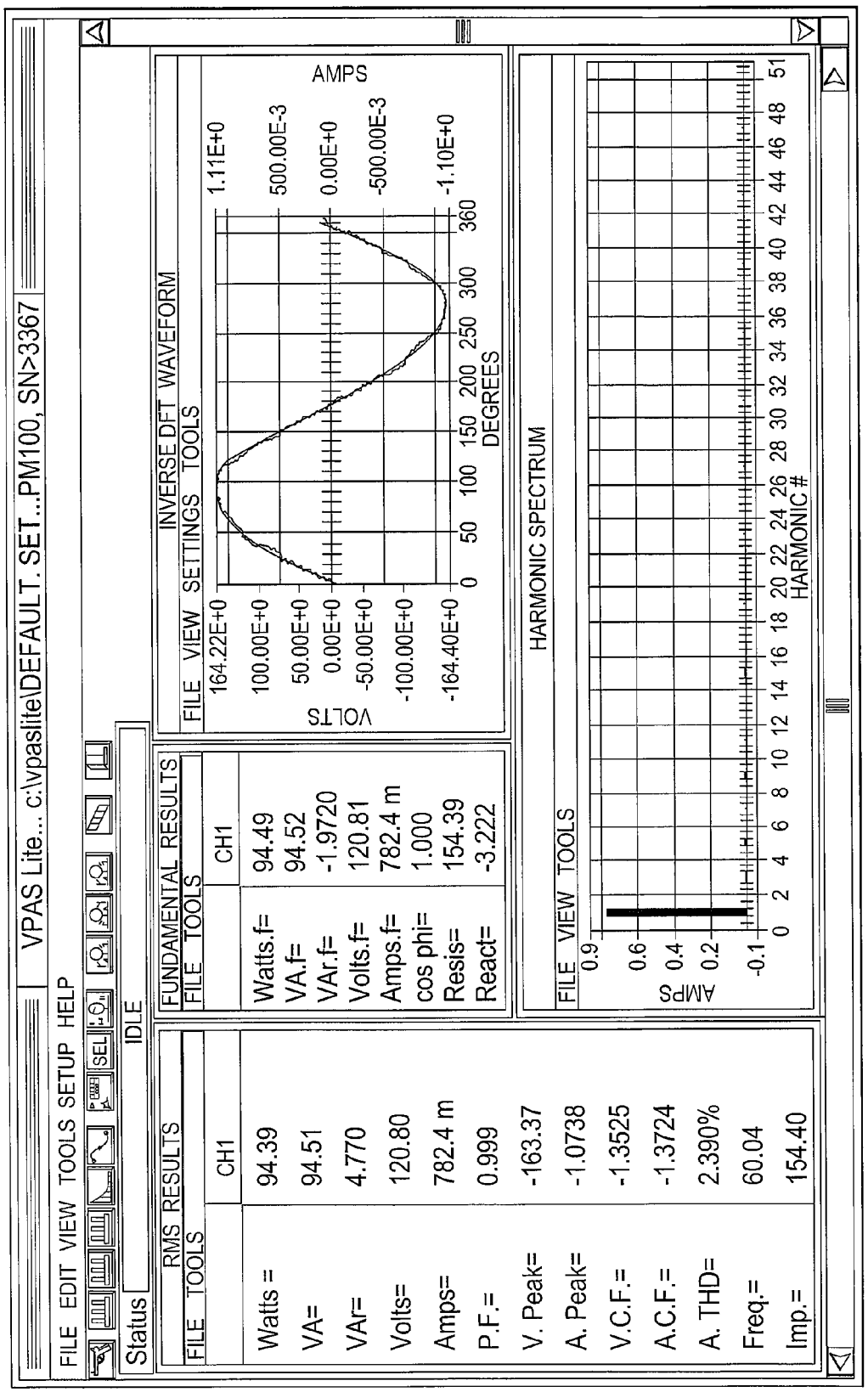

FIG. 53 is a chart illustrating the Power Factor and other comparative bench test data for a 120V/95 W NEWSYS PFC AC/DC Converter connected to a PM100 testing device.

Figure 54:
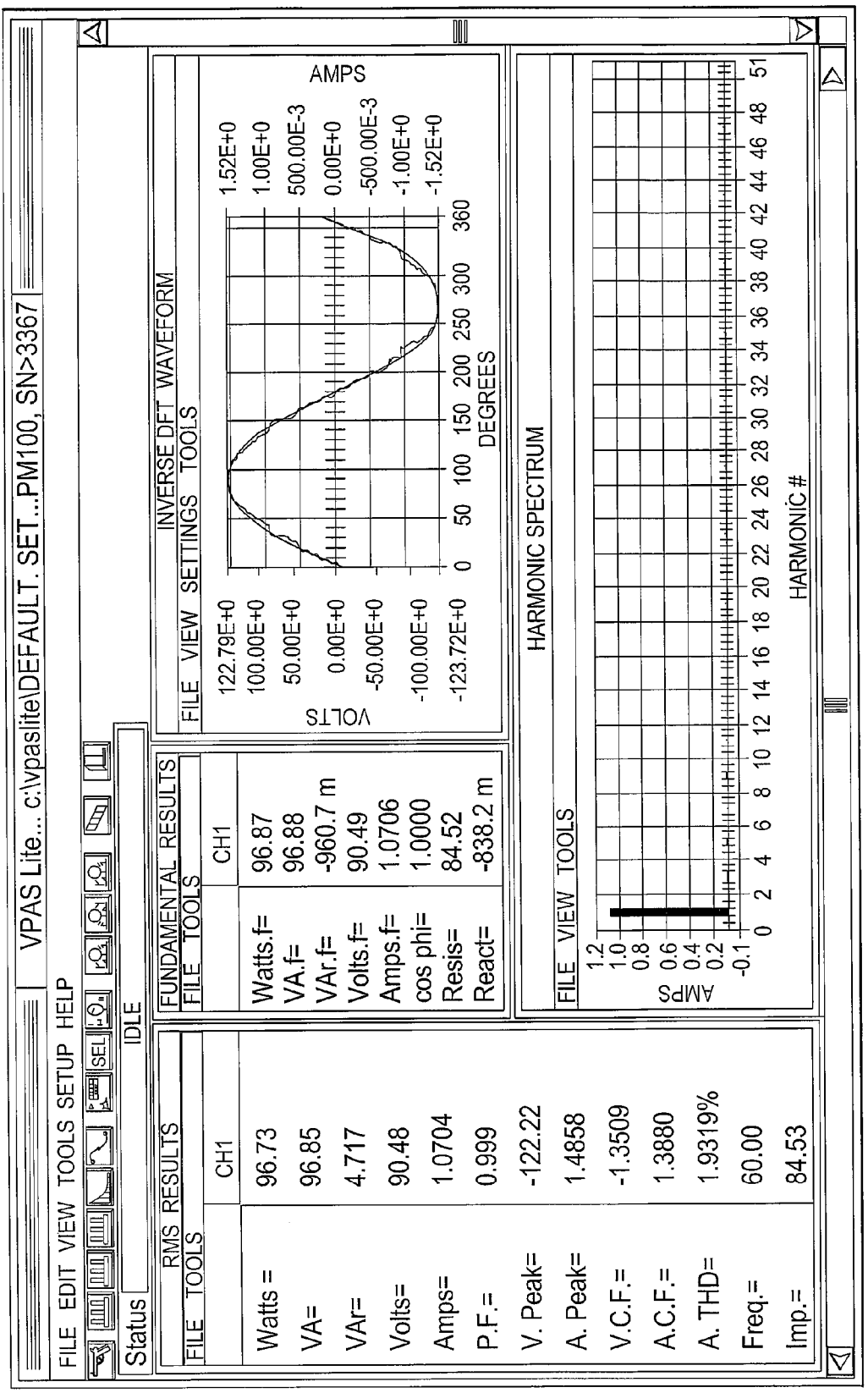

FIG. 54 is a chart illustrating the Power Factor and other comparative bench test data for a 90V/95 W NEWSYS PFC AC/DC Converter connected to a PM100 testing device.

Figure 55:
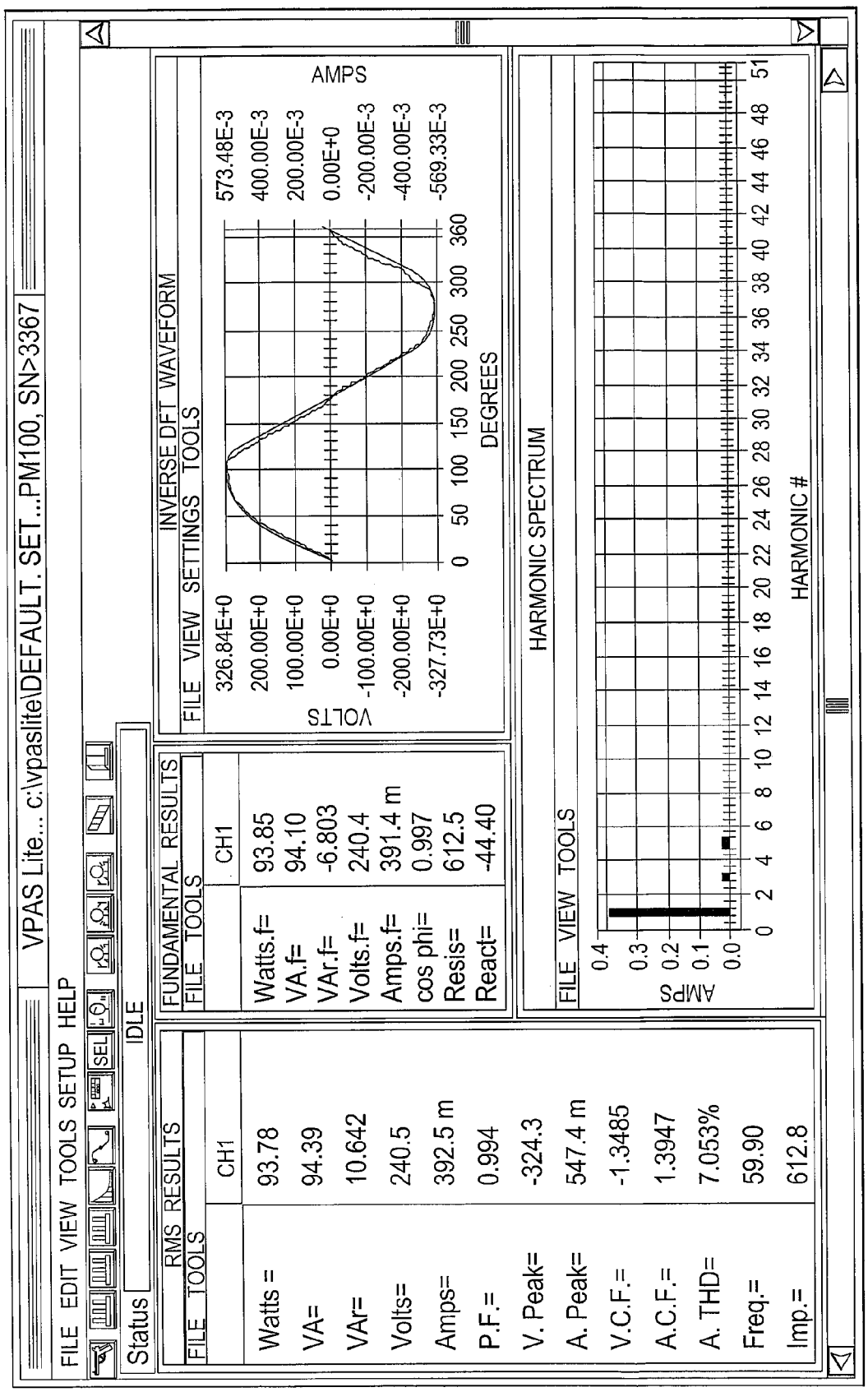

FIG. 55 is a chart illustrating the Power Factor and other comparative bench test data for a 240V/95 W NEWSYS PFC AC/DC Converter connected to a PM100 testing device.

DETAILED DESCRIPTION OF THE EMBODIMENTS

Introduction

The present invention main subject relates to a Low Cost Ultra Versatile Mixed Signal Controller Circuit, respectively to a new system "NEWSYS" architecture which, implemented in just a minimum cost "8 Pin" chip topology, allows a controller circuit to drive with less parts count and higher performances Timers, PWM, PFC and many other classic or novel systems circuits, to be used in the Power Management fields of industry.

In order to achieve these goals, NEWSYS include in its internal block schematic a few PWM/PFC "classic blocks", a few "up-graded blocks" and a novel "Sync Master Switching System" capable to push the performances of the entire system to the "State of the Art" level, without increasing the manufacturing cost of the novel Controller Integrated Circuit and/or the solution total cost.

In order to reduce the solution's total parts count, some of the "typical circuits" used externally to most Controller ICs where included, inside of "NEWSYS", over passing many design challenges, such as: keeping just an 8 pin-out configuration, as closed as possible to the existing very low cost PWM/PFC classic controllers, offering to the designer as much access as possible to the internal blocks, finding new solutions for implementing, at "chip's die level" some frequently used external circuits comprising large value capacitors or other parts that cannot be integrated with the today's technology, obtaining versatile Fixed/Variable Frequency and/or Current/Voltage Mode of operations features without jeopardizing the controller operations safety features, etc.

Therefore, the description of the present invention will referee, mostly, to its improvements, upgrades and/or novel elements and, wherever there are included "classic" blocks, devices, parts and/or typical operations, the description will be substantially simplified, by using short references to the similar items provided by the Related Art.

Also, by considering the large material presented herein, for simplifying the description, the GND connection were included only where there was a significant need for it.

The NEWSYS Block Schematic Circuit System Preferred Embodiment

The present invention main subject relates to a Low Cost Ultra Versatile Mixed Signal Controller Circuit, NEWSYS that is able to control many classic or novel systems circuits, to be used in the Power Management fields of industry.

FIG. 19 shows the NEWSYS (10) Block Schematic Circuit System Preferred Embodiment, as main subject of this invention.

As embodied herein NEWSYS (10), main subject of this invention, has 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

Description of the NEWSYS Internal Blocks

As further Embodied herein, the NEWSYS (10) Circuit System Preferred Embodiment, subject of this invention comprises, internally, 12 functional blocks, such as: UVLO&P (11), VRIB (12), DR (13), SPWM Logic (14), OSC (15), SVRB (16), SCsF (17), EA (18), VL (19), SPWMC (20), SSS (21) and SMSS (22).

I. UVLO&P (11) is the Under Voltage Locked Out & Protections block, having 6 terminals: a Voltage Input (111), Power In (112), SD Output (113), SH Output (114), DRV Supply (115) and a 0V terminal coupled to the system GND (100).

II. VRIB (12) is the Voltage References and Internal Bias block, is the Under Voltage Locked Out & Protections block, having 8 terminals: Voltage Output (120) terminal, Vref1 (121), Vref2 (122), Vref3 (123), Vref4 (124), Vref5 (125) Vref6 (126), Voltage Input (127) and a 0V terminal coupled to GND (100).

III. DR (13) is the Driver block, having 4 terminals: Input (13), Output (6), Supply (115) and GND (100).

IV. SPWM Logic (14) is the Sync Pulse Width Logic block, having 8 terminals: Vref1 (121), SD (141), SH (142), Y (143), DC/2in (144), SL (145), LSo (146) and RL (147).

V. OSC (15) is the Oscillator block, having 9 terminals: RC (151), SVR (152), S (153), DC/2o (154), Vref1 (121), Vref3 (123), Vref4 (124), Vref5 (125) and GND (100).

VI. SVRB (16) is the Sync Voltage Ramp Driver Buffer block, having 4 terminals: Input (161), Output (162), VRs (163) and Vref1 (121).

VII. SCsF (17) is the Sinc Current Spikes Filter block, having 4 terminals: Output (171), Bs (172), Input (173) and GND (100)

VIII. EA (18) is the Error Amplifier block, having 3 terminals: a Non Inverting Input coupled to Vref2 (122), an Inverting Input coupled to EAin (2) and an Output coupled to EAout (1).

IX. VL (19) is the Voltage Limiter block, having 3 terminals: Output (191), Input (192) and GND (100).

X. SPWMC (20) is the Sync Pulse Width Modulation Comparator, having 4 terminals: Signal Input (202), a Reference Input (203), R (204) and Sync Input (205).

XI. SSS (21) is the Sync Soft Start block, having 5 terminals: Soft Start (211), a Start Security (212), Cin (213), Vref1 (121) and GND (100).

XII. SMSS (22) is the Sinc Master Switch System, having 8 terminals: Sin (221), Sb (222), Spo (223), Sco (224), Rin (225), Ro (226), LSin (227), So (228).

The NEWSYS' Internal Connections Topology a) UVLO&P (11) has its Voltage Input (111) coupled to Vcc (7), Power In (112) coupled to VRIB Voltage Input (127), SD Output (113) coupled to SD (141), SH Output (114) coupled to SH (142), DRV Supply (115) coupled to the DR supply input (115) and its 0V terminal coupled to the system GND (100).

b) VRIB (12) has its Voltage Output (120) coupled to Vref (8), Vref1 (121), Vref2 (122), Vref3 (123), Vref4 (124), Vref5 (125), Vref6 (126) coupled many other internal blocks, Voltage Input (127) coupled to Power In (112) and the 0V terminal is coupled to GND (100).

c) DR (13) has its Input (13) coupled to Y (143), Output (6) coupled to DRV (6), Supply (115) coupled to DRV Supply (115) and its 0V terminal coupled to GND (100).

d) SPWM Logic has its Vref1 (121) coupled to Vref (121), SD (141) coupled to SD Output (113), SH (142) coupled to SH Output (114), Y (143) coupled to DRV Input (13), DC/2in (144) coupled to DC/2o (164), SL 145) coupled to So (228), LSo (146) coupled to LSin (228) and RL (147) coupled to Ro (227).

e) OSC (15) has its RC (151) coupled to OSC (4), SVR (152) coupled directly to SVRB Input (161) and via a Capacitor Cj (201) to the SPWMC block's Signal Input (202), S (153) coupled to Sin (221), DC/2o (154) coupled to DC/2in (144), Vref1 (121), Vref3 (123), Vref4 (124), Vref5 (125) coupled to the VRIB block and its 0V terminal coupled to GND (100).

f) SVRB has its Input (161) coupled to SVR (152), Output (162) coupled to Is/DC (3) via a resistor Rvr1 (169), VRs (163) coupled to Bs (172) and Sb (222) and Vref1 (121) is coupled to VRIB block.

g) SCsF has its Output (171) coupled to (202) via a resistor Rj (200), Bs (172) is coupled to Vrs (163) and Sb (222), Input (173) is coupled to Is/DC (3) and its 0V terminal is coupled to GND (100)

h) EA (18) has its Non Inverting Input coupled to Vref2 (122), its Inverting Input coupled to EAin (2) and its Output coupled to EAout (1).

i) VL (19) has its Output (191) coupled to Reference Input (203), Input (192) coupled to EAout (1) and Soft Start (211) and its 0V terminal coupled to GND (100).

j) SPWMC (20) has its Signal Input (202) coupled to SCsF block's Output (171) via Rj (200) and to SVRB Input (161) and SVR (152) via Cj (201), Reference Input (203) coupled to VL blocks' Output (191), R (204) coupled to Rin (225) and Sync Input (205) coupled to Sco (224).

k) SSS (21) has its Soft Start (211) coupled to EA out (1) and Soft Start (192), Start Security (212) coupled to EAin (2), Cin (213) SPo (223), Vref1 (121) to the VRIB block and its 0V terminal to GND (100).

l) SMSS (22) has its Sin (221) coupled to S (153), Sb (222) coupled to VRs (163) and Bs (172), Spo (223) coupled to Cin (213), Sco (224) coupled to Sync Input (205), Rin (225) coupled to R (204), Ro (226) coupled to RL (147), LSin (227) coupled to LSo (147), So (228) coupled to SL (144).

m) A parallel compensation circuit Rc (181), Cc (182) is coupled between EAout (1) and EAin (2).

Description of the NEWSYS (10) Upgraded/Novel Blocks
The NEWSYS' OSC Block Circuit System Embodiment FIG. 20 shows the NEWSYS' (10) OSC (15) Block Circuit System Embodiment As embodied herein The OSC (15) interconnection with external subsystems relies on 9 I/O terminals, such as: RC (151), SVR (152), S (153), DC/2o (154), Vref1 (121), Vref3 (123), Vref4 (124), Vref5 (125), and GND (100).

As further embodied herein the OSC (15) Block Circuit System Embodiment comprises 7 internal devices, such as: a CR (251) comparator, a CS (252) comparator, a DC/2 (253) comparator, an SRL (254) latch, a discharging MOSFET transistor Td (255), and a constant current source CS (256).

As yet embedded herein the CR (251) comparator has one of its inputs coupled to Vref3 (123), the other input coupled to GND (100), its output coupled to the Reset input of SRL (254), and its supply terminal coupled to Vref1 (121). The CS (252) comparator has one of its inputs coupled to Vref4 (124), the other input coupled to GND (100), and its output coupled to the Set input of SRL (254) latch. The DC/2 (253) comparator has one of its inputs coupled to Vref5 (125), the other input coupled to GND (100), and its output coupled to DC/2o (154) terminal. The MOSFET transistor has its gate coupled to Q-bar output of SRL (254) latch, its source is coupled to GND (100), and its drain is coupled simultaneously to SVR (152) terminal and a lower terminal of CS (256) constant current sink. The CS (256) constant current sink has its upper terminal coupled to RC (151) terminal, and its middle terminal coupled to Vref1 (121).

The NEWSYS' SVRB Block Circuit 1$^{st}$ Embodiment

FIG. 21 shows the schematic diagram of the NEWSYS (10) SVRB (16) Block Circuit System 1$^{st}$ Embodiment.

As Embodied herein the SVRB (16) interconnection with external subsystems relies on 3 I/O terminals, such as: an input (161), an output (162), and a gate (163) terminal.

As further Embodied herein the SRVB (16) comprises 2 internal devices, such as: a GA (164) Gated Amplifier, and a silicon diode (165).

As yet Embodied herein, the gated amplifier GA (164) has one input coupled to SVRB (16) input (161), the other input coupled to SVRB (16) output (162), its gate is coupled to SVRB (16) gate (163) terminal, and its output is coupled to the Anode of the Diode (165). The Cathode of the Diode (165) is coupled to SVRB (16) output (162).

The NEWSYS' SVRB Block Circuit System 2$^{nd}$ Embodiment

FIG. 22 shows the schematic diagram of NEWSYS (10) SVRB (16) Block Circuit System 2$^{nd}$ Embodiment.

As embodied herein the SVRB (16) interconnection with external subsystems relies on 4 I/O terminals, such as: an input (161), an output (162), a gate (163) terminal, and a Vref1 (121) terminal.

As further embodied herein SRVB (16) comprises 2 internal devices, such as: a GA (164) Gated Amplifier, and a silicon NPN Qvr (166) transistor.

As still embodied herein, the gated amplifier GA (164) has one input coupled to SVRB (16) input (161), the other input coupled to SVRB (16) output (162) and the Emitter of Qvr (166), its gate is coupled to SVRB (16) gate (163) terminal, and its output is coupled to the Base of Qvr (166). The Collector of Qvr (166) is coupled to Vref (121).

The NEWSYS (10) SVRB Block Circuit System 3$^{rd}$ Embodiment

FIG. 23 shows the schematic diagram of the NEWSYS (10) SVRB (16) Block Circuit 3$^{rd}$ Embodiment.

As embodied herein the SVRB (16) interconnection with external subsystems relies on 4 I/O terminals, such as: an input (161), an output (162), a control terminal (163), and a supply terminal Vref1 (121).

As further embodied herein the SRVB (16) comprises 4 internal devices, such as: OA (160) Operational Amplifier, a silicon diode (168), A resistor (167), and an NPN Qvr (166) transistor.

As still embodied herein, the operational amplifier OA (160) has one input coupled to SVRB (16) input (161), the other input of OA (160) is coupled to SVRB (16) output (162), and the output of OA (160) is coupled to one terminal of Rvro (167). The other terminal of Rvro (167 is coupled to the Anode of Dvr (168) and to the Base of Qvr (166). The Cathode of Dvr (168) is coupled to the SVRB (16) control terminal. The Qvr (166) Emitter is coupled to SVRB (16) output (162), and its Collector is coupled to Vref1 (121).

The NEWSYS SCsF Block System 1$^{st}$ Embodiment

FIG. 24 shows the schematic diagram of the NEWSYS (10) SCsF (17) Block Circuit 1$^{st}$ System Embodiment block schematic diagram.

As Embodied herein the SCsF (17) interconnection with external subsystems relies on 3 I/O terminals, such as: an input (173), an output (171), and a 0V terminal GND (100).

As further Embodied herein the SCsF (17) comprises 4 internal devices, such as: an operational amplifier buffer B (176), a silicon diode Dcs (177), a resistor Rcs1 (174), and a capacitor, Ccs (175).

As still Embodied herein, the non-inverting input of the B (176) is coupled to SCsF (17) input (173) via Rcs1 (174), the inverting input together with the output of B (176) is coupled to SCsF (17) output (171). The anode of Dcs (177) is coupled to B (174) non-inverting input and its cathode is coupled to the SCsF (17) input (173). The Ccs (175) is from the non-inverting input of B (176) to GND (100).

The NEWSYS SCsF Block System 2$^{nd}$ Embodiment

FIG. 25 shows the NEWSYS (10) SCsF (17) 2$^{nd}$ System Embodiment block schematic diagram.

As embodied herein, the SCsF (17) interconnection with external subsystems relies on 3 I/O terminals, such as: an input (173), an output (171), and a Bs (172) terminal.

As further embodied herein, the SCsF (17) 2$^{nd}$ Embodiment comprises only one gated operational amplifier buffer GA (178).

As still Embodied herein, the non-inverting input of the GA (178) is coupled to SCsF (17) input (173), the inverting input together with the output of GA (178) is coupled to SCsF (17) output (171), and its gate is coupled to the SCsF (17) Bs (172) terminal.

The NEWSYS SCsF Block System 3$^{rd}$ Embodiment

FIG. 26 shows the NEWSYS (10) SCsF (17) 3$^{rd}$ System Embodiment block schematic diagram.

As Embodied herein, the SCsF (17) interconnection with external subsystems relies on 4 I/O terminals, such as: an input (173), an output (171), and a Bs (172) terminal and a 0V terminal coupled to GND (100).

As further Embodied herein, the SCsF (17) 3$^{rd}$ Embodiment comprises a resistor Rcs1 (174) and a "two contacts one control input" terminals switch SWcs (179).

As still embodied herein, Rcs (174) is coupled between SCsF (17) input (173) and the SCsF (17) output (171). SWcs (179) has one contact terminal coupled to the SCsF (17) output (171), the other contact terminal coupled to GND (100) and the control terminal coupled to Bs (172).

The NEWSYS SSS Block System 1$^{st}$ Embodiment

FIG. 27 shows the NEWSYS (10) SSS (21) 1$^{st}$ System Embodiment block schematic diagram.

As embodied herein the SSS (21) interconnection with external subsystems relies on 5 I/O terminals, such as: a start input Vref (121), a direct soft start output (211), a resistive soft start output (212), a 0V terminal GND (100) and a Cin (213) terminal which in not internally connected, in this 1$^{st}$ Embodiment.

As further Embodied herein the SSS (21) comprises 6 internal devices, such as: an operational amplifier buffer OPAM (264), a silicon diode Dss (261), a very large value first resistor Rss1 (262), a capacitor, Css (263), a double emitter PNP transistor Oss (265) and a second resistor Rss2 (266).

As still embodied herein, the OPAM (264) inverting input and output are together coupled to the base of Qss (265) and its non-inverting input is coupled via Css (263) to GND (100) and via Rss to Vref1 (121). Dss (261) is coupled across Rss1 with its cathode coupled to Vref1 (121). One of the Qss (265) emitter is coupled directly to the SSS (21) direct output (211), the other emitter this coupled, via Rss2 (266) to the SSS (21) resistive output (212) and its collector is coupled to GND (100).

The NEWSYS SSS Block System 2$^{nd}$ Embodiment

FIG. 28 shows the NEWSYS (10) SSS (21) Block 1$^{st}$ System Embodiment block schematic diagram.

As embodied herein the SSS (21) interconnection with external subsystems relies on 5 I/O terminals, such as: a start input Vref (121), a direct soft start output (211), a resistive soft start output (212), a 0V terminal GND (100) and a Cin (213) terminal which in not internally connected, in this 1$^{st}$ Embodiment.

As further Embodied herein the SSS (21) comprises 4 internal devices, such as: a Digital to Analog Converter D/A (267), a double emitter PNP transistor Oss (265) and a resistor Rss2 (266) and a high frequency two terminals Clock (268).

As still Embodied herein, D/A (267) is supplied from Vref1 (121) in respect to GND (100), it has an output coupled to Qss (265) base and an input which can be coupled either to Cin (213) or to the Clock (268) output which has the other terminal coupled to GND (100). One of the Qss (265) emitter is coupled directly to the SSS (21) direct output (211), the other emitter this coupled, via Rss2 (266) to the SSS (21) resistive output (212) and its collector is coupled to GND (100).

The NEWSYS SPWMC Block System 1$^{st}$ Embodiment

FIG. 29 shows the NEWSYS (10) SPWMC (20) 1$^{st}$ System Embodiment block schematic diagram.

As embodied herein the SPWMS (20) interconnection with external subsystems relies on 4 I/O terminals, such as: a reference input Vref (203), a signal input (202), a Sync input Cc (205) and an output (204).

As further Embodied herein the SPWMS (20) block comprises, in this 1$^{st}$ Embodiment, only an open loop (i.e., comparator) gated amplifier GA (271).

As yet embodied herein One of GA (271) input is coupled to SPWMS (20) reference input Vref (203), the other input is coupled to SPWMS (20) signal input (202), the GA (271) control gate is coupled to SPWMS (20) Sync input Cc (205) and it output is coupled to SPWMS (20) output (204).

The NEWSYS SPWMC Block System 2$^{nd}$ Embodiment

FIG. 30 shows the NEWSYS (10) SPWMC (20) 1$^{st}$ System Embodiment block schematic diagram.

As embodied herein The SPWMS (20) interconnection with external subsystems relies on 4 I/O terminals, such as: a reference input Vref (203), a signal input (202), a Sync input Cc (205) and an output (204).

As further embodied herein the SPWMS (20) block comprises, in this 2nd Embodiment, a comparator C (272) and a resistor Rsy (274).

As yet embodied herein One of C (272) input is coupled to SPWMS (20) reference input Vref (203), the other input is coupled directly to Cc (205) and via Rsy (274) to SPWMS (20) signal input (202) and it output is coupled to SPWMS (20) output (204).

The NEWSYS SPWMC Block System 3$^{rd}$ Embodiment

FIG. 31 shows the NEWSYS (10) SPWMC (20) 3$^{rd}$ System Embodiment block schematic diagram.

As embodied herein The SPWMS (20) interconnection with external subsystems relies on 4 I/O terminals, such as: a reference input Vref (203), a signal input (202), a Sync input Cc (205) and an output (204).

As further embodied herein The SPWMS (20) block comprises, in this 3rd Embodiment, a comparator C (272) a resistor Rsy (274), a two inputs one output Latch (275), a one input one output buffer/delay circuit (276) and a MOSFET switch, Tsy (273).

As still embodied herein One of C (272) input is coupled to SPWMS (20) reference input Vref (203), the other input is coupled directly to Cc (205) and via Rsy (274) to SPWMS (20) signal input (202) and it output is coupled to Latch (275) S input. The Latch (275) R input is coupled to Cc (205) and its Q output is coupled directly to SPWMS (20) output (204) and via the Buf/Del (276) circuit to Tsy (273) gate. The Tsy (273) source is coupled to GND (100) and its drain to the C (272) input, which includes Rsy in its circuit.

The NEWSYS PWM Logic Block System 1$^{st}$ Embodiment

FIG. 32 shows the NEWSYS (10) PWM Logic (14) 1st System Embodiment block schematic diagram.

As embodied herein The PWM Logic (14) interconnection with external subsystems relies on 8 I/O terminals, such as: a Vref1 (121) input, an SD (141) input, an SH (142) input, an Y (143) output, a DC/2in (144) input, an SL (145) input, an LSo (146) output and an RL (142) input.

As further embodied herein The PWM Logic (14) block comprises, in this 1st Embodiment, 4 devices, such as: a six input one output gate NOR6 (282), a two inputs one output Latch (281), a one input one output buffer circuit (283) and a one input one output buffer inverter circuit (284).

As still embodied herein The NOR6 (282) output is coupled to Y (143), its first input is coupled to SH (142), second one to SD (141), third receive signal from Vref1 (121) via the buffer inverter circuit (284), fourth one is coupled to the Latch (281) Q-bar output, fifth one is coupled to Latch (281) S input and SL (145) and its sixth input is coupled to DC/2in (144). The Latch (281) R input is coupled to RL (147) and the buffer circuit (283) buffers the signal from Y (143) to LSo (146).

The NEWSYS PWM Logic Block System 2$^{nd}$ Embodiment

FIG. 33 shows the NEWSYS (10) PWM Logic (14) 2$^{nd}$ System Embodiment block schematic diagram.

As embodied herein The PWM Logic (14) interconnection with external subsystems relies on 8 I/O terminals, such as: a Vref1 (121) input, an SD (141) input, an SH (142) input, an Y (143) output, a DC/2in (144) input, an SL (145) input, an LSo (146) output and an RL (142) input.

As further embodied herein The PWM Logic (14) block comprises, in this 2$^{nd}$ Embodiment, 7 devices, such as: a six input one output gate NOR6 (282), a two inputs one output Latch (281), a first one input one output buffer circuit B (283), a one input one output buffer inverter circuit (284), a second one input one output buffer circuit (287), a MOSFET transistor T2s (286) and a resistor R2s (285).

As still embodied herein The NOR6 (282) output is coupled to Y (143), its first input is coupled to SH (142), second one to SD (141), third receive signal from Vref1 (121) via the buffer inverter circuit (284), fourth one is coupled to the Latch (281) Q-bar output, fifth one is coupled to the common connection of the Latch (281) S input and SL (145) via R2s (285) and its sixth input is coupled to DC/2in (144). The Latch (281) R input is coupled to RL (147), the buffer circuit (283) buffers the signal from Y (143) to LSo (146), the buffer (287) buffers the signal from Y (143) to the gate of T2s which has its source couple to GND (100) and its drain coupled to NOR6 (282) fifths input and one terminal of R2s (285).

The NEWSYS PWM Logic Block System 3$^{rd}$ Embodiment

FIG. 34 shows the NEWSYS (10) PWM Logic (14) 3rd System Embodiment block schematic diagram.

As embodied herein the PWM Logic (14) interconnection with external subsystems relies on 8 I/O terminals, such as: a Vref1 (121) input, an SD (141) input, an SH (142) input, an Y (143) output, a DC/2in (144) input, an SL (145) input, an LSo (146) output and an RL (142) input.

As further embodied herein the PWM Logic (14) block comprises, in this 3$^{rd}$ Embodiment, 6 devices, such as: a six input one output gate NOR6 (282), a two inputs one output Latch (281), a one input one output buffer circuit (283), a first one input one output buffer inverter circuit (284), a second one input one output buffer inverter circuit (289), a MOSFET and a two inputs one output AND gate (288).

As still embodied herein the NOR6 (282) output is coupled to Y (143), its first input is coupled to SH (142), second one to SD (141), third receive signal from Vref1 (121) via the first buffer inverter circuit (284), fourth one is coupled to the Latch (281) Q-bar output, fifth one is coupled to the AND (288) gates output and its sixth input is coupled to DC/2in (144). The Latch (281) R input is coupled to RL (147) and its S input coupled to SL (145) and one of the AND (288) gate input. The second buffer inverter circuit (288) buffers the signal from Y (143) to the other gate of AND (288) and the buffer (283) buffers the signal from Y (143) to LSo (146).

The NEWSYS SMSS Block System 1$^{st}$ Embodiment

FIG. 35 shows the NEWSYS (10) SMSS (22) 1$^{st}$ System Embodiment block schematic diagram.

As further Embodied herein the SMSS (22) interconnection with external subsystems relies on 8 I/O terminals, such as: a Sin (221) input, an Sb (222) output, an SPo (223) output, an Sco (224) output, an Rin (225) input, an Ro (226) output, an LSin (227) input and an So (228) output.

As further embodied herein the SMSS (22) block comprises, in this 1st Embodiment, 6 devices, such as: a two inputs one output Latch (306), a first one input one output buffer circuit (301) a second one input one output buffer circuit (303), a third one input one output buffer circuit (304) a first MOSFET transistor Tsb (302) and a second MOSFET transistor Tco (305)

As still embodied herein the buffer (303) buffers the signal from Sin (221), directly to the Latch (306) R input and Tco (305) gate and via buffer 304 to SPo (223). The Tco (305) drain is coupled to Sco (224) and its source to GND (100). The Latch (306) S input is coupled to Rin (225) and its Q-bar output to Ro (226). The buffer (301) buffers the signal from Sin (221) to the gate of Tsb (302), which has its drain coupled to Sb (222) and its source coupled to GND (100).

In this 1$^{st}$ Embodiment, Sin (221) is coupled to So (228) and LSin (227) is not connected.

The NEWSYS SMSS Block System 2nd Embodiment

FIG. 36 shows the NEWSYS (10) SMSS (22) 2nd System Embodiment block schematic diagram.

As embodied herein the SMSS (22) interconnection with external subsystems relies on 8 I/O terminals, such as: a Sin (221) input, an Sb (222) output, an SPo (223) output, an Sco (224) output, an Rin (225) input, an Ro (226) output, an LSin (227) input and an So (228) output.

As further embodied herein the SMSS (22) block comprises, in this 2nd Embodiment, 6 devices, such as: a two inputs one output Latch (307), a first one input one output buffer circuit (301) a second one input one output buffer circuit (303), a third one input one output buffer circuit (304) a first MOSFET transistor Tsb (302) and a second MOSFET transistor Tco (305)

As yet embodied herein the buffer (303) buffers the signal from Sin (221), directly to the Tco (305) gate and via buffer 304 to SPo (223). The Tco (305) drain is coupled to Sco (224) and its source to GND (100). The Latch (307) S input is coupled to Sin (221), its R input to Rin (225) and its Q-bar output to So (228). The buffer (301) buffers the signal from Sin (221) to the gate of Tsb (302), which has its drain coupled to Sb (222) and its source coupled to GND (100).

In this 2$^{nd}$ Embodiment, Rin (225) is coupled with Ro (226) and LSin (227) is not connected.

The NEWSYS SMSS Block System 3rd Embodiment

FIG. 37 shows the NEWSYS (10) SMSS (22) 3rd System Embodiment block schematic diagram.

As embodied herein the SMSS (22) interconnection with external subsystems relies on 8 I/O terminals, such as: a Sin (221) input, an Sb (222) output, an SPo (223) output, an Sco (224) output, an Rin (225) input, an Ro (226) output, an LSin (227) input and an So (228) output.

As further embodied herein the SMSS (22) block comprises, in this 3$^{rd}$ Embodiment, 7 devices, such as: a two inputs one output Latch (308), a first one input one output buffer circuit (301) a second one input one output buffer circuit (304), a third one input one output buffer circuit (310) a first MOSFET transistor Tsb (302), a second MOSFET transistor Tco (305) and a two terminals circuit DELAY (310).

As yet embodied herein the buffer (301) buffers the signal from Sin (221) to the gate of Tsb (302), which has its drain coupled to Sb (222) and its source coupled to GND (100). Buffer (310) has its input coupled to Sin (221) via the DELAY (309) circuit and its output coupled to So (228). The Latch (308) has its S input coupled to LSin (227), its R input coupled to Sin (221) and it O-bar output coupled directly to the Tco (305) gate and via buffer (304) to SPo (223). The Tco (305) drain is coupled to Sco (224) and its source to GND (100).

The Rin (225) is coupled to Ro (226) in this 3$^{rd}$ Embodiment.

NEWSYS Operations Description

NEWSYS (10) relays on 12 internal functional blocks for being able to perform as a Timer, PWM Controller, PFC Controller, and high power devices Driver, while reducing the parts count size and cost in many applications.

Six of the NEWSYS (10) internal functional blocks have been modified and/or upgraded in respect to the industry standard and a completely novel one, SMSS (22), has to be implemented, for achieving State of the Art Performances.

As further Embodied herein, the NEWSYS (10) Circuit System Preferred Embodiment, subject of this invention comprises, internally, 12 functional blocks, such as: UVLO&P (11), VRIB (12), DR (13), SPWM Logic (14), OSC (15), SVRB (16), SCsF (17), EA (18), VL (19), SPWMC (20), SSS (21) and SMSS (22).

The UVLO&P (11) functional block senses, via the Vcc (7) terminal the increasing supply voltage and when it reaches a pre-established amount the UVLO block "validates" the supply of all the other chip's internal blocks. Oppositely, for over-voltage/over-current protection purposes, if for any reason (i.e., over-current created by a short circuit or overheating) the Vcc (7) voltage amount goes lower than another pre-established amount, the UVLO block "shuts off" the internal supply.

As a part of this particularly NEWSYS (10) System Embodiment, the UVLO block has nothing special in respect to the Related Art's PWM/PFC classic controller circuits.

The VRIB (12) functional block provides, simultaneously, internal bias and high precision voltage references to all the other functional blocks, and externally, a very precise 5.0 Vdc supply source, via Vref (8), only when the UVLO&P (11) block allows these operations. The Vref (8) terminal performs two important operation in the external circuit: 1) when is "active" (i.e., "High" state, 5V) it supplies several external circuits, and 2) when it is "passive" (i.e., "Low" state, near 0V) it acts as a switch to GND, capable to discharge (to reset, directly or via diodes) all the capacitors included in its circuit. This operation is very important in Soft Start circuit situations, when the NEWSYS (10) has to start, always soft even (for any reasons) the controller is shut down, at short intervals.

Also, in this particularly NEWSYS (10) System Embodiment, has nothing special in respect to the Related Art's PWM/PFC classic controller circuits.

The DRV block (13) is a classic voltage shifter/buffer that amplifies, in phase, the 5V square wave signal outputted by the PWML block, up to the chip's supply (Vcc) voltage amount which also, in this particularly NEWSYS (10) System Embodiment, has nothing special in respect to the Related Art's PWM/PFC classic controller circuits.

The PWM Logic (14) block performs two important operation: 1) acting as a SR Latch ("Bistable" Circuit) which "activates" (i.e., switches to the "High" voltage level) the driver (DR) block only for the period of time starting from the moment when the "Set" pulse (incoming from the OSC block) falls near 0V and finishing at the moment when the "Reset" pulse (incoming from the PWMC block) reaches its "High" state (about 5V); 2) acting as a protection circuit that does not allows more than one output pulse per one oscillating cycle. This second function (secured by the third NOR gate of the PWML block) is a very important feature for the conversion systems operations security and reliability.

In respect to the "versatility aspect" respectively the possibility for a controller to work fast and reliable in Fixed and Variable Frequency as well as in Current Mode and Voltage Mode of operations, the classic "3 NOR Gates PWM Logic Latch" (i.e., the one used in the UC384x system) has two significant limitations:

This system allows for Fixed Frequency, only
This system skips pulses in Voltage mode of operations.

The NEWSYS (10) PWM Logic 2nd and 3rd Embodiments have eliminated this disadvantage and when all blocks are synchronized be the SMSS (22) block, the second disadvantage is eliminate, as well.

The OSC block (15) start oscillating as soon as an external Rt/Ct timing circuit, supplied from Vref (8) (or other DC source) reaches, at OSC (4) terminal, a voltage amount exciding the "Vref4" amount (typically 3.2V) applied to the OCH comparator's reference input. At that moment, by reversing its output state, the OCH comparator switches the "2 NOR Latch" circuit's output "High", the MOSFET transistor (M) is "activated" and start discharging the timing capacitor (Ct) via the constant current sink "CS" (typically 6-8 mA) until the voltage at pin 4 (OSC) decays lower than the "Vref5" amount (typically 1.4V), when now the "OCL" comparator reverses its output state, resetting the "2 NOR Latch" circuit's output back to its "LOW" state. In this way the OSC block oscillates for an indefinite time (until Vref shuts off) generating, internally, a "Set" square pulse to the S input of the PWML block, during the Ct discharge time, as FIG. 49A shows, and externally, a linear voltage ramp at pin 4 (OSC), as FIG. 49 B shows.

NEWSYS (10) oscillator block OSC (15) has two improvements in respect to the industry standard: 1) it comprises a $3^{rd}$ comparator capable to deliver synchronized signals for precise 50% duty cycle operations; and 2) providing a Sync signal at its SVR (152) output for improving the "skipping pulse" inconvenient and allow for lower duty cycle and higher accuracy in PWM/PFC operations.

The SVRB Block (16) is a significantly upgraded Synchronized Voltage Ramp Buffer that delivers the oscillator's OSC (15) voltage ramp in such a manner that allows the Reset pulse, delivered by the SPWMC (20) to be "synchronized" with the Set pulse delivered by the OSC (15) block and increase, dramatically the control accuracy in Voltage Mode of Operations.

In respect to the "classic" external VRB circuits using an NPN transistor, besides the synchronization advantage, the SVRB (16) solution features more precision and consistency in operations an save 3 external parts, in many applications.

The SCsF Block (17) is also a significantly upgraded Synchronized Current Spike Filter Circuit, that eliminates the short (about 100 nS) spikes that appears at Is (3) input when the converter's inductor works in Continues or Critical Mode of operations. The SCsF (17) solutions presented in the 2nd and 3rd Embodiments are net superior to the "classic' RC circuit described at the Prior Art section, because do not introduce any distortion or delay to the inputted signal and as a big plus, it saves 2 parts of the external circuit.

The EA block (18) is an open collector (pull-down) operational amplifier using, usually a 1 mA pull-up current sink, for allowing EAout (1) to be also used as a external pull-down input control electrode. This pin is typically use for external soft-start of fast shut down circuits.

Its non-inverting input is coupled to an internal 2.5V reference (Vref2), its inverting input is coupled to EAin (2) and its output is coupled to pin EAout (1).

As a generic rule, EAout (1) voltage is directly proportional (i.e., in phase) with the controller duty cycle, so in other words, higher voltage at EAout (1), means larger duty cycle ratio, larger current in the external MOSFET buffer and higher output voltage. When EAout (1) voltage is lower that (1V) the controller is shut-down.

Oppositely, EAin (2) being the "inverting" input, will shut down the controller output when reaches voltage higher than 2.5V. The EA (18) has a very high gain, being able to "feel" voltage variations less than 10 mV.

NEWSYS (10) includes an internal compensation circuit that provides more stability and eliminate the need for two external parts, in some applications.

The VL Block (19) is a voltage limiter passive circuit including three diodes and two resistors which performs three important jobs in this system: 1) Clamping the input voltage to maximum 1V, in order for the PWMC to reset immediately the PWML output, when the amount of voltage in pin 3 (Is) exceeds 1V; 2) Creating a 1V threshold (i.e., a silicon diode has a voltage threshold of about 0.5V, so 2 diodes create a threshold around 1V) in respect to pin 1 (EAout) in order for the input voltage to remain near 0V when the amount of the voltage in pin 1 (EAout) is less than 1V; 3) Dividing (resistively) in ⅓ ratio the voltage amount at pin 1 (EAout) in order to allow a larger voltage variation range (0V up to about 4V) at pin 1 (EAout) versus 0V to 1V variation at the PWMC input, (i.e., more precision in control).

The voltage limiter block (19) 1) limits (clamps) the SPWMC (20) reference input voltage at one volt, in order for the controller to shut down immediately if the voltage signal at Is (3) exceed 1V; 2) using two silicon diodes (about 1V threshold) connected in series in the EAout (1) circuit make the controller to do not "feel" voltages lower than 1V at Vout (1) fact that make sure the controller is completely shut down even EAout (2) is pulled down to GND (100) via a diode or a transistor (i.e., voltage threshold 0.5-0.7V); 3) the two resistors divider reduce at ⅓ ratio the SPWMC (20) reference input voltage in respect to the EAout voltage, fact that offers more accuracy in the PWM operations.

The SPWMC Block (20) The PWMC block resets (switch near 0V) the PWML block's output at any time when the amount of voltage received in one of its input coupled to pin 3 ("Is") is higher than the voltage received in the other input, coupled to pin 1 (EAout) via a "voltage limiter" circuit, including diodes and resistors.

The SSS Block (21) is the Sync Soft Start circuit that works similarly to the external Soft Start presented at the Prior Art section.

NEWSYS (10) has significant improvements presented in two Embodiments, in respect to the Related Art. Besides saving four external parts, the SSS (21) is controlling simultaneously, the EAout (1) and the EAin (2) terminals eliminating the risk for the controller to shut down, during its soft start cycle.

The SMSS Block (22) is the "brain" of the entire Sync Switching Circuitry for improving the controller operations speed and increases the control accuracy.

The "3 NOR Gates PWM-LATCH" "Truth Table" (see FIG. 18, PWM-LATCH) shows that the Latch's output ("Y") is "High" (Logic "1") only when its both inputs, "Set" ("S") and "Reset" ("R") are "Low" (Logic "0"), which means that each time when the "Set" pulse gets "High" (Logic "1") the PWM LATCH's output (and implicitly the DRV's output) goes in "Low" (near 0V) so, in other words, the UC384x chip is not capable to work in a "Variable Frequency" mode of operation, but in "Fix Frequency" mode, only.

When the "Set" pulse falls to its "Low" state (Logic "0"), the "Reset" pulse must be already in its "Low" state (Logic "0") in order for this specific "3 NOR Gates PWM-LATCH" system to allow the next DRV output pulse.

Therefore, without the SMSS (22) Sync Switching System, the controller may "skip" driving pulses in some situations, especially when a fraction of the OSC voltage ramp is overlapped to the current sense signal, at the pin 3 (Is) and/or a Voltage Mode of operation circuit is executed by this controller.

The NEWSYS Bistable Circuit System Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 38 shows the NEWSYS (10) Bistable Circuit System Preferred Embodiment, as a subject of this invention.

As further embodied herein, the Bistable Circuit System Preferred Embodiment, subject of this invention, comprises 4 devices (except the supply source), such as: a NEWSYS (10) controller circuit, a first push button setting switch SwS (401), a second push button resetting switch SwR (402) and a 24V/100 mA bulb Bl (403).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly Bistable Circuit System Embodiment the NEWSYS (10), main subject of this invention, has its EAout (1) coupled to GND (100) via SwR (402), EAin (2) coupled to GND (100), Is (3) coupled to GND (100), OSC (4) coupled to Vref (8) via SwS (401), internal GND (5) coupled to GND (100), DRV (6) is coupled to GND via Bl (403), Vcc (7) is coupled to a 9V-20V (in respect to GND) external DC source and Vref (8) coupled to Osc (4) via SwS (401).

Description of Operations

As yet embodied herein, this particularly Bistable Circuit System Embodiment, subject of this invention, operates as follows:

a) The system is considered being already supplied by a 9V-20V DC source for a period of time longer than the controller's internal start-up total operations time (i.e., about 10 mS).

b) Activating SwS (401) for a short period of time, the Osc (4) voltage amount will reach the Vref1 amount (i.e., 5V) witch is higher than the Vref4 (124) amount (i.e., 3.2V), fact that create the means for the OSC (15) to start delivering a Set pulse to PWM Logic (14) and to activate Td (255).

c) Deactivating SwS (401), Td (255) is able to decrease the OSC (4) voltage to an amount lower than Vref3 (123), (i.e., 1.4V), fact that create the means for the OSC (15) to switch its Set pulse delivered to SPWM Logic (14) down to its "Low" state, allowing DRV (6) to switch to its "High" level (i.e., about the DC supply source voltage amount) and to deliver supply voltage to the bulb Bl (403).

d) From this moment further, since NEWSYS (10) PWM Logic (14) block could not be reset by the OSC (15) Set pulse (i.e., un-like the way UC384x operates), so in other words, Bl (403) still lights, no matter how many times the SwS (401) push button switch is pressed.

e) As soon as SwR is Activated, EAout (1) goes "Low", the SPWMC (20) output R (204) goes "High" resetting (i.e., pushing near 0V) the SPWM Logic (14) and DRV (13) outputs, ceasing the bulb Bl (403) supply, until the next time when SwS (401) push button switch is pressed.

f) For safety reasons, if both switches SwS (401) and SwR (403) are pressed, simultaneously, the SwR (403) resetting switch will "prevail" (i.e., the "Master Switch"), and now power will be delivered to the circuit load, respectively Bl (403).

References to the Related Art:

This particularly Bistable Circuit System Embodiment example is more reliable and uses less circuit's parts count than a "555 Timer" typical application.

The NEWSYS Monostable Circuit System Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 39 shows the NEWSYS (10) Monostable Circuit System Preferred Embodiment, as a subject of this invention.

As further embodied herein, the Monostable Circuit System Preferred Embodiment, subject of this invention, comprises 6 devices (except the supply source), such as: a NEWSYS (10) controller circuit, a push button setting switch SwS (401), a first timing resistor Rt1 (404) a second timing resistor Rt2 (406) a timing capacitor Ct (405) and a 24V/100 mA bulb Bl (403).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly Monostable Circuit System Embodiment the NEWSYS (10), main subject of this invention, has its EAout (1) coupled to EAin (2) via Rt2 (406), EAin (2) is also coupled, simultaneously, to OSC (4), to GND (100) via Ct (405) and to Vref (8) Via Rt1 (404), Is (3) coupled to GND (100), OSC (4) coupled to GND (100) via Ct (405) and to Vref (8) via Rt1 (404), internal GND (5) coupled to GND (100), DRV (6) is coupled to GND via Bl (403) and Vcc (7) is coupled to a 9V-20V (in respect to GND) external DC source.

The push button switch SwS (401) is coupled across Rt1 (404).

Description of Operations

As yet embodied herein, this particularly Monostable Circuit System Embodiment, subject of this invention, operates as follows:
a) The system is considered being already supplied by a 9V-20V DC source for a period of time longer than the controller's internal start-up total operations time (i.e., about 10 mS).
b) The Rt1 (404) and Rt2 (406) resistive amount values are calculated in such a ratio for their circuit to limit (as a resistive divider) the voltage amount of the EAin (2) and OSC (4) terminals at about 2.8V, voltage safe enough (i.e., sufficiently higher than the 2.5V delivered by Vref2 (122) at the non-inverting input of EA (18) for keeping EAout (1) "LOW", until an external circuit "brakes" this balance. (Note: voltage gap references offer precisions down to less than 10 mV with very good temperature stability.)
c) At 2.8V the OSC (4) input provides to OSC (16) block an amount of voltage "between" its internal oscillating reference voltages (i.e., Vref3 (123) is 1.4V and Vref4 (124) is 3.2V) so the OSC (15) block is not able ether to deliver a Set pulse to the SPWM Logic (14) block, and/or to activate its discharging transistor Td (255), unless an external circuit provides, at OSC (4) input an amount of voltage higher than 3.2V.
d) Activating SwS (401) for a short period of time, the Osc (4) voltage amount will reach the Vref1 amount (i.e., 5V), fact that create the means for the OSC (15) to start delivering a Set pulse to PWM Logic (14) and to activate Td (255).
e) The bulb BL (403) lights for a pre-established time (i.e., depending on Rt, Ct values amount) and will, eventually, "shut off" when the "smoothly" increasing voltage at the EAin (2) and OSC (4) exceed 2.5V.
f) The cycle is repeated, indefinitely, for each time the SwS (401) push button switch is pressed (Activated)

References to the Related Art:

This particularly Monostable Circuit System Embodiment example is more reliable and uses less circuit's parts count than a "555 Timer" Monostable typical application.

The NEWSYS Astable Circuit System Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 40 shows the NEWSYS (10) Astable Circuit System Preferred Embodiment, as a subject of this invention.

As further embodied herein, the Astable Circuit System Preferred Embodiment, subject of this invention, comprises 5 devices (except the supply source), such as: a NEWSYS (10) controller circuit, a timing resistor Rt (404) a duty cycle adjusting resistor Rdc (407) a timing capacitor Ct (405) and a 24V/100 mA bulb Bl (403).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly Astable Circuit System Embodiment the NEWSYS (10), main subject of this invention, has its EAout (1) unconnected, EAin (2) coupled to GND (100), Is (3) coupled to GND (100) via Rdc (407), OSC (4) coupled to GND (100) via Ct (405) and to Vref (8) via Rt (404), internal GND (5) coupled to GND (100), DRV (6) is coupled to GND via Bl (403) and Vcc (7) is coupled to a 9V-20V (in respect to GND) external DC source.

Description of Operations

As yet embodied herein, this particularly Monostable Circuit System Embodiment, subject of this invention, operates as follows:
a) Rt (404), Ct (405) creates the necessarily voltage ramp, at OSC (4) input for the controlled to generate, indefinitely a low or high frequency square wave signal to Bl, in a classic manner described above.
b) Rds (407) adjusts the output signal duty cycle, in a manner also described before (i.e., at low frequency, the system provides an "intermittent light warning signal" and at higher frequencies the eyes can see, the system may work as a simple "dimmer" circuit).

References to the Related Art:

This particularly Astable Circuit System Embodiment example is more reliable and uses less circuit's parts count than a "555 Timer" Astable typical application.

Additionally, the duty cycle of this circuit can be adjust, continuously, from 1% to 100% just by adjusting the value of resistor or voltage of the EAout (1) and/or, EAin (2) and/or Is (3) in/out terminals.

The NEWSYS Intruder Alarm Circuit System Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 41 shows the NEWSYS (10) Intruder Alarm Circuit System Preferred Embodiment, as a subject of this invention.

As further Embodied herein, the Intruder Alarm Circuit System Preferred Embodiment, subject of this invention, comprises 22 devices (except the supply source), such as: a NEWSYS (10) controller circuit, a start/reset switch S/RSw (421), a bulb BI (422), a sound alarm speaker/horn H (423), a MOSFET transistor M (424), a first diode D1 (425), a second diode D2 (428), a third diode D3 (432), a fourth diode D4 (434), a fifth diode D5 (440), a first timing resistor Rt1 (425), a second timing resistor Rt2 (430), a third timing resistor Rt3 (433), a fourth timing resistor Rt4 (439), a duty cycle resistor Rdc (429), a control resistor Rct (436), a first timing capacitor Ct1 (427), a second timing capacitor Ct2 (431), a third timing capacitor Ct3 (435), a first "door open" sensing switch DSw1 (438), a second "door open" sensing switch DSw2 (442), a first "window open" sensing switch WSw1 (437), and a second "window open" sensing switch WSw1 (441).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly Intruder Alarm Circuit System Embodiment the NEWSYS (10), main subject of this invention, has its EAout (1) connected to the anode of D2 (428) which has its cathode coupled, simultaneously, to one terminal of Ct1 (427), one terminal of Rt1 (425) and the anode of D1 (425). The cathode of D1 together with the other Rt1 (426) terminal are coupled to Vref (8) and the other terminal of Ct1 is coupled to GND (100). EAin (2) coupled simultaneously to GND (100) via Ct2, to Vref via Rt2 and to the anode of D3 (432) which has its cathode coupled to DRV (6). Is (3) coupled to GND (100) via Rdc (429). OSC (4) is coupled, simultaneously to the cathode of D4, the cathode of D5 and via the parallel circuit of Rct (436), Ct3 (436) to GND (100). The anode of D4 (434) is coupled to Vref (8) via Rt3 (433) and to GND (100) via the series circuit of WSw1 (437), DSw1 (438). The anode of D5 (440) is coupled to Vref (8) via Rt4 (439) and to GND (100) via the series circuit of WSw2 (441), DSw2 (442).

As yet embodied herein, this particularly Intruder Alarm Circuit System Embodiment, subject of this invention, is capable to manage, in a specific order, several operations, such as:

a) In car intruder alarm situation, after switching ON the start/reset switch S/RSw (421) the car's driver needs 5-15 second to leave the car and close the door without starting the alarm, so therefore, the first "Timing Circuit" comprising Ct1(427), Rt1(426), D1 (425) and D2 (428) (i.e., a typical Soft Start circuit, in which the Qss has been replaced with D2) will keep "LOW" the EAout (1) and the DRV (6) output for that short time, even one or more doors are open.

b) During the time all doors and windows are closed, (this system allows for as many as needed doors and widows to be protected, just by attaching an extra three low cost components circuits, such as a resistor a diode and a switch) the OSC (4) input is kept at low (less than 1V) voltage by the sensing switches circuitry, via D4 (434) and/or via D5 (440) so the OSC (4) input does not have sufficient voltage for NEWSYS (10) to have a Set pulse and deliver a High voltage at DRV (6).

c) If any door or a window is opened, Ct (435) will be softly charged via ether Rt3 (433), D4 (434) and/or Rt4 (439) D5 (440), and after a second period of time (i.e., 5-10 seconds, determined by Rt3 (433) and Ct3 (435) for the car's owner to be able to reset the alarm), if the "Intruder" is not able to switch "OFF" the "hide" (by the car's owner) reset switch S/RSw (421) than the DRV (6) output goes "HIGH" and the Alarm starts.

d) A third "timer circuit" comprising Rt2 (430), Ct2 (431) will Shut Down the Alarm when the voltage at EAin (2) will exceed 2.5V (i.e., after 1-2 minutes, based on the RC parts value) only if all the doors and windows are back closed.

e) For repenting these cycles, indefinitely, in the same order and timing condition, at each "reset" cycle, Ct1 (427) is discharged by Vref (8), Ct3 by the doors/windows sensing switches and Ct2 is discharged, via D3, each time when DRV (6) goes "LOW".

References to the Related Art:

This particularly Intruder Alarm Circuit System Embodiment example is more reliable, offers more "timing operations", and uses less and lower cost circuit's parts than the "555 Timer" Intruder Alarm solution.

The NEWSYS Battery Charger Circuit System Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 42 shows the schematic diagram of a NEWSYS (10) Battery Charger Circuit Preferred Embodiment, as a subject of this invention.

More particularly, FIG. 42 shows a "Lithium Ion" battery charger, which includes a relatively complex "4 steps charging process", in which the 4 operations have to be executed in a specific order (i.e., automation/robotics application) such as 1. Slow Charging Conditioning Current, 2. Fast Charging High Current, 3. Constant Voltage Constant Current Charging, and 4. Stop Charging.

As further Embodied herein, the Battery Charger Circuit Preferred Embodiment, subject of this invention, comprises 22 devices (except the supply source), such as: a NEWSYS (10) controller circuit, a battery Batt (471), a first NPN transistor Q1 (470), a second NPN transistor Qcc (461), a PNP transistor Q2 (468), a first diode Dcc (463), a second diode Dev (460), a sense resistor Rs (472), a first resistor Rq1 (467), a second resistor Rq2 (469), a third resistor Rcc2 (466), a fourth resistor Rdc2 (465), a fifth resistor Rbf (454), a sixth resistor Rcc3 (462), a seventh resistor Rcc1 (457), a eighth resistor Rev (459), a ninth resistor Rsd1 (454), a tenth resistor Rsd2 (455), a timing resistor Rt (451), a voltage threshold resistor Rthd (452), a filtrating capacitor Cf (453), and a timing capacitor Ct (456).

As still embedded herein, NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embedded herein, in this particularly Battery Charger Circuit Embodiment the NEWSYS (10), main subject of this invention, has EAout (1) terminal coupled to the Qcc (461) base, which has its emitter coupled to the positive terminal of Batt (471) via Rcc2 (466) and its collector coupled to the controllers Vcc (7) terminal which is also directly coupled to the positive terminal of the supply source, Vcc. EAin (2) is coupled to GND (100) via Rsd2 (455) and simultaneously, to one terminal of Rsd1 (454) and one terminal of Rev (459). The other Rev (459) terminal to the anode of Dev (460) has its cathode coupled to Q1 (470) collector. The other Rsd1 (454) terminal is coupled, simultaneously, via Rbf (464) to Batt (471) positive terminal, to GND (100) via Cbf (458) and via Rt (451) to OSC (4). Is (3) is coupled, via Rdc (465) to Batt (471) negative terminal, which is coupled to GND (100) via Rs (472). OSC (4) is coupled to one terminal of Rt (451) and to GND (100) via Ct (456), which has the threshold resistor Rthd (452) coupled in parallel. GND (5) is coupled to the system ground GND (100). DRV (6) is coupled, via Rq1 (467) to the base of Q1 (470) which has its emitter coupled to GND (100) and its collector coupled, directly to Dev (460) cathode and via Rq2 (469) to the base of Q2 (468), which has its emitter coupled to Vcc (7) and its emitter coupled to Batt (471) positive terminal. Vcc (7) is coupled the positive output of a Vcc voltage source. Vref (8) is not used, in this particularly circuit. Rcc1 (457) is coupled across Qcc (461) base and collector terminals, Dcc (463) anode is coupled to Qcc (461) base and its cathode to Batt (471) positive terminal. Cf. (453) is coupled across Vcc (7) and GND (100).

Description of Operations

When a Lithium Ion battery connected to a "charger system" is already significantly discharged (for example a 9V battery which delivers only 5V) the "smart charger system" has to "sense" this highly discharged stage and, in order to do not damage the battery, it has to deliver a low current (about 10% of the "fast charging current") until the battery reaches its "safe high current charging" voltage.

For simplifying the presentations (i.e., there are many different kind of Lithium Ion batteries having different maximum voltage and different conditioning/fast charging voltage thresholds), by assuming that a battery has is "full charge" voltage at 9V, its "safe high current charging" voltage starts at 7V, and when is connected for recharging it has only 5V, than the charging procedure as to be executed as follows:

1. A Slow Charging Conditioning Current circuit charges the battery until 7V.

2. Fast Charging High Current from 7V to 8.5V
3. Constant Voltage Constant Current Charging between 8.5V to 9V
4. Stop Charging at 9V.

1. The "Conditioning" Operation

If the NEWSYS (10) charging system is supplied with 12 Vdc, provided by a Vcc source filtrated by Cf (453) and a 9V battery, pre-discharged down to 5V, is connected for charging, the NEWSYS (10) controller will not deliver any signal at its DRV (6) output until the Batt (471) it reaches 7V because of the divider Rt (451), Rthd (452), supplied directly from Batt (471) is precise calculated to provide at OSC (4) terminal the oscillator "start" voltage (i.e., 3.2V) only when the divider supply reaches 7V.

Therefore, the battery Batt (471) will be supplied, with a small and constant current, from the Vcc source (12V), via the Qcc (461) NPN transistor, for which Rcc1 (457) acts as a "pull up" resistor and Dcc (463) together with Rcc2 (466) limit the transistor current up to about 50 mA, until Batt (471) reaches 7V.

2. The "Fast Charging" Operation

When Batt (471) reaches 7V, the NEWSYS (10) controller start oscillating and, via Rq1 (467), Q1 (470), Rq2 (469) and Q2 (468) buffer circuit delivers high frequency square wave pulses to Batt (471). At this time NEWSYS (10) operates in "Current Mode" (and a very small internal voltage ramp signal) so, since the voltage threshold at the current sense input Is (3) is 1V, for an Rs (472) sense resistor of 2 ohms, the maximum current delivered to the battery during the Fast Charging period will be 500 mA (i.e., 10 times larger than the Conditioning current).

3. The "Constant Voltage Constant Current" Charging Operation

Supplied in pulses by the buffer transistor Q2 (468) the battery Batt (471) positive terminal will have a "voltage trip" in respect to GND (10) of "2 ohms×0.5 A=1V".

The Rsd1 (454), Rsd2 (455), resistive divider, supplied from Batt (471) via the Rbf (464), Cbf (458) filter, is precise calculated for EAin (20) to do not allow voltage higher than 9V in respect to GND (100) at that contact point (i.e., the Batt (471) positive terminal), so the NEWSYS (10) will start working in "Constant Voltage Constant Current Mode", as soon as Batt (471) reaches 8V, until Batt (471) reaches 8.5V, when the voltage remains constant, however the current starts decreasing, reaching a near 0 values when Batt (471) reaches 8.999V.

4. The "Stop Charging" Operation

As closed to 9V goes the Batt (471) voltage, as low will be the current delivered by the NEWSYS (10) charging circuit to Batt (471) and, since NEWSYS (10) has a very precise error amplifier EA (18) sub-circuit, it may takes a few hours until the 9V output will be reached, at 10 mV precision level. Therefore, for a faster "Stop Charging" operation a "hysteresis circuit" has been attached to the system, respectively Rev (459), Dev (460). This circuit decrease, in a very small ratio (1%-2%), based on the Rev (459) value in respect to Rsd1 (454), the EAin (2) voltage, each time when the Q1 (470) collector is "Low", so after each oscillator cycle, the EAin (2) voltage will increase with a "small increment" until reaches a value higher than 2.5V (i.e., 2.51V), which will force EAin (2) to "Shut Down" the NEWSYS (10) output signal.

Finally, when EAin (2) gets "High" the EAout (1) gets "Low" and via Rcc3 (462), which act as a "pull down" resistor, Qcc (461) stops also delivering "Conditioning" current to Batt (471), so when Batt (471) is fully charged, reaching 9.0V, the NEWSYS (10) system stops delivering any charging current to Batt (471).

The NEWSYS Motor Controller Circuit Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 43 shows the schematic diagram of a NEWSYS (10) Motor Controller Circuit Preferred Embodiment, as a subject of this invention.

As further Embodied herein, the Motor Controller Circuit Preferred Embodiment, subject of this invention, comprises 11 devices (except the supply source), such as: a NEWSYS (10) controller circuit, a 12V/100 mA motor M (489), a tahogenerator (490) able to deliver a precise DC voltage direct proportional to the motor M (489) RPM, a filtrating capacitor, Cmf (488), a diode (487) a current sense resistor Rim (486), a compensation resistor Rc (484, a compensation capacitor Cc (485), a timing resistor Rt (482), a timing capacitor Ct (483) and a potentiometer Pvm (481).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly Motor Control Circuit Embodiment the NEWSYS (10), main subject of this invention, has its EAout (1) terminal coupled to EAin (2) via a parallel circuit Cc (485) and Rc (484). EAin (2) is also coupled to the middle terminal of the potentiometer Pvm (481). Pvm (481) has one terminal coupled to GND (100), and the other terminal is coupled to one terminal of TG (490). The other terminal of TG (490), is coupled to GND (100). Is (3) is coupled directly to one terminal of M (489) and via the sense resistor Rlm (486) to GND (100). OCS (4) is coupled to GND (100) via Ct (483) and to Vref (8) via Rt (482). GND (5) is coupled to the system ground GND (100). DRV (6) is coupled to the anode of Rd (487), which has its cathode coupled directly to the other terminal M (489), and via Cmf to GND (100). Vcc (7) is coupled to a 12 volts DC source Vdc. Vref (8) is coupled via Rt (482) to OSC (4).

Description of Operations

When a 12 Vdc supply is applied to Vcc (7), the NEWSYS (10) controller will start delivering a square waves signal to M (489) via Rd (487) and filtrated by Cfm (488). The maximum current that the motor M (489) will reach is determined by Rlm (486), which, actually, sets the maximum duty cycle of NEWSYS (10). The momentarily duty cycle is control by NEWSYS (10) Error Amplifier (18) via EAin (2) input which is supplied with the pre-established voltage threshold determined by the position of Pvm (481). The parallel circuit Rc (484), Cc (485) coupled across EAout (1) and EAin (2) acts as a compensation circuit, which helps for a smooth control of the M (489) rotation speed.

Since TG (490) provides an accurate DC voltage amount direct proportional with the M (489) rotation speed by adjusting Pvm (481) to any voltage ratio from 0V up 2.5V, the NEWSYS (10) controller is able to control the motor rotation speed very precise down to a few RPM.

The NEWSYS SCR/R-SCR Control Circuit Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 44 shows the schematic diagram of a NEWSYS (10) SCR/R-SCR Control Circuit Preferred Embodiment, as a subject of this invention.

As further Embodied herein, the NEWSYS (10) SCR/R-SCR Circuit Preferred Embodiment, subject of this invention, comprises 14 devices such as:

A NEWSYS (10) Control Circuit a first MOSFET transistor M1 (510), a second MOSFET transistor M2 (512), a first bulb Bl1 (509), a second bulb Bl2 (511), a first NPN transistor Q1 (504), a second NPN transistor Q2 (507), a timing capacitor Ct (506), a time adjusting potentiometer Pfc (505), a first resistor Rq1 (503), a second resistor Rq2 (508), a voltage supply resistor (502), a four diodes bridge rectifier BR (501), and a AC voltage source Vac (500).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly NEWSYS (10) SCR/R-SCR Circuit Embodiment the NEWSYS (10), main subject of this invention, has:

EAout (1) terminal is not used.

EAin (2) is coupled to GND (100).

Is (3) is coupled to Vref (8) via the resistor (502) and to the collector of Q1 (504).

OCS (4) is coupled via Ct (500) to GND (100) and via Pfc (505) to Vref (8). The middle terminal of Pfc (505) is coupled to one of the other two terminals.

GND (5) is coupled to the system ground GND (100).

DRV (6) is coupled to the gate of the MOSFET transistor M1 (510) and via Rq2 (508) to the base of the transistor Q2 (507), which has its collector coupled to OSC (4) and its emitter coupled GND (100). The drain of M1 (510) is coupled to the M2 (512) gate, and via Bl1 (509) to the positive terminal of BR (501). The source of M1 (510) is coupled to GND (100). The M2 (512) source is also coupled to GND (100) and its drain is coupled to the positive terminal of BR (501) via Bl2 (511).

Vcc (7) is operatively (i.e., in respect to GND (100)) coupled to a Vcc DC voltage supply source.

Vref (8) is coupled to one terminal of Pfc (505) and via the resistor (502) to Is (3) terminal.

Q1 (504) has its emitter coupled to GND (100), its collector coupled to Is (3) and its base is coupled to the positive terminal of BR (501) via Rq1 (503). The AC generator Vac (500) its operatively coupled to BR (501).

Description of Operations

When a 12 Vdc supply is applied to Vcc (7), the NEWSYS (10) controller will deliver a 5V supply via its Vref (8) output, after performing its soft start cycle. Ct (506) will be smoothly charge via Pfc (505) until the OSC (15) block reaches its high threshold level (i.e., 3.2V) for starting to deliver its Set pulse to the SPMW Logic (14) block. As soon as Ct (506) is discharged down to a lower level then Vref3 (123) reference (i.e., 1.4V) by the internal discharging transistor Td (255), the CR (251) comparator will end the Set pulse and the voltage of DRV (6) will get "High". When DRV (6) gets "High" via Rq2 (508) will activate the switching transistor Q2 (507) which will keep Ct (506) at a lower voltage level during the entire time DRV (6) is "High". Pfc (505) its sized in such a manner for the timing circuit Pfc (505), Ct (506) to have a time constant equal with the Vac (500) half cycle time period (i.e., 10 mS for 50 Hz and 8.3 mS at 60 Hz). In other words, if Pfc (500) potentiometer its set at its maximum value the output DRV (6) will last for the entire AC generator semi-cycle and if Pfc (500) is set for a shorter time the DRV (6) pulse will last for a proportional lower time period. Q1 (504) acts as a "0V detector switch" that keeps Is (3) terminal near the GND (100) voltage (i.e., 0V) for the whole period of time when the voltage the BR (501) positive terminal its higher than 1V, so in other words, the Is (3) terminal gets "High" between only when BR (501) output reaches voltage amount near 0V. In this way NEWSYS (10) controls M1 (510) in a "thyristor's or SCR's way" mode of operations by allowing its buffer to close the load Bl1 (509) circuit starting from any moment (i.e., 180 degrees phase control) during the rectified sine-wave semi-cycle and resetting the buffer (i.e., no more load current) at any time when the input supply voltage reaches 0V. In other words, in this particular application the NEWSYS (10) buffer can be either a thyristor (SCR), a MOSFET transistor, a bipolar transistor or even a triac with the same result: the load Bl1 (509) current's shape will look like the one illustrated in FIG. 17C, respectively the classic way thyristor's are controlled.

By acting as an inverting buffer, M2 (512) will close the Bl2 (511) circuit in an opposite phase in respect to M1 (510) so the Bl2 (511) current's shape will look like the one illustrated in FIG. 17D, Reverse SCR (R_SCR) shape, which can be successfully applied when large value capacitive loads have to be smoothly charged.

The NEWSYS SCR-ZVD Control Circuit Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 45 shows the schematic diagram of a NEWSYS (10) SCR-ZVD Control Circuit Preferred Embodiment, as a subject of this invention.

As further Embodied herein, the NEWSYS (10) SCR-ZVD Control Circuit Preferred Embodiment, subject of this invention, comprises 12 devices such as:

a NEWSYS (10) Control Circuit, a DC Motor M (528), a Silicon Control Rectifier SCR (529) (Thyristor), a AC generator Vac (500), a four diodes bridge rectifier BR (501), a timing capacitor Ck (527), a timing resistor Rk (526), an NPN transistor Q (525), a base resistor Rq (522), a timing Pt (523) potentiometer having its middle terminal coupled to one of the other two terminals, a second timing capacitor Ct (524) and a push button switch SwS (521).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly NEWSYS (10) SCR-ZVD Control Circuit Preferred Embodiment the NEWSYS (10), main subject of this invention, has:

EAout (1) terminal is coupled to OSC (4) via Rk (526).

EAin (2) is coupled Vref (8) via Pt (523) and to GND (100) via SwS (521) having in parallel Ct (524).

Is (3) is coupled to GND (100).

OCS (4) besides being coupled to one terminal of Rk (526), it is coupled to GND (100) via Ck (527) and to the collector of the NPN transistor Q (525). Q (525) has its emitter coupled to GND (100) and its base coupled to the positive terminal of BR (501) via Rq (552).

GND (5) is coupled to the system ground GND (100).

DRV (6) is coupled to the gate of SCR (529), which has its cathode coupled to GND (100) and its anode coupled to the positive terminal of BR (501) via the bulb M (528).

Vcc (7) is operatively (i.e., in respect to GND (100)) coupled to a Vcc DC voltage supply source.

Vref (8) is coupled to EAin via Pt (523). Vac (500) its operatively coupled to BR (501).

Description of Operations

In this particular applications the M (528) is supplied with an an-filtrated rectified sine-wave from the positive output of BR (501) and the NEWSYS (10) controller circuit its supplied at Vcc (7) input with a filtrated DC voltage (i.e., obtained from the BR (501) positive supply terminal via an extra rectifier diode and a filtrating capacitor). The main purpose of this controller system is to not allow the SCR (529) buffer to start or cease the M (528) supply current at any time during a semi-cycle supply sine-wave, but only during the short time when the input supply wave reaches 0V, for avoiding current spikes and harmonics during the On/Off operations. The NEWSYS (10) duty is only to make sure that the SCR (529) does not starts and/or ceased the M (524) current "somewhere in the middle" of the supply wave.

The switching transistor Q (525) keeps the OSC (4) terminal and the Ck (527) voltage near 0V during the entire time when the BR (501) output voltage is higher than 1V so the OSC (15) block its able to deliver a Set pulse only during the time when the BR (501) output positive voltage is lower than 1 V. The Pt (523) and Ct (524) timing circuit (time constant larger than 10 mS) makes sure that by opening SwS (521) Stop switch the NEWSYS (10) controller will wait until the next 0V time of the BR (501) positive semi-cycle sine-wave supply until shutting down the buffer.

The NEWSYS Benistor MVC-EVC Control Circuit Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 46 shows the schematic diagram of a NEWSYS (10) Benistor MVC-EVC Control Circuit Preferred Embodiment, as a subject of this invention.

As further Embodied herein, the NEWSYS (10) Benistor MVC-EVC Control Circuit Preferred Embodiment, subject of this invention, comprises 13 devices such as:

A NEWSYS (10) Controller Circuit, a first MOSFET transistor M1 (548), a second MOSFET transistor M2 (550), a first bulb Bl1 (547), a second bulb Bl2 (549), an AC voltage source Vac (500), a four diodes bridge rectifier BR (501), an NPN transistor Q2 (545), a base resistor Rq2 (546), a timing capacitor Ck (543), a timing resistor Rk (544), a setting resistor Rv (541), and a setting potentiometer Pmvc (542), NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly NEWSYS (10) Benistor MVC-EVC Circuit Embodiment the NEWSYS (10), main subject of this invention, has its EAout (1) terminal coupled to OSC (4) via Rk (544). EAin (2) is coupled to the positive terminal of BR (501) via Rv (541) and to GND (100) via Pmvc (542), which has its middle connection also coupled to GND (100). Is (3) is coupled to GND (100). OCS (4) is coupled to GND (100) via Ck (543), via EAout (544) via Rk (544) and to Q2 (545) collector. The emitter of Q2 (543) is coupled to GND (100) and its base is coupled to DRV (6) via Rq2 (546). GND (5) is coupled to the system ground GND (100). DRV (6) is coupled to one terminal of Rq2 (546) and to the gate of M1 (548) which has its source coupled to GND (100) and its drain coupled to the gate of M2 (550) and to BR (501) positive terminal via Bl1 (547). M2 (550) source is also coupled to GND (100) and its drain coupled to BR (501) positive terminal via Bl2 (549). Vcc (7) is operatively (i.e., in respect to GND (100)) coupled to a Vcc DC voltage supply source.

Vref (8) is not connected, in this circuit.

Description of Operations

In this particular applications the Bl1 (547) and Bl2 (549) loads are supplied with an an-filtrated rectified sine-wave from the positive output of BR (501) and the NEWSYS (10) controller circuit its supplied at Vcc (7) input with a filtrated DC voltage (i.e., obtained from the BR (501) positive supply terminal via an extra rectifier diode and a filtrating capacitor if the supply voltage is lower than 20V). The main purpose of this controller system is to "modulate" the M1 (548) buffer's current in such a manner that Bl1 (547) current's of voltage's shape will look like the one illustrated in FIG. 17E, respectively the Benistor's Effective Voltage Control (EVC) mode of operation, and just by simply changing the phase, the M2 (550) MOSFET buffer to modulate Bl2 (549) current/voltage graph's shape as is illustrated in FIG. 17F, respectively the Benistor's Maximum Voltage Control (MVC) mode of operation.

Similarly to one of the previous presented embodiments, Q2 (545) its activated via Rq2 (546) by the DRV (6) output at any time when DRV (6) gets "High" for keeping the OSC (4) and the Ck (543) capacitor voltage near 0V, for each cycle. The Rv (541) and the Pmvc (542) divider circuit sets a voltage threshold (adjustable via Pmvc (542)) in respect to the variable rectified sine-wave outputted by BR (501) in such a manner for the buffers M1 (547) and M2 (549) to always start and/or cease their "ON" switching cycles, precisely at/from that threshold voltage. In this particular circuit the Rk (544) timing resistor is not coupled to the Vref (8) terminal but to the EAout (1) one terminal that provides no supply voltage when EAin (2) voltage amount exceeds 2.5V.

The Benistor's Maximum Voltage Control (MVC) mode of operation can be successfully applied, as a kind of very efficient "AC-PWM" control for some loads (i.e., motors) which require a higher peak voltage for operating properly, however, the RMS voltage value can be still adjusted in a 0 to 100% ratio, for being able to adjust smoothly the electrical energy delivered to the load and to do not allow the SCR (529) buffer to start or cease the motor M (528) supply current at any time during a semi-cycle supply sine-wave, but only during the short time when the input supply wave reaches 0V, for avoiding current spikes and harmonics during the On/Off operations. The NEWSYS (10) duty is only to make sure that the SCR (529) does not starts and/or ceased the M (524) current "somewhere in the middle" of the supply wave.

The switching transistor Q (525) keeps the OSC (4) terminal and the Ck (527) voltage near 0V during the entire time when the BR (501) output voltage is higher than 1V so the OSC (15) block its able to deliver a Set pulse only during the time when the BR (501) output positive voltage is lower than 1 V. The Pt (523) and Ct (524) timing circuit (time constant larger than 10 mS) makes sure that by opening SwS (521)

Stop switch the NEWSYS (10) controller will wait until the next 0V time of the BR (501) positive semi-cycle sine-wave supply until shutting down the buffer.

The NEWSYS ZVD Temperature Control Circuit Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 47 shows the schematic diagram of a NEWSYS (10) ZVD Temperature Control Circuit Preferred Embodiment, as a subject of this invention.

As further Embodied herein, the NEWSYS (10) ZVD Temperature Control Circuit Preferred Embodiment, subject of this invention, comprises 11 devices such as:

A NEWSYS (10) Controller Circuit, a MOSFET transistor M (569), a NPN transistor (565), a Heater Unit (561) comprising a heating resistor and a thermistor, a first diode D1 (564), a second diode D2 (566), a timing resistor Rt (567), a timing capacitor Ct (568), a base resistor Rq (563), a heat control potentiometer Pt (562), a four diodes bridge rectifier BR (501) and a sine wave AC generator Vac (500).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly NEWSYS (10) ZVD Control Circuit Embodiment the NEWSYS (10), main subject of this invention, has:

EAout (1) terminal coupled to OSC (4) via Rt (567). EAin (2) is coupled to Vref (8) via the two terminals Thermistor included in the Heater Unit (561), to the anode of D1 (564) and to GND (100) via the potentiometer Pt (562) which has its middle terminal coupled also to GND (100). The D1 (564) cathode is coupled to the cathode of D2 (566) and to Q (565) collector. The anode of D1 (566) is coupled to OSC (4).

The emitter of Q (565) is coupled to GND (100) and its base is coupled to the positive terminal of BR (501) via Rq (563). Vac (500) is operatively coupled to BR (501). Is (3) is coupled to GND (100). OCS (4) is coupled, directly to D2 (566) anode, via Ct (568) to GND (100) and via Rt (567) to EAout (1). GND (5) is coupled to the system ground GND (100). DRV (6) is coupled to the gate of the MOSFET M (569), which has its source coupled to GND (100) and its drain coupled to the positive terminal of BR (501) via the heating resistor of the Heating Unit (561). Vcc (7) is operatively (i.e., in respect to GND (100)) coupled to a Vcc DC voltage supply source. Vref (8) is coupled to EAin (2) via the two terminals Thermistor included in the Heater Unit (561).

Description of Operations

In this particular applications the Heater Unit (561) is supplied with an an-filtrated rectified sine-wave from the positive output of BR (501) and the NEWSYS (10) controller circuit its supplied at Vcc (7) input with a filtrated DC voltage (i.e., obtained from the BR (501) positive supply terminal via an extra rectifier diode and a filtrating capacitor if the supply voltage is lower than 20V). The main purpose of this controller system is to do not allow the MOSFET (569) switch to connect and/or disconnect the Heater Unit (561) into/from the BR (501) circuit to GND (100).

The resistive divider of the thermistor Th (as a part of the Heater Unit (561)) and the potentiometer Pt (562) creates a voltage threshold (adjustable, manually, via Pt (562)), which by reaching an amount higher than 2.5V shuts down the NEWSYS (10) output DRV (6). Since Th resistive value has an accurate variation versus temperature and the Newsys (10) error amplifier EAin (2) feature a very high gain by adjusting properly Pt (562) the NEWSYS (10) will be able to shut down the M (569) buffer at any time when the heating resistor RH included inside of the Heater Unit (561), the only other operations which remain to be done, are to secure the Start/Stop switching times, synchronized to the short period of time when the BR (501) output voltage goes lower than 1V amount and to create a small "hysteresis" at EAin (2) in order to create 20 to 50 mV increment that will help NEWSYS (10) to shut down the M (569) buffer at 1 to 5 degrees Celsius increments.

The Rt (567) resistor supplies the capacitor Ct (568) and OSC (4) only during the time when EAout (1) is high (respectively when the amount of voltage EAin (2) is lower than 2.5V) so in other words, the OSC (15) block cannot deliver a Set pulse during the time when the Heater Unit (561) temperature its higher than a pre-established range. The Q (565) transistor switch which is supplied in its base via Rq (563) will keep at a lower voltage, simultaneously, the OSC (4) input, via D2 (566) and the EAin (2) input during the time the BR (501) output voltage is higher than 1V. In this way, via D2 (566) the Q (565) transistor stops the OSC (15) block to deliver a Set pulse during the time when BR (501) output voltage is high and also, creates the necessary "hysteresis" at EAin (2).

The NEWSYS Universal/Off Line Input PFC Converter Circuit Preferred Embodiment

As embodied herein the present invention main subject relates to a Low Cost Ultra Versatile Mixed Signal Controller Circuit, NEWSYS (10) that is able to control many classic or novel systems circuits, to be used in the Power Management fields of industry.

FIG. 48 shows the schematic diagram of a NEWSYS (10) Universal/Off Line Input Converter Circuit Preferred Embodiment, as a subject of this invention.

As further Embodied herein, the NEWSYS (10) Universal/Off Line Input PFC Converter Circuit Preferred Embodiment, subject of this invention, comprises 26 devices such as:

a NEWSYS (10) Control Circuit, a low pass filter EMI (505), a four diodes rectifier bridge BR (504), a small value filtrating capacitor Cf1 (599), a snubber Inductor Ls (596), a snubber circuit first diode Ds1 (597), a snubber circuit second diode Ds2 (600), a snubber capacitor Cs (598), a fast recovery diode Do (601), a large value Bulk Capacitor (602), a resistive load Rl (603), a two coils (primary and secondary) oscillating Inductor Tr (593), a Mosfet transistor M (594), a sense resistor Rsense (595), a low voltage supply diode Dsu (591), a low voltage filtrating capacitor Csu (592), a starting resistor Rst (590), a driving resistor (589), a voltage reference filtrating capacitor Cr (588), a compensating capacitor Cc (585), a first voltage feedback resistor Rfb1 (583), a second voltage feedback resistor Rfb2 (584), an input voltage resistor Rvin (586), a voltage ramp resistor Rvr2 (587), a timing resistor, Rt (581), and a timing capacitor, Ct (582).

NEWSYS (10), main subject of this invention, is connected to the other parts of the system via 8 I/O terminals, such as: error amplifier output/input EAout (1), error amplifier input EAin (2), current sense input/output Is (3), oscillator input/output OSC (4), internal 0V ground GND (5), internal driver output DRV (6), voltage supply input Vcc (7) and voltage reference output/input Vref (8).

As still embodied herein, in this particularly NEWSYS (10) Universal Input PFC Converter Circuit Embodiment, the NEWSYS (10), main subject of this invention, has its EAout (1) terminal coupled to GND, via Cc (585).

EAin (2) is coupled to GND (100) via Rfb2 (584) and to the "hot" terminal of the resistive load Rl (603), which has the other terminal coupled to GND (100).

Is (3) is coupled to the positive terminal of BR (604) via Rvin (586) and, via Rvr2 (597) to the "hot" terminal of Rsense (595) which has the other terminal coupled to GND (100).

OCS (4) is coupled via Ct (582) to GND (100) and via Rt (581) to Vref (8) and to the "hot" terminal of Cr (588) which has the other terminal coupled to GND (100).

GND (5) is coupled to the system ground GND (100).

DRV (6) is coupled to the gate of the MOSFET transistor M (594) via Rdrv (589).

The MOSFET transistor M (594) has its source coupled to GND via Rsense (595) and its drain coupled, simultaneously, to the positive output of BR (604) via the primary coil of the oscillating Inductor Tr (593), to one terminal of the snubber capacitor Cs (598) and to the anode of Do (601). The Do (601) cathode is coupled to GND (100) via Rl (603), which is coupled in parallel with the output bulk capacitor Cf2 (602). Cs (589) has the other terminal coupled to Ds1 (597) cathode and Ds2 (600) anode. The anode of Ds1 (597) is coupled to the positive output of BR (604) via the snubber Inductor Ls (596) and the cathode of Ds2 (600) is coupled to GND (100) via Rl (603). Cf1 (599) is coupled across the output of BR (504), which has its negative output coupled to GND (100). The low pass filter EMI (605) is operatively coupled to the BR (504) input.

Vcc (7) is coupled to BR (504) positive output via Rst (590), to GND (100) via Csu (592) and to the cathode of Dsu (591), which has its anode coupled to GND (100) via the secondary coil of the oscillating Inductor Tr (593).

Vref (8) is coupled to GND (100) via Cr (588) and to OSC (4) via Rt (581).

Description of Operations

Introduction

As it has been mentioned at the Related art sections, because of many different "Large Signal Conversion Systems" topologies available in the Power Management industry's, such as "Fixed Frequency", "Variable Frequency", "Voltage Mode", "Current Mode", "Critical Conduction Mode", "Continues Mode" or "Discontinues Mode" of operations, the worldwide designers of "Small Signal Controller System" (i.e., the microchips system designers) did their best to "focus" their attention to just one of the above mention "Large Signal Converter" topologies, and to design a "specific application small signal controller system" capable to offer solutions offering the maximum "performance vs. cost", compromise.

Therefore, there are now hundreds of PWM and/or PFC controller circuits featuring, each of them, "very high" or "decent" performances in respect to each of the above mentioned mode of operations topologies (i.e., the UC384x is just a Fixed Frequency Current Mode PWM controller, MC33260 is a just a Variable Frequency PFC controller, MC33368 is just a Fixed Frequency PFC Controller and not a Current Mode PWM controller, etc.), however, none of these controller circuit, existing in the industry is capable able to perform decently and cost effectively, all the PWM/PFC Mode of Operation mentioned above.

For revealing the present invention versatility in respect all the above mentioned mode of operations, FIG. 48 illustrates the schematic diagram of a novel Conversion System, NEWSYS Universal/Off Line Input Converter Circuit Preferred Embodiment, as subject of this invention.

This embodiment proves that, by not changing anything in the "topology of the entire system" presented in FIG. 48, but only the amount value of a few different parts, in accordance to the designer's specific targeted application.

Generic Presentation of the Converter's Operations

Note: This presentation include all significant operations performed internally and externally by the NEWSYS (10) controller and all the other Large Signal Parts of the Converter included in this particularly circuit.

Similar to the Voltage/Current Mode-PWM/PFC Converters presented at the Related Art section the NEWSYS (10) Universal/Off Line Input Converter Circuit Preferred Embodiment, as subject of this invention, operates as following:

When an 85V-265V AC or DC generator is coupled to the EMI (605) low pass filtering circuit, the bridge rectifier BR (504) will output an un-stabilized DC voltage across Cf1 (599). If Cf1 (599) has a large value (i.e., bulk capacitor 100-470 uF) the BR (604) DC voltage will be filtrated. If Cf1 (599) has a small value (i.e., 100-220 nF) the voltage outputted by BR (604) will be un-filtrated (just rectified sine-wave) from the low frequency point of view however, Cf1 (599) will still help for filtrating the high frequency noise generated by the converter.

In both situations, the input voltage across the BR (604) remains "un-stabilized" however, because the NEWSYS (10) has the capability to reach duty cycle ratio from 100% (i.e., the DRV (6) remains "High" for unlimited time, similarly to the variable frequency circuits) down to less than 1%, at the converter output the DC voltage will be "stabilized", with the only difference, in case Cf1 is only 100 nF, the "ripples" across the load and its filtrating bulk capacitor will increase, up to 3-4V, amount which represent just about 1% at 400 Vdc output.

As further embodied herein, the UVLO (11) block senses the supply DC voltage delivered by the starting resistor Rst (590) to the NEWSYS (10) controller's Vcc (7) supply input terminal and when the voltage at Vcc (7) reaches the controllers higher threshold (i.e., 10V), the UVLO activates the Vref (12) block.

The Vref (12) block activates, all NEWSYS (10) internal and external (small signal) circuits delivering a 5.0V supply at Vref (8) terminal.

The DRV (13) block amplifies in voltage and current the 3.3-5V square wave logic signal incoming from the SPWM Logic (14) block output, "in phase" and up to the voltage amount of the supplying voltage (i.e., "rail to rail" output).

The SPWM Logic (14) block delivers a square-wave signal to the DRV (13) block only during the time when both of its Set/Reset inputs are "LOW". In order for this condition to be respected, it is necessary for simultaneously the Set pulse incoming from the OSC (15) block to be "LOW" and the Reset pulse incoming from the output of the SPWMC (20) block to also be "LOW". The "classic 3 NOR Logic Gates" Latch" is "a perfect match" for "Fixed Frequency Current Mode" applications, however, for the "Voltage Mode" and Variable Frequency" applications it needs significant improvements. In FIG. 32, it is illustrated a "Fixed Frequency" mode PWM Logic system which has been improved only with a synchronization system (the synchronization system will be further presented at the SMSS (22) block description) that allow the Reset pulse to get "Low" before the Set pulse reached its Low state (i.e., to respect the "three NOR Gates Latch: truth table). However, at FIG. 33, it was presented a "first version" of "variable frequency" mode of operation. The circuit which does this job comprises the Buffer (257) the switching MOSFET transistor T2s (286) and the resistor R2S. This circuit works as follows: when the first Set pulse gets "Low" and the Rest pulse is "Low" the NOR6

(282) output Y (143) gets "high" which, via the Buffer (287), activates T2S (286) witch keeps at "Low" state the NOR6 (282) S2 input (i.e., the Set input) during the entire period Y (143) is in "High" state. In other words, no matter how many times Set pulse goes "High" or "Low" the PWM Logic (14) block's output Y (143) will remain "High" until the Reset pulse will reverse its logic state. In FIG. 34, a similar circuit comprising the inverting Buffer (289) and the AND gate (288) does the same job, respectively, allows the PWM Logic (14) to perform Variable Frequency operation, without jeopardizing its "security rule" of "prohibiting more than 2 output pulses pre oscillator cycle". Actually, since anyway, even in Current Mode applications, it is still used that "slope compensation" in which a fraction of the Voltage Ramp signal is added to the current signal, for a better stability at duty cycle over 50%, so in other words, the Voltage Ramp switches "LOW" the Y (142) output after 60%, 70% or even 90% Duty Cycle, via Is (3), the PWM Comparator (20) and its outputted Reset pulse delivered to the other input of the PWM Logic block (14) there is no more need for the Set pulse to "Reset" at each cycle an already "Reset" output. In other words, this simple circuit presented in FIG. 33 and FIG. 34, allows for Fixed and/or Variable Frequency operations, without jeopardizing, in any way the controllers operations security.

The OSC block (15) starts oscillating as soon as an external Rt (581), Ct (582) timing circuit, supplied from Vref (8) reaches, at OSC (4) terminal, a voltage amount exciding the Vref4 (124) amount (i.e., 3.2V) applied to the CS (252) Set comparator's reference input. At that moment, by reversing its output state, the CS (252) comparator switches its "2 NOR Latch" circuit's output "High" which simultaneously, starts the Set pulse delivered to the PWM Logic (14) block and "activates the MOSFET discharging transistor TD (255) which starts discharging the timing capacitor Ct (582) via the constant current sink CS (256) (typically 6 mA) until the voltage at pin 4 (OSC) decays lower than the Vref5 (125) amount (i.e., 1.4V), moment when the CR (251) Reset comparator reverses its output state, resetting the OSC (15) 2 NOR Latch circuit's output back to the "LOW" state, ending the Set pulse delivered to the PWM Logic (14) block. In this way the OSC (15) block oscillates for an indefinite time (until Vref shuts off) generating a "Set" square pulse to the S input of the PWML (14) block, during the Ct (582) discharge time, as FIG. 49 A shows, and a linear voltage ramp at pin 4 (OSC), as FIG. 49 B shows, to the internal SVRB (16) block. The OSC (15) relies on two external parts Rt (581) and Ct (582) in respect to its oscillating frequency.

The SVRB (16) block, which is located internally to the NEWSYS (10) controller, buffers the voltage ramp signal outputted by the OSC (15) to the Is (3) terminal not directly, as other controller does, but via Rvr1 (169) which may have any value from 3 to 6 Kohms which allows the designers to use the Is (3) terminal, simultaneously as a current sense signal and/or as a voltage ramp output, so in other words, the Is/DC (3) in/out terminal offers the means to the NEWSYS (10) controller to work in Voltage Mode, Current Mode and/or any combinations of these two operations (i.e., slope compensation). By outputting the ramp voltage at Is/DC (3) via Rvr1 (169), similarly to the example shown at the Related Art chapter the voltage ramp signal ratio at the Is (3) terminal will be determined by the ratio of the internal Rvr1 (169) resistor value and the external Rvr2 (587) resistor which also includes the Rsense (599) in its circuit GND (100). Since the internal voltage ramp divider resistor's value it is in a range of 3 to 6 Kohms and Rsense (595) value is typically less than 1 ohm, obviously if Rvr2 (587) value goes down to a few ohms range, the system will work over 99% in Current Mode and for Voltage Mode applications the Rvr2 (587) may have any value from 1K to 10K. The Rv2 (587) value amount establishes the maximum duty cycle of the square-wave signal the NEWSYS (10) delivers to the external buffer M (594) via Rdrv (589). On the other hand, sense Is (3) terminal is also an input for sensing the current signal generated across Rsense (595) a current spikes filter has to be included between Is (3) terminal and the comparison input (202) of the SPWMC (20) block. In conclusion, in respect to the Is (3) terminal, the significant difference between the UC3846 and NEWSYS (10) consist in the fact that in the UC3842 case Is (3) is just and "Input" terminal and in the NEWSYS (10) the same Is (3) terminal can be an "Input" an "Output" or just a simple "Duty Cycle Adjusting" terminal.

The SCsF (17) is also an internal functional block of NEWSYS 10 which does the function of filtrating/eliminating the current spikes that maybe included in the current sense signal, buffers the entire signal (current and voltage ramp) to the comparison input (202) of the SPWMC (20). Since both internal buffers, SVRB (16) and SCsF (17) introduce a shorter or larger delay in respect to the voltage ramp signal versus the Set pulse (the Set pulse lasts only during the timing capacitor Ct (483) discharge time), a few extra circuits, such as Rj (200) Cj (201) and an entire synchronization controller circuit SMSS (22) have to be included in the NEWSYS (10) internal circuit for avoiding "pulse skipping" and other incontinences that may appear.

The EAin (18) block provides the voltage signal feedback to the reference input (203) of the SPWMC (20) in respect to the maximum voltage delivered at the converter output across Rl (603) and Cf2 (602). By having an internal reference voltage Vref2 (122) of 2.5V at its non-inverting input, in respect to the value of the external resistors and capacitors connected to EAin (2) input or connected between EAin (2) input and the EAout (1) terminal, the EA (18) block acts as a linear operation amplifier until the voltage at EAin (2) reaches 2.5V and for a higher voltage it acts as a comparator which shuts down the NEWSYS (10) output, DRV (6) even the voltage inputted at the EAin (2) is just 10 to 15 mV higher. In this particular circuit the EAin (2) input is supplied in a classic fashion by a feedback resistive divider such as Rfb1 (583) and Rfb2 (584) which is operatively coupled to the converter output and the Rl (603) voltage, however, since the NEWSYS (10) controller has a internal compensation circuit, Rc (181) and Cc (182), at the EAout (1) terminal has been connected, only a capacitor Cc (585) in respect to GND (100) that helps EA (18) block to smoothly deliver a reference voltage at the SPWMC (20) reference input, via the VL (19) circuit.

The SCsF Block (17) is also a significantly upgraded Synchronized Current Spike Filter Circuit, that eliminates the short (about 100 nS) spikes that appears at Is (3) input when the converter's inductor works in Continues or Critical Mode of operations. The SCsF (17) solutions presented in the 2nd and 3rd Embodiments are net superior to the "classic' RC circuit described at the Prior Art section, because do not introduce any distortion or delay to the inputted signal and as a big plus, it saves 2 parts of the external circuit.

The EA block (18) is an open collector (pull-down) operational amplifier using, usually a 1 mA pull-up current sink, for allowing EAout (1) to be also used as a external pull-down input control electrode. This pin is typically use for external soft-start of fast shut down circuits. Its non-inverting input is coupled to an internal 2.5V reference (Vref2), its inverting input is coupled to EAin (2) and its output is coupled to pin EAout (1). As a generic rule, EAout (1) voltage is direct proportional (i.e., "in faze") with the controller duty cycle, so in other words, higher voltage at EAout (1), means larger duty cycle ratio, larger current in the external MOSFET buffer and higher output voltage. When EAout (1) voltage is lower that (1V) the controller is shut down. Oppositely, EAin (2) being the "inverting" input, will shut down the controller output when reaches voltage higher than 2.5V. The EA (18) has a very high gain, being able to "feel" voltage variations less than 10 mV. NEWSYS (10) includes an internal compensation circuit that provides more stability and eliminate the need for two external parts, in some applications.

The VL Block (19) is a voltage limiter passive circuit including three diodes and two resistors which performs three important jobs in this system: a) Clamping the input voltage to maximum 1V, in order for the PWMC to reset immediately the PWML output, when the amount of voltage in pin 3 (Is) exceeds 1V; b) Creating a 1V threshold (i.e., a silicon diode has a voltage threshold of about 0.5V, so 2 diodes create a threshold around 1V) in respect to pin 1 (EAout) in order for the input voltage to remain near 0V when the amount of the voltage in pin 1 (EAout) is less than 1V; c) Dividing (resistively) in ⅓ ratio the voltage amount at pin 1 (EAout) in order to allow a larger voltage variation range (0V up to about 4V) at pin 1 (EAout) versus 0V to 1V variation at the PWMC input. (i.e., more precision in control).

The SPWMC Block (20) The PWMC block resets (switch near 0V) the PWML block's output at any time when the amount of voltage received in one of its input coupled to pin 3 ("Is") is higher than the voltage received in the other input, coupled to pin 1 (EAout) via a "voltage limiter" circuit, including diodes and resistors. The SPWMC Block (20) introduces a significant delay of the Reset pulse, in Voltage Mode applications, because the "Voltage Ramp Signal" delays slow to 0V (i.e., not fast, like logic systems) and therefore, this block needs a "Synchronization System" that forces its output to provide the "Reset" pulse, immediately after the Voltage Ramp signal reaches the OSC (15) higher reference (i.e., Vref4 (124) voltage amount. The SMSS (22) block is the one which resolves this important inconvenient.

The SSS Block (21) is an internal Sync Soft Start circuit which works similarly to the external Soft Start presented at the Prior Art section, however, featuring significant improvements described in two previous Embodiments. Besides saving four external parts, the SSS (21) is controlling simultaneously, the EAout (1) and the EAin (2) terminals which by keeping the EAin (2) to a lower level, eliminates the risk (which may happen at supply voltages higher than 220 Vrms) for the controller to shut down, during its soft start cycle.

The SMSS (22) block is the "brain" of the entire Sync Switching Circuitry for improving the controller operations speed and increases the control accuracy. Simply presented, in order to resolve this Set/Reset issue (i.e., "Set has to "find" the Reset signal in Low state for validating the next output pulse" the SMSS (22) block has to eider introduce a "Delay" into the Set pulse circuit, or, to force the Reset pulse to go "Low" faster. Since "delays" are not the best solutions (unless reduces, substantially the solution cost) for a "State of the Art" product, the first option of the present invention's SMSS (22) block is to create the means for a "faster Reset pulse".

The external circuit presented in FIG. 48, operates pretty similar to the UC384x circuit presented at the Prior Art section.

The secondary coil of Tr (593) together with Dsu (591), Csu (592) act as a Supply circuit for the NEWSYS (20) controller.

The primary coil of the high frequency transformer TR acts as typical boost Inductor, which for each of the MOSFET M (594) buffer's switching cycle, storages electrical energy for a period of time (i.e., during the M switch "ON" time) and than release this energy (i.e., during the M (594) switch "OFF" time) to the load, Rl (603), circuit, via Do (600), where the output bulk capacitor Cf2 (600) storages it, until the next high frequency cycle.

A part of the Inductor's electrical energy is collected by the Tr secondary coil for supplying the controller with DC voltage, via Dsu (591) and Csu (592).

The circuit can operate in Fix or Variable Frequency, Current or Voltage Mode of operations, and/or (if Cf1=220 nF) as a High Performances (PF=0.999, A.THD<2%, see FIG. 51 to FIG. 55) Power Factor Correction Circuit providing a stabilized voltage of about 400 VDC, across the load resistor Rl (603), despite the large variations (i.e., in Off-Line Circuits, 85 Vrms-265 Vrms) of the un-stabilized input voltage.

As a "big plus" this circuit efficiency is much higher in respect to other similar circuits (over 96% at 240 Vrms input voltage) because of the Parallel Charge Series Discharge Snubber Circuit, comprising Ls (596), Cs (598), Ds1 (597) and Ds2 (600). This circuit operates pretty similar to the snubber circuit presented at the Related Art section, respectively "cools down" the MOSFET M (594) buffer, however, the significant advantage in respect to the Related Art solution is, that the energy storage in Ls (596) and Cs (598) is not "dissipated" in a "resistor" (i.e., unnecessary loss in internal overheat) but it goes directly to the load circuit, via Ds1 (601) and Ds2 (600), so in other words, this snubber is "cooling down" the MOSFET M (594) much more efficiently than classic solutions.

What is claimed is:

1. A pulse width modulation controller system, having a plurality of circuits and a plurality of terminals, for control of automation circuits, AC-DC, DC-DC and power factor correction converter circuits, the plurality of circuits comprising:

an under-voltage lock-out circuit, operatively coupled with a first terminal of the plurality of terminals of the controller system, for internally supplying power to the controller system only when an external supply voltage reaches a pre-established voltage amount and shutting down the controller system's internal supply when the external supply voltage decreases down to an amount lower than another pre-established limit;

a voltage reference and internal bias circuit, operatively coupled to a second terminal of the plurality of terminals of the controller system, for providing precise and stable supply voltages to a first set of one or more circuits of the controller system;

a driver circuit, operatively coupled to at least a third terminal of the plurality of terminals of the controller system, for generating square wave pulses for driving external transistors;

an oscillator circuit, operatively coupled to a fourth terminal of the plurality of terminals of the controller system, for generating a voltage ramp signal allowing voltage mode of operations and a fast slew rate rectangular SET pulse for validating the start timing of each pulse outputted by the driver circuit;

a voltage ramp buffer circuit, operatively coupled between an output of the oscillator circuit and a fifth terminal of the plurality of terminals of the controller system, for mixing the voltage ramp signal with a current feedback signal inputted at the fifth terminal of the plurality of terminals of the controller system, and for allowing a combination of voltage mode and current mode pulse width modulation control operations, having synchronization inputs and/or outputs;

a current spike filter circuit, operatively coupled between the fifth terminal and one or more circuits of the plurality of circuits of the controller system, for eliminating current spikes included in current feedback signals, having synchronization inputs and outputs;

an error amplifier circuit, operatively coupled between sixth and seventh terminals of the plurality of terminals of the controller circuit, the sixth terminal being an input terminal and the seventh terminal being an output terminal, for sensing voltage signals having an amplitude higher than a pre-established limit;

a voltage limiter circuit, operatively coupled at least with an output from the error amplifier circuit, for limiting an output voltage from the error amplifier circuit down to a pre-established limit;

a soft start circuit operatively coupled between the sixth and seventh terminals of the error amplifier circuit and to one or more circuits of the plurality of circuits of the controller system, for forcing the driver circuit output signal's duty cycle to increase smoothly at any time when the controller system is connected to a supply source, having synchronization inputs and/or outputs;

a PWM comparator circuit, operatively coupled with the error amplifier circuit via an output of the current spike filter circuit, for comparing the voltage ramp signal with the signal outputted by the error amplifier circuit and for outputting a fast slew rate rectangular RESET pulse and for shutting down the controller system's driver circuit output driving pulse at any time when the voltage amount outputted by the current spike filter circuit is larger than the amount of voltage outputted by the voltage limiter circuit, having synchronization inputs and/or outputs;

a PWM logic circuit, operatively coupled with the oscillator and PWM comparator circuits, for processing the SET and RESET pulse signals and for prohibiting more than one output pulse of the driver circuit per one oscillator cycle, having synchronization inputs and outputs; and a sync master switch system, operatively connected to circuits of the plurality of circuits of the controller system, having synchronization inputs and/or outputs for avoiding skipping pulses introduced when a slow slew rate voltage ramp and/or voltage mode of operations are used, and for enabling control of the output driving pulses signal from over 99% down to less than 1% duty cycle by minimizing a signal delay introduced by one or more of the plurality of circuits processing operations, and by synchronizing the SET and RESET pulses either by delaying the SET pulse outputted by the oscillator circuit or by accelerating the decay of the RESET pulse outputted by the PWM comparator circuit, in such a manner for the RESET pulse to always reach its LOW logic state before the SET pulse reaches its HIGH logic state.

2. A system as in claim 1, wherein the oscillator circuit comprises:
a set comparator for providing a set pulse to the PWM logic circuit and for activating a discharge transistor;
a first voltage reference source for the set comparator to deliver the set pulse by comparing an inputted signal with a the first voltage reference;
a reset comparator for ending the set pulse delivered to the PWM logic circuit;
a second voltage reference source for the reset comparator to end the set pulse by comparing an inputted signal with the second voltage reference;
a synchronization comparator providing a synchronization pulse to other circuits of the controller system;
a third voltage reference source for the set comparator to deliver the synchronization pulse by comparing an inputted signal with the third voltage reference;
a set-reset latch for processing the set and reset signals;
a discharging transistor for discharging a capacitor external to the controller system and to create a voltage ramp signal;
a constant current sink for increasing the external capacitor's discharge time precision;
a first synchronization output for pre-setting specific maximum duty cycle ratios; and
a second synchronization output for compensating signals delays that occurs between the controller system's sub circuits.

3. A system as in claim 1, wherein the voltage ramp buffer circuit comprises:
a gated operational amplifier for buffering the voltage ramp signal;
a diode for the operational amplifier to act as a high gain high precision pull-up transistor;
an input gate for synchronizing the voltage ramp buffer with an external signal and shut-off fast its output voltage, when necessarily.

4. A system as in claim 1, wherein the voltage ramp buffer circuit comprises:
a gated operational amplifier for buffering the voltage ramp signal;
a transistor for the operational amplifier to act as a high-gain high-precision pull-up transistor; and
a gate input for synchronizing the voltage ramp buffer with an external signal and for quickly shutting off its output voltage.

5. A system as in claim 1, wherein the voltage ramp buffer circuit comprises:
an operational amplifier for buffering the voltage ramp signal;
a transistor for the operational amplifier to act as a high-gain high-precision pull-up transistor;
a silicon diode for synchronizing the voltage ramp buffer with an external signal and for quickly shutting off its output voltage; and
a resistor for limiting the operational amplifier's output current during the time when its output is shut-off.

6. A system as in claim 1, wherein the current spike filter circuit, comprises:
a gated operational amplifier for buffering the voltage ramp and current feedback signal; and
a gate input for synchronizing the voltage ramp buffer with an external signal and for quickly shutting off its output voltage to eliminate current spikes and compensate for delays that occur in the circuit.

7. A system as in claim 1, wherein the current spike filter circuit comprises:
a high-frequency switch for eliminating current signal spikes and for compensating delays that occur in the circuit; and
a resistor for limiting the circuit current during the time the high frequency switch is ON.

8. A system as in claim 1, wherein the soft start circuit comprises:
an operational amplifier buffer having an input coupled through a silicon diode to a first voltage reference that is also coupled through a very large value first resistor and a capacitor to ground, the operational amplifier also having an output coupled to a gate of a double-emitter PNP transistor, with one emitter coupled to a direct output and the other emitter coupled through a second resistor to a resistive output.

9. A system as in claim 1, wherein the soft start circuit comprises:
a digital-to-analog converter powered by a first voltage reference and having an input coupled to either of a capacitive input or a high-frequency two-terminals clock, the digital-to-analog converter also having an output coupled to a gate of a double-emitter PNP transistor, with one emitter coupled to a direct output and the other emitter coupled through a resistor to a resistive output.

10. A system as in claim 1, wherein the PWM Comparator circuit comprises an open-loop gated amplifier and a gate input for signals synchronization.

11. A system as in claim 1, wherein the PWM Comparator circuit comprises a comparator with a reference input and a resistive signal input.

12. A system as in claim 11, wherein the PWM Comparator circuit further comprises a set-reset output latch with a set input coupled to the comparator output, an output buffer delay circuit coupled to an output of the latch and feeding back a buffered signal to a control gate of a MOSFET switch whose source/drain terminals sink the resistive signal input of the comparator to ground whenever the MOSFET switch is ON.

13. A system as in claim 1, wherein the PWM Logic circuit comprises:
a NOR gate providing output pulses to activate the driver circuit; and
a set-reset latch having an output coupled to an input of the NOR gate, coupled to receive set pulses from the oscillator circuit at a set input and to receive reset pulses from the pulse width modulation comparator at a reset input, such that the set-reset latch allows not more than one output pulse to the driver circuit per one oscillator cycle.

14. A system as in claim 13, wherein the PWM Logic circuit further comprises a synchronization circuit for synchronizing the Set and Rest pulses and a an extra latch circuit coupled from the PWM Logic circuit output to its Set input, comprising a non-inverting buffer a MOSFET transistor and a resistor for allowing fix and variable frequency mode of operations.

15. A system as in claim 13, wherein the PWM Logic circuit further comprises a synchronization circuit for synchronizing the Set and Rest pulses and a an extra latch circuit coupled from the PWM Logic circuit output to its Set input, comprising an inverting buffer and an two inputs AND gate for allowing fix and variable frequency mode of operations.

16. A system as in claim 1, wherein the master synchronization system comprises a short time delay circuit inserted into the Set signal circuit for the Rest pulse to have sufficient time to reach its Low logic level before the Set pulse reaches its Low logic level.

17. A system as in claim 1, wherein the master synchronization system circuit comprises a switching system inserted into Reset signal circuit for forcing the PWM comparator to end its outputted Reset circuit at the same time when the Voltage Ramp signal reaches its maxim voltage amount.

18. A system as in claim 1, wherein the master synchronization system circuit comprises, simultaneously, a delay circuit inserted in the Set signal circuit and a switching system inserted in the Reset signal circuit for reaching the optimal synchronization between the two signals.

19. An analog logic bistable system for controlling automation circuits, comprising:
a controller system as in claim 1 for performing the analog logic bistable function;
a first push button switch for Setting the bistable circuit;
a second push button switch for Resetting the bistable circuit; and
a bulb for displaying the bistable circuit output logic state.

20. An analog logic monostable system for controlling automation circuits, comprising:
a controller system as in claim 1 for performing the analog logic monostable function;
a first push button switch for Setting the monostable circuit; and
a bulb for displaying the monostable circuit output logic state.

21. An analog logic astable system for controlling automation circuits, comprising:
a controller system as in claim 1 for performing the analog logic astable-Clock function;
a timing circuit comprising a resistor an a capacitor for creating a Voltage Ramp signal;
a second resistor for setting the signal's duty cycle; and
a bulb for displaying the astable circuit output logic state.

22. The system of claim 1, wherein said Fixed Frequency Voltage Mode PWM Converter Circuit is controlled by a system comprising a Under Voltage Lock-Out circuit, a Voltage Reference Circuit, a Driver Circuit, a PWM Logic Circuit, an Oscillator Circuit, a PWM Comparator Circuit, an Error Amplifier having a Compensation Circuit, a Voltage Ramp Driver Circuit in which the Oscillator signal is buffered by a Transistor or an Operational Amplifier, a Soft Start Circuit, a Current Spikes Filter Circuit, and a Synchronization System circuitry able to compensate the delay introduced by the Voltage Drive Circuit and/or the Current Spikes Filter Circuit in such a manner that the Reset pulse delivered by the PWM Comparator Circuit is in LOW state when the SET pulse delivered by the Oscillator Circuit switches to its LOW state.

23. The system of claim 1 wherein the Fixed Frequency Voltage Mode PWM Converter Circuit includes a Parallel Charge-Series Discharge Snubber Circuit comprising a Current Limiting Coil, a Snubber Capacitor and two diodes circuitry that operatively charge said Snubber Capacitor from said Full-Wave Bridge Rectifier Circuit via said Current Limiting Coil and further efficiently discharge the electrical energy accumulated in said Snubber Capacitor and said Current Limiting Coil into said Reactive Load Circuit.

24. A low-cost ultra-versatile pulse width modulation (PWM)-timer controller system to control automations, AC-DC, DC-DC and power factor correction converter circuits, the controller system including plurality of circuits and a plurality of terminals, comprising:
an under-voltage lock-out circuit operatively coupled with a first terminal of the plurality of terminals of the controller system;
a voltage gap reference circuit operatively coupled to a second terminal of the plurality of terminals of the controller system;
a driver circuit operatively coupled to at least a third terminal of the plurality of terminals of the controller system;
an oscillator circuit, operatively coupled to a fourth terminal of the plurality of terminals of the controller system, that generates a voltage ramp signal, a set signal and a synchronization signal;
a voltage ramp buffer circuit, operatively coupled between an output of the oscillator circuit and a fifth terminal of the plurality of terminals of the controller system, that allows for voltage and current mode operations having synchronization inputs and outputs;

a current spike filter circuit, operatively coupled between the fifth terminal and one or more circuits of the plurality of circuits of the controller system, having synchronization inputs and outputs;

an error amplifier circuit, operatively coupled between sixth and seventh terminals of the plurality of terminals of the controller circuit, the sixth terminal being an input terminal and the seventh terminal being an output terminal;

a voltage limiter circuit operatively coupled at least with an output from the error amplifier circuit;

a PWM comparator circuit, operatively coupled with the error amplifier circuit via an output of the current spike filter circuit, that generates a reset signal having synchronization inputs and outputs;

a PWM logic circuit, operatively coupled with the oscillator and PWM comparator circuits;

a soft start circuit that controls, simultaneously, the error amplifier sensing input and output terminals having synchronization inputs and outputs; and a master synchronization system synchronizing all circuits that generate, buffer or receive voltage ramp, set and reset signals for the reset signal to switch, safely, to a LOW state before the set signal and the PWM logic circuit to deliver square wave pulses signals having any duty cycle ratio between 1% and 100% to the driver circuit.

* * * * *